(12) United States Patent  
Hirose et al.

(10) Patent No.: US 9,343,290 B2  
(45) Date of Patent: May 17, 2016

(54) METHOD OF MANUFACTURING SEMICONDUCTOR DEVICE, SUBSTRATE PROCESSING APPARATUS, AND RECORDING MEDIUM

(71) Applicants: HITACHI KOKUSAI ELECTRIC INC., Tokyo (JP); L'AIR LIQUIDE, SOCIETE ANONYME POUR L'ETUDE ET L'EXPLOITATION DES PROCEDES GEORGES CLAUDE, Paris (FR)

(72) Inventors: Yoshiro Hirose, Toyama (JP); Norikazu Mizuno, Toyama (JP); Kazutaka Yanagita, Tsukuba (JP); Shingo Okubo, Tsukuba (JP)

(73) Assignees: HITACHI KOKUSAI ELECTRIC, INC., Tokyo (JP); L'AIR LIQUIDE, SOCIETE ANONYME POUR L'ETUDE ET L'EXPLOITATION DES PROCEDES GEORGES CLAUDE, Paris (FR)

( * ) Notice: Subject to any disclaimer, the term of this patent is extended or adjusted under 35 U.S.C. 154(b) by 134 days.

(21) Appl. No.: 14/219,474

(22) Filed: Mar. 19, 2014

(65) Prior Publication Data

US 2014/0287598 A1    Sep. 25, 2014

(30) Foreign Application Priority Data

Mar. 19, 2013 (JP) .................... 2013-057101

(51) Int. Cl.
| | |
|---|---|
| *H01L 21/02* | (2006.01) |
| *C23C 16/40* | (2006.01) |
| *C23C 16/455* | (2006.01) |

(52) U.S. Cl.  
CPC ........ *H01L 21/02164* (2013.01); *C23C 16/401* (2013.01); *C23C 16/45529* (2013.01); *C23C 16/45531* (2013.01); *C23C 16/45534* (2013.01); *H01L 21/02271* (2013.01)

(58) Field of Classification Search  
CPC ..................... H01L 21/02164; H01L 21/0228; H01L 21/02126; H01L 21/02211; H01L 21/02219; H01L 21/02271; H01L 21/0262; H01L 21/0214; H01L 21/02167; H01L 21/02216  
See application file for complete search history.

(56) References Cited

U.S. PATENT DOCUMENTS

| | | | | |
|---|---|---|---|---|
| 7,084,076 | B2 * | 8/2006 | Park ...................... | C23C 16/402 257/E21.261 |
| 7,964,441 | B2 * | 6/2011 | Joe ......................... | C23C 16/345 257/40 |
| 8,329,599 | B2 | 12/2012 | Fukazawa et al. | |
| 9,018,104 | B2 * | 4/2015 | Hirose ................... | C23C 16/30 257/E21.293 |

(Continued)

FOREIGN PATENT DOCUMENTS

| | | |
|---|---|---|
| JP | 2004-040110 A | 2/2004 |
| JP | 2011-176330 A | 9/2011 |

*Primary Examiner* — Bac Au  
(74) *Attorney, Agent, or Firm* — Volpe and Koenig, P.C.

(57) ABSTRACT

A method of manufacturing a semiconductor device includes forming an oxide film on a substrate by performing a cycle a predetermined number of times. The cycle includes supplying a precursor gas to the substrate; and supplying an ozone gas to the substrate. In the act of supplying the precursor gas, the precursor gas is supplied to the substrate in a state where a catalytic gas is not supplied to the substrate, and in the act of supplying the ozone gas, the ozone gas is supplied to the substrate in a state where an amine-based catalytic gas is supplied to the substrate.

19 Claims, 17 Drawing Sheets

(56) References Cited

U.S. PATENT DOCUMENTS

2004/0018694 A1    1/2004   Lee et al.
2011/0076789 A1*   3/2011   Kuroda ................. H01L 21/266
                                                                                   438/14
2014/0287596 A1*   9/2014   Hirose ................. H01L 21/022
                                                                                  438/786

\* cited by examiner

Triethylamine (TEA)
Acid dissociation constant (pKa) 10.7

Diethylamine (DEA)
Acid dissociation constant (pKa) 10.9

Monoethylamine (MEA)
Acid dissociation constant (pKa) 10.6

Trimethylamine (TMA)
Acid dissociation constant (pKa) 9.8

Monomethylamine (MMA)
Acid dissociation constant (pKa) 10.6

FIG. 15F

| Name | Pyridine | Aminopyridin | Picoline | Lutidine | Piperazine | Piperidine |
|---|---|---|---|---|---|---|
| Composition formula | $C_5H_5N$ | $C_5H_6N_2$ | $C_6H_7N$ | $C_7H_9N$ | $C_4H_{10}N_2$ | $C_5H_{11}N$ |
| Structural formula | | | | | | |
| Acid dissociation constant (pKa) | 5.67 | 6.89 | 6.07 | 6.96 | 9.80 | 11.12 |

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japan Patent Application No. 2013-57101, filed on Mar. 19, 2013, the entire contents of which are incorporated herein by reference.

TECHNICAL FIELD

The present disclosure relates to a method of manufacturing a semiconductor device, a substrate processing apparatus, and a recording medium.

BACKGROUND

As one of processes for manufacturing a semiconductor device, in some cases, a process of forming an oxide film or the like on a substrate is performed, for example, by supplying a precursor gas and an oxidizing gas to the substrate. In this case, the oxide film can be formed at a relatively low temperature, for example, using a catalytic gas, which improves thermal budget of the semiconductor device.

However, for example, if the catalytic gas is not added in all processes, since sufficient reactivity of the precursor gas or the oxidizing gas is not obtained, a film forming rate is reduced and thus it may be difficult to form an oxide film in some cases. In the meantime, for example, if a catalytic gas is used in all processes, some process optimization time is needed because a complicated reaction system is required. Additionally, a cost for manufacturing a semiconductor device may increase as the amount of the catalytic gas used in the processes increases.

SUMMARY

The present disclosure provides some embodiments of a method of manufacturing a semiconductor device, a substrate processing apparatus and a recording medium, which allow a film forming rate to be maintained while suppressing the use of a catalytic gas.

According to an aspect of the present disclosure, there is provided a method of manufacturing a semiconductor device, including forming an oxide film on a substrate by performing a cycle a predetermined number of times, the cycle including: supplying a precursor gas to the substrate; and supplying an ozone gas to the substrate, wherein in the act of supplying the precursor gas, the precursor gas is supplied to the substrate in a state where a catalytic gas is not supplied to the substrate, and in the act of supplying the ozone gas, the ozone gas is supplied to the substrate in a state where an amine-based catalytic gas is supplied to the substrate.

According to another aspect of the present disclosure, there is provided a substrate processing apparatus, including: a process chamber configured to accommodate a substrate therein; a precursor gas supply system configured to supply a precursor gas into the process chamber; an ozone gas supply system configured to supply ozone gas into the process chamber; a catalytic gas supply system configured to supply a catalytic gas into the process chamber; and a control unit configured to control the precursor gas supply system, the ozone gas supply system and the catalytic gas supply system such that an oxide film is formed on the substrate in the process chamber by performing a cycle a predetermined number of times, the cycle including: supplying the precursor gas to the substrate in the process chamber; and supplying the ozone gas to the substrate in the process chamber, wherein in the act of supplying the precursor gas, the precursor gas is supplied to the substrate in a state where a catalytic gas is not supplied to the substrate, and in the act of supplying the ozone gas, the ozone gas is supplied to the substrate in a state where an amine-based catalytic gas is supplied to the substrate.

According to still another aspect of the present disclosure, there is provided a non-transitory computer-readable recording medium storing a program that causes a computer to perform a process of forming an oxide film on a substrate in a process chamber by performing a cycle a predetermined number of times, the cycle including: supplying a precursor gas to the substrate in the process chamber; and supplying an ozone gas to the substrate in the process chamber, wherein in the act of supplying the precursor gas, the precursor gas is supplied to the substrate in a state where a catalytic gas is not supplied to the substrate, and in the act of supplying the ozone gas, the ozone gas is supplied to the substrate in a state where an amine-based catalytic gas is supplied to the substrate.

BRIEF DESCRIPTION OF THE DRAWINGS

FIGS. 7A to 7C are views illustrating gas supply timings in a film forming sequence according to a modification of the first embodiment of the present disclosure, wherein FIG. 7A is a view illustrating a first modification, FIG. 7B is a view illustrating a second modification, and FIG. 7C is a view illustrating a third modification.

FIGS. 8A and 8B are views illustrating gas supply timings in a film forming sequence according to another modification of the first embodiment of the present disclosure, wherein FIG. 8A is a view illustrating another first modification, and FIG. 8B is a view illustrating another second modification.

FIGS. 9A and 9B are views illustrating gas supply timings in a film forming sequence according to still another modification of the first embodiment of the present disclosure, wherein FIG. 9A is a view illustrating still another first modification, and FIG. 9B is a view illustrating still another second modification.

FIGS. 11A and 11B are views illustrating gas supply timings in the film forming sequence according to the second embodiment of the present disclosure, wherein FIG. 11A is a view illustrating an example of a sequence of forming a stacked film, and FIG. 11B is a view illustrating an example of a sequence of forming a laminated film.

FIGS. 13A and 13B are views illustrating gas supply timings and a RF power supply in a film forming sequence according to the modification of the second embodiment of the present disclosure, wherein FIG. 13A is a view illustrating an example of a sequence of forming a stacked film, and FIG. 13B is a view illustrating an example of a sequence of forming a laminated film.

FIGS. 15A to 15F are views illustrating names, chemical composition formulae, chemical structural formulae and acid dissociation constants of a variety of amines used as a catalytic gas, names, chemical composition formulae, chemical structural formulae and acid dissociation constants of TEA, DEA, MEA, TMA, MMA and cyclic amines being shown in FIGS. 15A to 15F, respectively.

FIGS. 16A and 16B are views showing an effect of TEA gas in film forming processes of examples of the present disclosure and comparative examples, wherein FIG. 16A is a view illustrating supply/non-supply of the TEA gas when HCDS gas and $O_3$ gas are supplied, and FIG. 16B is a graph illustrating an effect of supply/non-supply of the TEA gas when the HCDS gas and the $O_3$ gas are supplied.

DETAILED DESCRIPTION

Reference will now be made in detail to various embodiments, examples of which are illustrated in the accompanying drawings. In the following detailed description, numerous specific details are set forth in order to provide a thorough understanding of the present disclosure(s). However, it will be apparent to one of ordinary skill in the art that the present disclosure(s) may be practiced without these specific details. In other instances, well-known methods, procedures, systems, and components have not been described in detail so as not to unnecessarily obscure aspects of the various embodiments.

<First Embodiment>

Hereinafter, a first embodiment of the present disclosure will be described with reference to the drawings.

(1) Overall Configuration of Substrate Processing Apparatus

Figure 1:
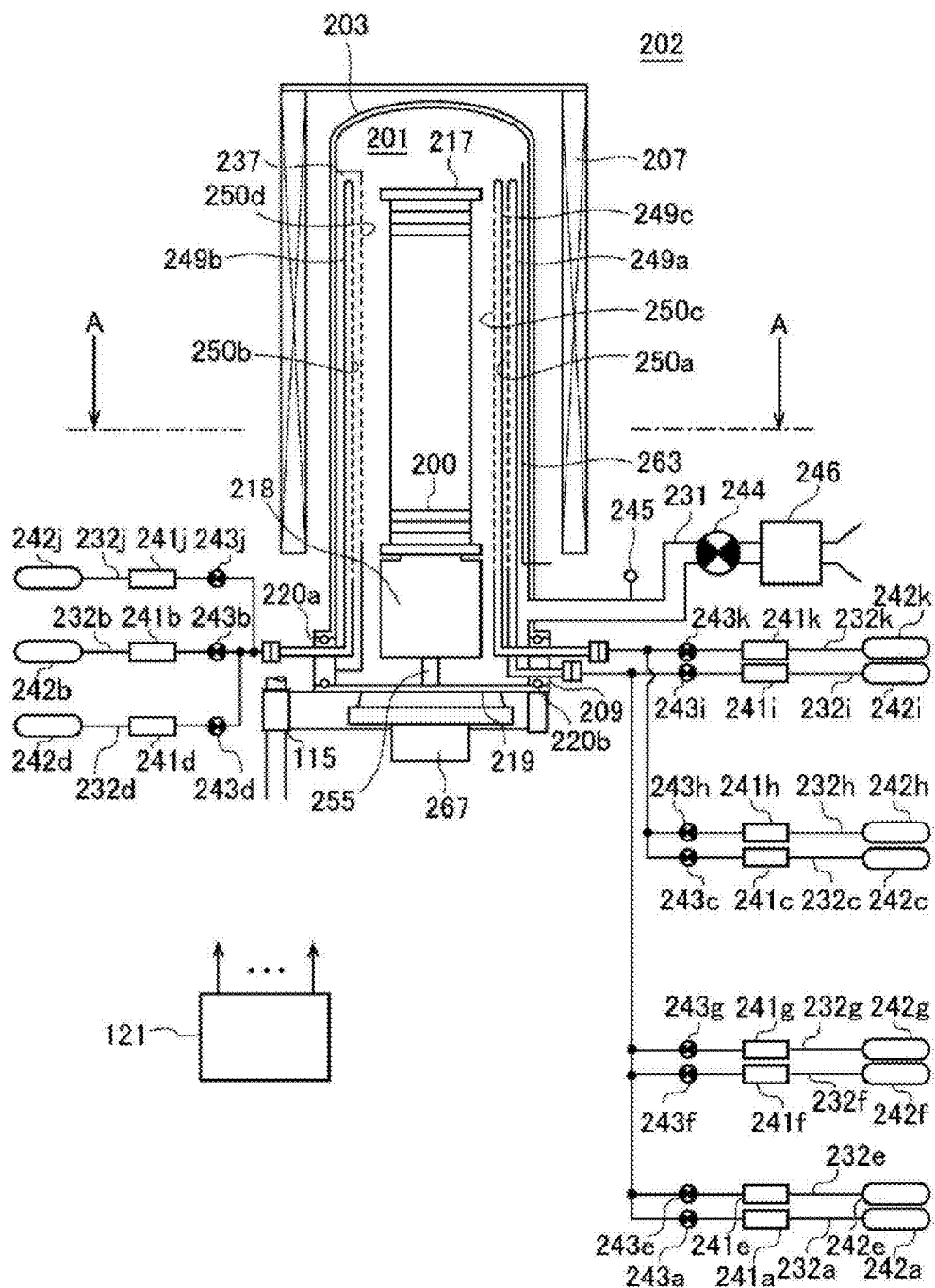
FIG. 1 is a schematic view illustrating a configuration of a vertical processing furnace of a substrate processing apparatus, in which a portion of the processing furnace is shown in a longitudinal sectional view, according to a first embodiment of the present disclosure.
Figure 2:
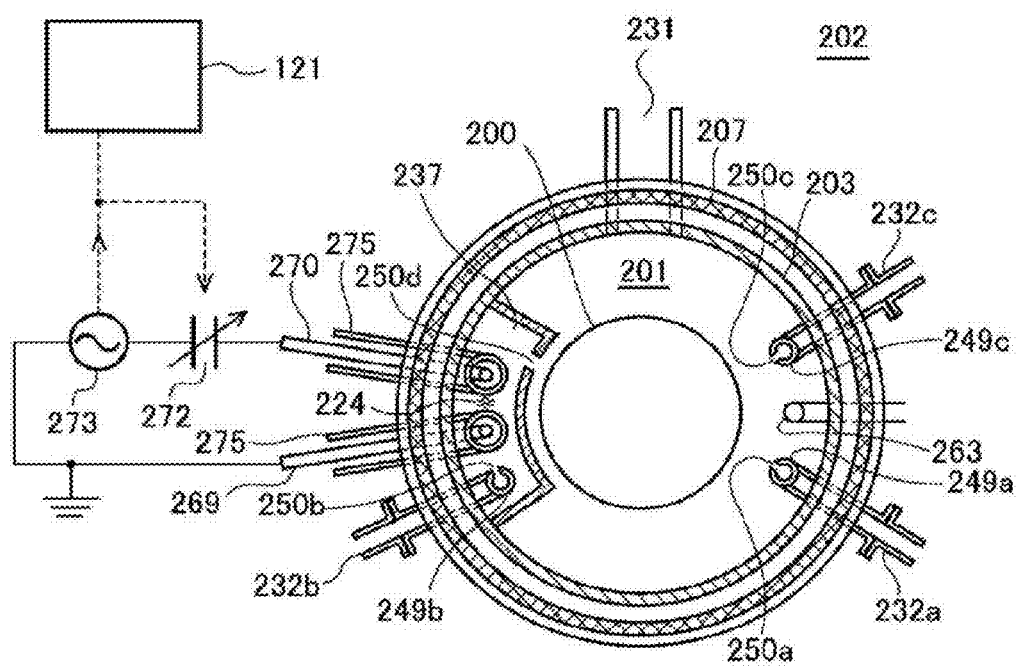
FIG. 2 is a schematic view illustrating a configuration of the vertical processing furnace of the substrate processing apparatus, in which a portion of the processing furnace is shown in a sectional view taken along line II-II in FIG. 1, according to the first embodiment of the present disclosure.

FIG. 1 is a schematic view illustrating a configuration of a vertical processing furnace 202 of a substrate processing apparatus, in which a portion of the processing furnace is shown in a longitudinal sectional view, according to the embodiment of the present disclosure. FIG. 2 is a schematic view illustrating a configuration of the vertical processing furnace 202, in which a portion of the processing furnace is shown in a sectional view taken along line II-II in FIG. 1, according to the embodiment of the present disclosure.

As shown in FIG. 1, the processing furnace 202 includes a heater 207 as a heating unit (heating mechanism). The heater 207 has a cylindrical shape and is supported by a heater base (not shown) as a support plate so as to be vertically installed. The heater 207 also acts as an activating mechanism (exciting unit) to activate (excite) gas by heat, as will be described later.

A reaction tube 203 is disposed inside the heater 207 in a concentric form along the heater 207. The reaction tube 203 is made of a heat resistant material such as quartz ($SiO_2$) or silicon carbide (SiC), and has a cylindrical shape with its upper end closed and its lower end opened. A manifold (inlet flange) 209 is disposed below the reaction tube 203 in a concentric form along the reaction tube 203. The manifold 209 is made of, for example, metal such as stainless steel, and is formed in a cylindrical shape with its upper and lower ends opened. The upper end of the manifold 209 is caught and coupled to the lower end of the reaction tube 203 and is configured to support the reaction tube 203. In addition, an O-ring 220a as a seal member is installed between the manifold 209 and the reaction tube 203. As the manifold 209 is supported by the heater base, the reaction tube 203 is in a vertical installation state. Mostly, a process vessel (reaction vessel) is configured with the reaction tube 203 and the manifold 209. A process chamber 201 is defined in a hollow cylindrical portion of the process vessel. The process chamber 201 is configured to accommodate a plurality of wafers 200 as substrates. The wafers 200 are horizontally stacked in multiple stages to be aligned in a vertical direction in a boat 217, which will be described later.

A first nozzle 249a, a second nozzle 249b and a third nozzle 249c are installed in the process chamber 201 to penetrate through a sidewall of the manifold 209. The first nozzle 249a, the second nozzle 249b and the third nozzle 249c are respectively connected to a first precursor gas supply pipe 232a, a first oxidizing gas supply pipe 232b and a first catalytic gas supply pipe 232c. In addition, a plurality of precursor gas supply pipes 232e, 232f and 232g are connected to the first precursor gas supply pipe 232a. Also, a second oxidizing gas supply pipe 232d is connected to the first oxidizing gas supply pipe 232b. A second catalytic gas supply pipe 232h is also connected to the first catalytic gas supply pipe 232c. As described above, the three nozzles 249a to 249c and the plurality of gas supply pipes 232a to 232h are installed at the reaction tube 203, and thus, a plurality of types of gases can be supplied into the process chamber 201.

An $(SiCl_3)_2CH_2$ (BTCSM) gas supply source 242a, for example, as a first precursor gas supply source, an MFC (Mass Flow Controller) 241a, which is a flow rate controller (flow rate control part), and a valve 243a, which is an opening/closing valve, are sequentially installed in the first precursor gas supply pipe 232a in this order from an upstream direction. In addition, a second precursor gas supply pipe 232e is connected to the first precursor gas supply pipe 232a at a downstream side of the valve 243a. A $(CH_3)_2Si_2Cl_4$ (TCDMDS) gas supply source 242e, for example, as a second precursor gas supply source, an MFC 241e, which is a flow rate controller (flow rate control part), and a valve 243e, which is an opening/closing valve, are sequentially installed in the second precursor gas supply pipe 232e in this order from an upstream direction. A third precursor gas supply pipe 232f is connected to the first precursor gas supply pipe 232a at a downstream side of a junction of the first precursor gas supply pipe 232a and the second precursor gas supply pipe 232e. An $Si_2Cl_6$ (HCDS) gas supply source 242f, for example, as a third precursor gas supply source, an MFC 241f, which is a flow rate controller (flow rate control unit), and a valve 243f, which is an opening/closing valve, are sequentially installed in the third precursor gas supply pipe 232f in this order from an upstream direction. A fourth precursor gas supply pipe 232g is connected to the first precursor gas supply pipe 232a at a downstream side of a junction of the first precursor gas supply pipe 232a and the third precursor gas supply pipe 232f. An Si[N(C₂H₅)₂]₂H₂ (BDEAS) gas supply source 242g, for example, as a fourth precursor gas supply source, an MFC 241g, which is a flow rate controller (flow rate control unit), and a valve 243g, which is an opening/closing valve, are sequentially installed in the fourth precursor gas supply pipe 232g in this order from an upstream direction. Also, a first inert gas supply pipe 232i is connected to the first precursor gas supply pipe 232a at a downstream side of a junction of the first precursor gas supply pipe 232a and the fourth precursor gas supply pipe 232g. An N₂ gas supply source 242i, for example, as a first inert gas supply source, an MFC 241i, which is a flow rate controller (flow rate control unit), and a valve 243i, which is an opening/closing valve, are sequentially installed in the first inert gas supply pipe 232i in this order from an upstream direction.

In addition, the above-described first nozzle 249a is connected to a leading end portion of the first precursor gas supply pipe 232a. As shown in FIG. 2, the first nozzle 249a is installed in a circular arc-shaped space between an inner wall of the reaction tube 203 and the wafers 200. The first nozzle 249a is vertically disposed along the inner wall of the reaction tube 203 to rise upward a stacking direction of the wafers 200. That is, the first nozzle 249a is installed at a side of a wafer arrangement region, in which the wafers 200 are arranged. The first nozzle 249a is configured as an L-shaped long nozzle, and has its horizontal portion installed to penetrate through a sidewall of the manifold 209 and its vertical portion installed to rise from one end portion of the wafer arrangement region toward the other end portion thereof. A plurality of gas supply holes 250a through which gas is supplied is formed in a side surface of the first nozzle 249a. As shown in FIG. 2, the gas supply holes 250a are opened toward a center of the reaction tube 203 to supply gas toward the wafers 200. The gas supply holes 250a are formed in a plural number from a lower portion to an upper portion of the reaction tube 203. The gas supply holes 250a have the same opening area and are formed at an equal pitch.

A precursor gas supply system is mainly configured with the precursor gas supply pipes 232a, 232e, 232f and 232g, the MFCs 241a, 241e, 241f and 241g, and the valves 243a, 243e, 243f and 243g. The first nozzle 249a, the BTCSM gas supply source 242a, the TCDMDS gas supply source 242e, the HCDS gas supply source 242f, and the BDEAS gas supply source 242g may also be included in the precursor gas supply system. In addition, a first inert gas supply system is mainly configured with the first inert gas supply pipe 232i, the MFC 241i, and the valve 243i. Also, the N₂ gas supply source 242i may be included in the first inert gas supply system. The first inert gas supply system also functions as a purge gas supply system.

The precursor gas supply system may also be an assembly of a plurality of supply lines (supply system) for respectively supplying a plurality of types of precursor gases having different molecular structures. That is, the precursor gas supply system may be an assembly of a BTCSM gas supply line mainly configured with the first precursor gas supply pipe 232a, the MFC 241a, and the valve 243a, a TCDMDS gas supply line mainly configured with the second precursor gas supply pipe 232e, the MFC 241e, and the valve 243e, a HCDS gas supply line mainly configured with the third precursor gas supply pipe 232f, the MFC 241f and the valve 243f, and a BDEAS gas supply line mainly configured with the fourth precursor gas supply pipe 232g, the MFC 241g, and the valve 243g. Here, the first nozzle 249a or each corresponding precursor gas supply source 242a, 242e, 242f or 242g may be included in each supply line.

An O₃ gas supply source 242b, for example, as a first oxidizing gas supply source, an MFC 241b, which is a flow rate controller (flow rate control part), and a valve 243b, which is an opening/closing valve, are sequentially installed in the first oxidizing gas supply pipe 232b in this order from an upstream direction. In addition, a second oxidizing gas supply pipe 232d is connected to the first oxidizing gas supply pipe 232b at a downstream side of the valve 243b. An O₂ gas supply source 242d, for example, as a second oxidizing gas supply source, an MFC 241d, which is a flow rate controller (flow rate control part), and a valve 243d, which is an opening/closing valve, are sequentially installed in the second oxidizing gas supply pipe 232d in this order from an upstream direction. A second inert gas supply pipe 232j is connected to the first oxidizing gas supply pipe 232b at a downstream side of a junction of the first oxidizing gas supply pipe 232b and the second oxidizing gas supply pipe 232d. A N₂ gas supply source 242j, for example, as a second inert gas supply source, an MFC 241j, which is a flow rate controller (flow rate control unit), and a valve 243j, which is an opening/closing valve, are sequentially installed in the second inert gas supply pipe 232j in this order from an upstream direction. In addition, the above-described second nozzle 249b is connected to a leading end portion of the first oxidizing gas supply pipe 232b. The second nozzle 249b is installed inside a buffer chamber 237 that is a gas diffusion space.

As shown in FIG. 2, the buffer chamber 237 is installed in an arc-shaped space between the inner wall of the reaction tube 203 and the wafers 200. The buffer chamber 237 is disposed from the bottom to the top along the inner wall of the reaction tube 203 in the stacking direction of the wafers 200. That is, the buffer chamber 237 is installed at the side of the wafer arrangement region, in which the wafers 200 are arranged. A plurality of gas supply holes 250d through which gas is supplied is formed in an end portion of a wall of the buffer chamber 237 adjacent to the wafers 200. The gas supply holes 250d are opened toward the center of the reaction tube 203 to supply gas toward the wafers 200. The gas supply holes 250d are formed in a plural number from the lower portion to the upper portion of the reaction tube 203. The gas supply holes 250d have the same opening area and are formed at an equal opening pitch.

As shown in FIG. 2, the second nozzle 249b is installed along the inner wall of the reaction tube 203 to rise upward in the stacking direction of the wafers 200 in an end portion of the buffer chamber 237 opposite to the end portion thereof in which the gas supply holes 250d is formed. That is, the second nozzle 249b is installed at the side of the wafer arrangement region, in which the wafers 200 are arranged. The second nozzle 249b is configured as an L-shaped long nozzle and has its horizontal portion installed to penetrate through the sidewall of the manifold 209 and its vertical portion installed to rise from one end portion of the wafer arrangement region toward the other end portion thereof. A plurality of gas supply holes 250b through which gas is supplied is formed in a side surface of the second nozzle 249b. As shown in FIG. 2, the gas supply holes 250b are opened toward the center of the buffer chamber 237. The gas supply holes 250b are formed in a plural number from the lower portion to the upper portion of the reaction tube 203 in the same way as the gas supply holes 250d of the buffer chamber 237. The plurality of gas supply holes 250b may have the same opening area and the same opening pitch from an upstream side (lower portion) of the reaction tube 203 to an downstream side (upper portion) of the reaction tube 203 when a pressure difference between the interior of the buffer chamber 237 and the interior of the process chamber 201 is small. However, when the pressure difference is large, the opening area of each gas supply hole 250b may be set larger and the opening pitch of each gas supply hole 250b may be set smaller at the downstream side than the upstream side of the reaction tube 203.

In the embodiment, by adjusting the opening area or opening pitch of each gas supply hole 250b of the second nozzle 249b from the upstream side to the downstream side as described above, gases may be ejected at an almost same flow rate from the respective gas supply holes 250b despite a flow velocity difference. In addition, the gases ejected from the respective gas supply holes 250b are first introduced into the buffer chamber 237, and flow velocities of the gases become uniform in the buffer chamber 237. That is, the gases ejected from the respective gas supply holes 250b of the second nozzle 249b into the buffer chamber 237 are mitigated in particle velocity of the respective gases in the buffer chamber 237, and then are ejected from the respective gas supply holes 250d of the buffer chamber 237 into the process chamber 201. Therefore, the gases ejected from the respective gas supply holes 250b of the second nozzle 249b into the buffer chamber 237 have a uniform flow rate and flow velocity when the gases are ejected from the respective gas supply holes 250d of the buffer chamber 237 into the process chamber 201.

An oxidizing gas supply system is mainly configured with the oxidizing gas supply pipes 232b and 232d, the MFCs 241b and 241d, and the valves 243b and 243d. Also, the second nozzle 249b, the buffer chamber 237, the $O_3$ gas supply source 242b and the $O_2$ gas supply source 242d may be included in the oxidizing gas supply system. In addition, a second inert gas supply system is mainly configured with the second inert gas supply pipe 232j, the MFC 241j, and the valve 243j. The $N_2$ gas supply source 242j may also be included in the second inert gas supply system. The second inert gas supply system also functions as a purge gas supply system.

The oxidizing gas supply system may also be an assembly of a plurality of supply lines (supply system) for respectively supplying a plurality of types of oxidizing gases having different molecular structures. That is, the oxidizing gas supply system may be an assembly of an $O_3$ gas supply line mainly configured with the first oxidizing gas supply pipe 232b, the MFC 241b, and the valve 243b, and an $O_2$ gas supply line mainly configured with the second oxidizing gas supply pipe 232d, the MFC 241d, and the valve 243d. Here, the second nozzle 249b, the buffer chamber 237, or each corresponding oxidizing gas supply source 242b or 242d may be included in each supply line.

A $(C_2H_5)_3N$ (TEA) gas supply source 242c, for example, as a first catalytic gas supply source, an MFC 241c, which is a flow rate controller (flow rate control part), and a valve 243c, which is an opening/closing valve, are sequentially installed in the first catalytic gas supply pipe 232c in this order from an upstream direction. In addition, a second catalytic gas supply pipe 232h is connected to the first catalytic gas supply pipe 232c at a downstream side of the valve 243c. A $C_5H_5N$ (pyridine) gas supply source 242h, for example, as a second catalytic gas supply source, an MFC 241h, which is a flow rate controller (flow rate control part), and a valve 243h, which is an opening/closing valve, are sequentially installed in the second catalytic gas supply pipe 232h in this order from an upstream direction. In addition, a third inert gas supply pipe 232k is connected to the first catalytic gas supply pipe 232c at a downstream side of a junction of the first catalytic gas supply pipe 232c and the second catalytic gas supply pipe 232h. A $N_2$ gas supply source 242k, for example, as a third inert gas supply source, an MFC 241k, which is a flow rate controller (flow rate control unit), and a valve 243k, which is an opening/closing valve, are sequentially installed in the third inert gas supply pipe 232k in this order from an upstream direction.

In addition, the above-described third nozzle 249c is connected to a leading end portion of the first catalytic gas supply pipe 232c. As shown in FIG. 2, the third nozzle 249c is installed in a circular arc-shaped space between an inner wall of the reaction tube 203 and the wafers 200. The third nozzle 249c is vertically disposed along the inner wall of the reaction tube 203 to rise upward in a stacking direction of the wafers 200. That is, the third nozzle 249c is installed at a side of a wafer arrangement region, in which the wafers 200 are arranged. The third nozzle 249c is configured as an L-shaped long nozzle, and has its horizontal portion installed to penetrate through a sidewall of the manifold 209 and its vertical portion installed to rise from one end portion of the wafer arrangement region toward the other end portion thereof. A plurality of gas supply holes 250c through which gas is supplied is formed in a side surface of the third nozzle 249c. As shown in FIG. 2, the gas supply holes 250c are opened toward a center of the reaction tube 203 to supply gas toward the wafers 200. The gas supply holes 250c are formed in a plural number from a lower portion to an upper portion of the reaction tube 203. The gas supply holes 250c have the same opening area and formed at an equal opening pitch.

A catalytic gas supply system is mainly configured with the catalytic gas supply pipes 232c and 232h, the MFCs 241c and 241h, and the valves 243c and 243h. The third nozzle 249c, the TEA gas supply source 242c, and the pyridine gas supply source 242h may also be included in the catalytic gas supply system. In addition, the TEA gas or pyridine gas, which is described above as an example, may be an amine-based gas as a catalyst, i.e., an amine-based catalytic gas, as will be described later. Hereinafter, the catalytic gas supply system for supplying a variety of amine-based catalytic gases is also referred to as an amine-based catalytic gas supply system. In addition, a third inert gas supply system is mainly configured with the third inert gas supply pipe 232k, the MFC 241k, and the valve 243k. In addition, the $N_2$ gas supply source 242k may also be included in the third inert gas supply system. The third inert gas supply system also functions as a purge gas supply system.

The catalytic gas supply system for supplying an amine-based catalytic gas (amine-based catalytic gas supply system) may also be an assembly of a plurality of supply lines (supply system) for respectively supplying a plurality of types of amine-based catalytic gases having different molecular structures. That is, the amine-based catalytic gas supply system may be an assembly of a TEA gas supply line mainly configured with the first catalytic gas supply pipe 232c, the MFC 241c, and the valve 243c, and a pyridine gas supply line mainly configured with the second catalytic gas supply pipe 232h, the MFC 241h, and the valve 243h. Here, the third nozzle 249c or each corresponding catalytic gas supply source 242c or 242h may be included in each supply line.

In the method of supplying gas according to the embodiment, the gas may be transferred through the nozzles 249a, 249b and 249c and the buffer chamber 237 disposed in an arc-shaped longitudinal space defined by the inner wall of the reaction tube 203 and end portions of the stacked wafers 200. The gas is first ejected into the reaction tube 203 near the wafers 200 through the gas supply holes 250a, 250b, 250c and 250d opened in the nozzles 249a, 249b and 249c and the buffer chamber 237, respectively. Thus, a main flow of the gas in the reaction tube 203 follows a direction parallel to surfaces of the wafers 200, i.e., the horizontal direction. With this configuration, the gas can be uniformly supplied to the respective wafers 200, and thus, the film thickness of a film formed on each of the wafers 200 can be uniform. In addition, a residual gas after the reaction flows toward an exhaust port, i.e., the exhaust pipe 231, but a flow direction of the residual gas is not limited to the vertical direction but may be appropriately adjusted by a position of the exhaust port.

A precursor gas containing silicon (Si) as a predetermined element, more specifically, a chlorosilane-based precursor gas containing a methylene group, for example, which is a precursor gas containing Si, a methylene group as an alkylene group and a chloro group as a halogen group, as a precursor gas containing silicon (Si), carbon (C) and a halogen element (fluorine (F), chlorine (Cl), bromine (Br) or the like) and having an Si—C bonding, is supplied from the first precursor gas supply pipe 232a into the process chamber 201 through the MFC 241a, the valve 243a and the first nozzle 249a. Here, the chlorosilane-based precursor gas containing a methylene group is a silane-based precursor gas containing a methylene group and a chloro group, or a precursor gas at least containing Si, a methylene group containing C, and Cl as a halogen element. The chlorosilane-based precursor gas containing a methylene group supplied from the first precursor gas supply pipe 232a may include, for example, methylenebis(trichlorosilane), i.e., bis(trichlorosilyl)methane [(SiCl$_3$)$_2$CH$_2$, abbreviation: BTCSM] gas.

Figure 14A:
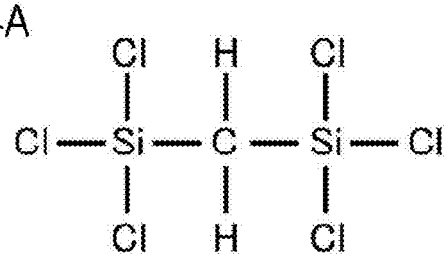
FIGS. 14A to 14F are views illustrating chemical structural formulae of a variety of silanes used as a precursor gas, illustrating chemical structural formulae of BTCSM, BTCSE, TCDMDS, DCTMDS, HCDS and BDEAS, respectively.

As shown in FIG. 14A, the BTCSM contains a methylene group as an alkylene group in its chemical structural formula (in one molecule). The methylene group contained in the BTCSM has two bonding electrons each bonded to Si to form an Si—C—Si bonding. The Si—C bonding contained in the precursor gas is a part of the Si—C—Si bonding, for example, contained in the BTCSM, and the methylene group contained in the BTCSM contains C constituting the Si—C bonding.

Also, the precursor gas containing Si, C and a halogen element and having an Si—C bonding includes, for example, a chlorosilane-based precursor gas containing an ethylene group, which is a precursor gas containing Si, an ethylene group as an alkylene group, and a chloro group as a halogen group. The chlorosilane-based precursor gas containing an ethylene group may include, for example, ethylenebis(trichlorosilane), i.e., 1,2-bis(trichlorosilyl)ethane [(SiCl$_3$)$_2$C$_2$H$_4$, abbreviation: BTCSE] gas or the like.

Figure 14B:
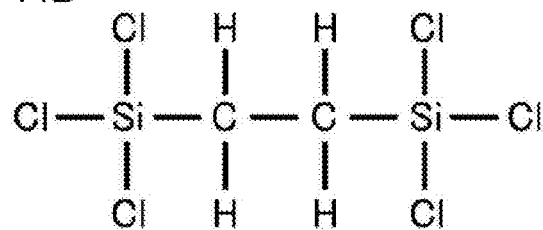

As shown in FIG. 14B, the BTCSE contains an ethylene group as an alkylene group in its chemical structural formula (in one molecule). The ethylene group contained in the BTCSE has two bonding electrons each bonded to Si to form an Si—C—C—Si bonding. The Si—C bonding contained in the precursor gas is a part of the Si—C—C—Si bonding, for example, contained in the BTCSE, and the ethylene group contained in the BTCSE contains C constituting the Si—C bonding.

Here, the alkylene group is a functional group in which two hydrogen (H) atoms are removed from a chain-like saturated hydrocarbon (alkane) represented by a general formula C$_n$H$_{2n+2}$, and is an assembly of atoms represented by a general formula C$_n$H$_{2n}$. The alkylene group includes a propylene group, a butylene group, or the like, in addition to the methylene group or the ethylene group described above as an example. As described above, the precursor gas containing Si, C and a halogen element and having an Si—C bonding includes an alkylenehalosilane-based precursor gas containing Si, an alkylene group and a halogen element. The alkylenehalosilane-based precursor gas is a halosilane-based precursor gas containing an alkylene group, and may be referred to as a gas having, for example, a structure in which an alkylene group is introduced between bonded Si and Si in a halosilane-based precursor gas while many halogen elements are bonded to bonding electrons of Si. The alkylenehalosilane-based precursor gas includes the BTCSM gas, the BTCSE gas, and the like.

A chlorosilane-based precursor gas containing a methyl group, for example, which is a precursor gas containing Si, a methyl group as an alkyl group, and a chloro group as a halogen group, as a precursor gas containing Si, C and a halogen element and having an Si—C bonding, is supplied from the second precursor gas supply pipe 232e into the process chamber 201 through the MFC 241e, the valve 243e, and the first nozzle 249a. Here, the chlorosilane-based precursor gas containing a methyl group is a silane-based precursor gas containing a methyl group and a chloro group, or a precursor gas at least containing Si, a methyl group containing C, and Cl as a halogen element. The chlorosilane-based precursor gas containing a methyl group supplied from the second precursor gas supply pipe 232e may include, for example, 1,1,2,2-tetrachloro-1,2-dimethyldisilane [(CH$_3$)$_2$Si$_2$Cl$_4$, abbreviation: TCDMDS] gas.

Figure 14C:
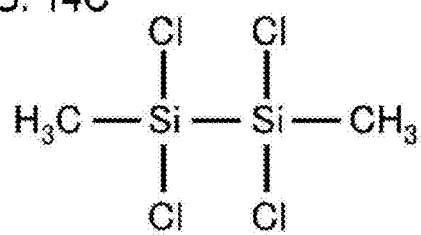

As shown in FIG. 14C, the TCDMDS contains two methyl groups as alkyl groups in its chemical structural formula (in one molecule). The two methyl groups contained in the TCDMDS have bonding electrons each bonded to Si to form an Si—C bonding. The Si—C bonding contained in the precursor gas is, for example, the Si—C bonding contained in the TCDMDS, and each of the two methyl groups contained in the TCDMDS contains C constituting the Si—C bonding.

In addition, the chlorosilane-based precursor gas containing a methyl group includes a precursor gas different from the TCDMDS gas. The other chlorosilane-based precursor gas containing a methyl group may include, for example, 1,2-dichloro-1,1,2,2-tetramethyldisilane [(CH$_3$)$_4$Si$_2$Cl$_2$, abbreviation: DCTMDS] gas and the like.

Figure 14D:
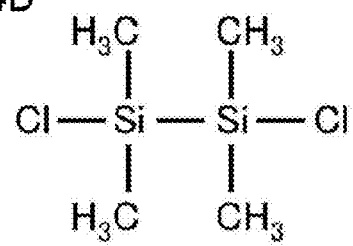

As shown in FIG. 14D, the DCTMDS contains four methyl groups as alkyl groups in its chemical structural formula (in one molecule). The four methyl groups contained in the DCTMDS have bonding electrons each bonded to Si to form an Si—C bonding. The Si—C bonding contained in the precursor gas is, for example, the Si—C bonding contained in the DCTMDS, and each of the four methyl groups contained in the DCTMDS contains C constituting the Si—C bonding.

Here, the alkyl group is a functional group in which one H atom is removed from a chain-like saturated hydrocarbon (alkane) represented by a general formula C$_n$H$_{2n+2}$, and is an assembly of atoms represented by a general formula C$_n$H$_{2n+1}$. The alkyl group includes an ethyl group, a propyl group, a butyl group, and the like, in addition to the methyl group described above as an example. As described above, the precursor gas containing Si, C and a halogen element and having an Si—C bonding includes an alkylhalosilane-based precursor gas containing Si, an alkyl group and a halogen element. The alkylhalosilane-based precursor gas is a halosilane-based precursor gas containing an alkyl group, and may also be referred to as a gas having a structure in which some halogen groups of a halosilane-based precursor gas are substituted by alkyl groups. The alkylhalosilane-based precursor gas includes the TCDMDS gas, the DCTMDS gas, and the like.

As described above, the alkylenehalosilane-based precursor gases and the alkylhalosilane-based precursor gases shown in FIGS. 14A to 14D include Si as a predetermined element and C bonded to Si, and as will be described later, may be used in forming an oxide film containing Si and C, for example.

A chlorosilane-based precursor gas, for example, which is a precursor gas containing Si and a chloro group as a halogen group, as a precursor gas containing Si as a predetermined element, more specifically, a precursor gas containing silicon (Si) and a halogen element, is supplied from the third precursor gas supply pipe 232f into the process chamber 201 through the MFC 241f, the valve 243f, and the first nozzle 249a. Here, the chlorosilane-based precursor gas is a silane-based precursor gas containing a chloro group, or a precursor gas at least containing Si and Cl as a halogen element. That is, the chlorosilane-based precursor described here may also be one of halides. The chlorosilane-based precursor gas supplied from the third precursor gas supply pipe 232f may include, for example, hexachlorodisilane ($Si_2Cl_6$, abbreviation: HCDS) gas.

Figure 14E:
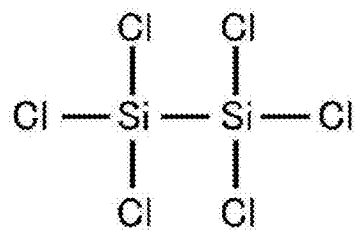

As shown in FIG. 14E, the HCDS includes Si and a chloro group in its chemical structural formula (in one molecule). In addition, the precursor gas containing Si and a halogen element may include, inorganic precursor gases such as tetrachlorosilane, i.e., silicontetrachloride ($SiCl_4$, abbreviation: STC) gas, trichlorosilane ($SiHCl_3$, abbreviation: TCS) gas, dichlorosilane ($SiH_2Cl_2$, abbreviation: DCS) gas, and monochlorosilane ($SiH_3Cl$, abbreviation: MCS) gas, in addition to the HCDS gas.

An aminosilane-based precursor gas, for example, which is a precursor gas containing Si and an amino group (amine group), as a precursor gas containing Si as a predetermined element, more specifically, a precursor gas containing silicon (Si), carbon (C) and nitrogen (N) and having Si—N bonding, is supplied from the fourth precursor gas supply pipe 232g into the process chamber 201 through the MFC 241g, the valve 243g, and the first nozzle 249a. Here, the aminosilane-based precursor gas is a silane-based precursor gas containing an amino group, or a precursor gas at least containing Si and an amino group containing C and N. The aminosilane-based precursor gas supplied from the fourth precursor gas supply pipe 232g may include, for example, bis(diethylamino)silane ($Si[N(C_2H_5)_2]_2H_2$, abbreviation: BDEAS) gas.

Figure 14F:
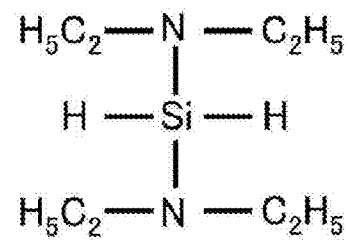
Figure 15A:
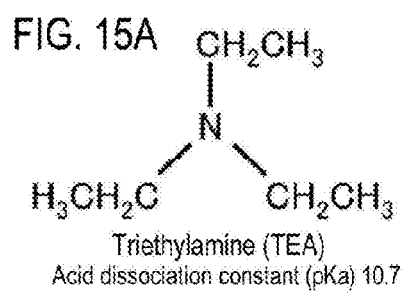
Figure 15B:
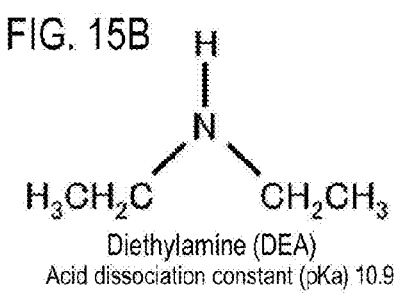
Figure 15C:
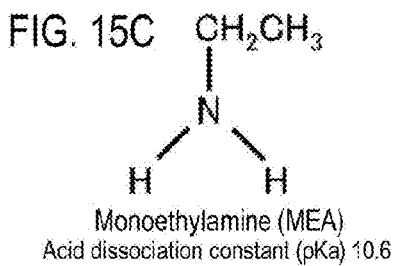
Figure 15D:
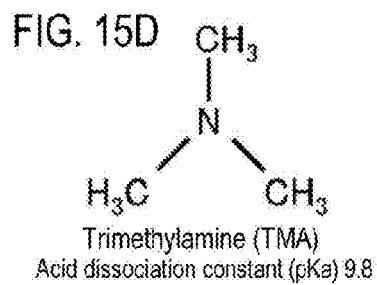
Figure 15E:
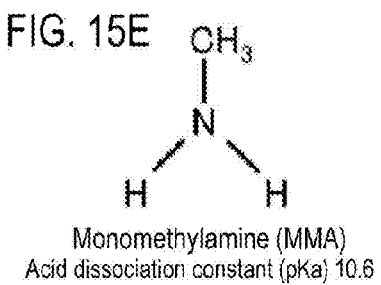

As shown in FIG. 14F, the BDEAS contains Si and an amino group in its chemical structural formula (in one molecule). In addition, the precursor gas containing Si, C and N and having Si—N bonding may include organic precursor gases such as tris(diethylamino)silane ($SiH[N(C_2H_5)_2]_3$, abbreviation: 3DEAS), tetrakis(diethylamino)silane ($Si[N(C_2H_5)_2]_4$, abbreviation: 4DEAS), tris(dimethylamino)silane ($Si[N(CH_3)_2]_3H$, abbreviation: 3DMAS) gas, and tetrakis(dimethylamino)silane ($Si[N(CH_3)_2]_4$, abbreviation: 4DMAS) gas, in addition to the BDEAS gas.

As described above, the plurality of supply lines constituting the precursor gas supply system are configured to respectively supply a plurality of types of precursor gases having different molecular structures. In addition, as described above, the respective precursor gases have different molecular structures, i.e., different chemical structural formula. The respective precursor gases may differ from one another in composition or component. The precursor gases having different molecular structures also differ from one another in chemical properties. Thus, as will be described later, by appropriately selecting the type of precursor gas according to a desired film forming process, oxide films having a variety of composition ratios and film qualities can be formed with high versatility and high reproducibility in one substrate processing apparatus.

Here, the chlorosilane-based precursor gas supplied from each precursor gas supply pipe 232a, 232e or 232f refers to a chlorosilane-based precursor in a gaseous state, for example, a gas obtained by vaporizing a chlorosilane-based precursor that is a liquid state under normal temperature and pressure, a chlorosilane-based precursor that is gaseous state under normal temperature and pressure, or the like. Also, the aminosilane-based precursor gas supplied from the fourth precursor gas supply pipe 232g refers to an aminosilane-based precursor in a gaseous state, for example, a gas obtained by vaporizing an aminosilane-based precursor that is a liquid state under normal temperature and pressure, an aminosilane-based precursor that is gaseous state under normal temperature and pressure, or the like. In addition, when the term "precursor" is used herein, it may refer to "a liquid precursor in a liquid state," "a precursor gas in a gaseous state," or both of them. Therefore, when the term "chlorosilane-based precursor" is used herein, it may refer to "a chlorosilane-based precursor in a liquid state," "a chlorosilane-based precursor gas in a gaseous state," or both of them. Also, when the term "aminosilane-based precursor" is used herein, it may refer to "an aminosilane-based precursor in a liquid state," "an aminosilane-based precursor gas in a gaseous state," or both of them. In addition, when a liquid precursor in a liquid state under normal temperature and pressure such as BTCSM, BTCSE, TCDMDS, DCTMDS, HCDS, or BDEAS is used, the liquid precursor is vaporized by a vaporization system, such as a vaporizer or a bubbler, and supplied as a precursor gas (BTCSM gas, BTCSE gas, TCDMDS gas, DCTMDS gas, HCDS gas, or BDEAS gas).

A gas containing oxygen (O) (oxygen-containing gas), for example, as an oxidizing gas, is supplied from the first oxidizing gas supply pipe 232b into the process chamber 201 through the MFC 241b, the valve 243b, the second nozzle 249b, and the buffer chamber 237. The oxidizing gas supplied from the first oxidizing gas supply pipe 232b may include, for example, ozone ($O_3$) gas.

A gas containing oxygen (O) (oxygen-containing gas), for example, as an oxidizing gas, is supplied from the second oxidizing gas supply pipe 232d into the process chamber 201 through the MFC 241d, the valve 243d, the second nozzle 249b, and the buffer chamber 237. The oxidizing gas supplied from the second oxidizing gas supply pipe 232d may include, for example, oxygen ($O_2$) gas.

As described above, the plurality of supply lines constituting the oxidizing gas supply system are configured to respectively supply a plurality of types of oxidizing gases having different molecular structures. In addition, as described above, the respective oxidizing gases have different molecular structures, i.e., different chemical structural formulae. The respective oxidizing gases may differ from one another in composition or component. The oxidizing gases having different molecular structures also differ from one another in chemical properties. Thus, for example, by appropriately selecting the type of oxidizing gas according to a desired film forming process, oxide films having a variety of composition ratios and film qualities can be formed with high versatility and high reproducibility in one substrate processing apparatus.

An amine-based gas containing carbon (C), nitrogen (N) and hydrogen (H), for example, as a catalytic gas promoting decomposition of a precursor gas by catalysis and also promoting an oxidation reaction with $O_3$ gas, is supplied from the first catalytic gas supply pipe 232c into the process chamber 201 through the MFC 241c, the valve 243c, and the third nozzle 249c. Here, the amine-based gas is a gas containing an amine in which at least one of hydrogen atoms of ammonia ($NH_3$) is substituted by a hydrocarbon group such as an alkyl group. In addition, the amine-based gas used as a catalytic gas may be referred to as an amine-based catalytic gas. As shown in FIGS. 15A to 15F, a variety of amines, i.e., amine-based catalysts, used as the catalytic gas contains N, for example, with lone pair electrons, and has an acid dissociation constant (hereinafter, referred to as pKa) of 5 to 11 or so. Here, the acid dissociation constant (pKa) is one of indices representing a quantitative measure of the strength of an acid, and is represented by the negative common logarithm of an equilibrium constant, Ka, in a dissociative reaction in which hydrogen ions are emitted from acid. Such an amine-based gas includes a chain-like amine-based gas having hydrocarbon groups chained or a cyclic amine-based gas having hydrocarbon groups cycled. The amine-based catalytic gas supplied from the first catalytic gas supply pipe 232c may include, for example, triethylamine [$(C_2H_5)_3N$, abbreviation: TEA] gas, which is a chain-like amine-based gas.

As shown in FIGS. 15A to 15E along with pKa, the chain-like amine used as the amine-based catalytic gas includes, for example, diethylamine [$(C_2H_5)_2NH$, abbreviation: DEA, pKa=10.9], monoethylamine [$(C_2H_5)NH_2$, abbreviation: MEA, pKa=10.6], trimethylamine [$(CH_3)_3N$, abbreviation: TMA, pKa=9.8], monomethylamine [$(CH_3)NH_2$, abbreviation: MMA, pKa=10.6] and the like, in addition to the triethylamine [$(C_2H_5)_3N$, abbreviation: TEA, pKa=10.7]. Here, a pKa value of each chain-like amine is indicated for reference.

An amine-based gas containing C, N and H, for example, as a catalytic gas having the same catalyst action as above, is supplied from the second catalytic gas supply pipe 232h into the process chamber 201 through the MFC 241h, the valve 243h, and the third nozzle 249c. The amine-based catalytic gas supplied from the second catalytic gas supply pipe 232h may include, for example, the pyridine ($C_5H_5N$) gas, which is a cyclic amine-based gas.

As shown in FIG. 15F along with pKa, the cyclic amine used as the amine-based catalytic gas include, for example, amino pyridine ($C_5H_6N_2$, pKa=6.89), picoline ($C_6H_7N$, pKa=6.07), lutidine ($C_7H_9N$, pKa=6.96), piperazine ($C_4H_{10}N_2$, pKa=9.80), piperidine ($C_5H_{11}N$, pKa=11.12), and the like, in addition to the pyridine ($C_5H_5N$, pKa=5.67). Here, a pKa value of each cyclic amine is indicated for reference. These cyclic amines may be referred to as heterocyclic compounds having a plurality of types of elements of C and N as members of its ring, i.e., nitrogen-containing heterocyclic compounds.

As described above, the plurality of supply lines constituting the catalytic gas supply system for supplying the amine-based catalytic gases are configured to respectively supply a plurality of types of amine-based catalytic gases having different molecular structures. In addition, as described above, the respective amine-based catalytic gases have different molecular structures, i.e., different chemical structural formulae. The respective amine-based catalytic gases may differ from one another in composition or component. The amine-based catalytic gases having different molecular structures also differ from one another in chemical properties. Thus, as will be described later, by appropriately selecting the type of amine-based catalytic gas according to a desired film forming process, oxide films having a variety of composition ratios and film qualities can be formed with high versatility and high reproducibility in one substrate processing apparatus.

In addition, the catalytic gas includes a non-amine-based gas, i.e., for example, the ammonia ($NH_3$, pKa=9.2) gas, or the like, in addition to the amine-based gases described above as an example. A catalytic gas such as $NH_3$ gas may be supplied from the catalytic gas supply system.

The Nitrogen ($N_2$) gas, for example, as an inert gas, is supplied from the inert gas supply pipes 232i, 232j and 232k into the process chamber 201 through the MFCs 241i, 241j and 241k, the valves 243i, 243j and 243k, the gas supply pipes 232a, 232b and 232c, the nozzles 249a, 249b and 249c, and the buffer chamber 237, respectively.

In the buffer chamber 237, as illustrated in FIG. 2, a first rod-shaped electrode 269 that is a first electrode having an elongated structure and a second rod-shaped electrode 270 that is a second electrode having an elongated structure are disposed to span from the lower portion to the upper portion of the reaction tube 203 in the stacking direction of the wafers 200. Each of the first rod-shaped electrode 269 and the second rod-shaped electrode 270 is disposed in parallel to the second nozzle 249b. Each of the first rod-shaped electrode 269 and the second rod-shaped electrode 270 is covered with and protected by an electrode protection tube 275, which is a protection tube for protecting each electrode from an upper portion to a lower portion thereof. Any one of the first rod-shaped electrode 269 and the second rod-shaped electrode 270 is connected to a high-frequency power source 273 through a matching unit 272, and the other one is connected to a ground corresponding to a reference electric potential. By applying high-frequency (RF) power from the high-frequency power source 273 between the first rod-shaped electrode 269 and the second rod-shaped electrode 270 through the matching unit 272, plasma is generated in a plasma generation region 224 between the first rod-shaped electrode 269 and the second rod-shaped electrode 270. A plasma source as a plasma generator (plasma generating part) is mainly configured with the first rod-shaped electrode 269, the second rod-shaped electrode 270, and the electrode protection tubes 275. The matching unit 272 and the high-frequency power source 273 may also be included in the plasma source. Also, as will be described later, the plasma source functions as an activating mechanism (exciting part) that activates (excites) gas to plasma.

The electrode protection tube 275 has a structure in which each of the first rod-shaped electrode 269 and the second rod-shaped electrode 270 can be inserted into the buffer chamber 237 in a state where each of the first rod-shaped electrode 269 and the second rod-shaped electrode 270 is isolated from an internal atmosphere of the buffer chamber 237. Here, when an internal oxygen concentration of the electrode protection tube 275 is equal to an oxygen concentration in an ambient air (atmosphere), each of the first rod-shaped electrode 269 and the second rod-shaped electrode 270 inserted into the electrode protection tubes 275 is oxidized by the heat generated by the heater 207. Therefore, by charging the inside of the electrode protection tube 275 with an inert gas such as the $N_2$ gas, or by purging the inside of the electrode protection tube 275 with an inert gas such as the $N_2$ gas using an inert gas purging mechanism, the internal oxygen concentration of the electrode protection tube 275 decreases, thereby suppressing oxidation of the first rod-shaped electrode 269 or the second rod-shaped electrode 270.

The exhaust pipe 231 for exhausting an internal atmosphere of the process chamber 201 is installed at the reaction tube 203. A vacuum exhaust device, for example, a vacuum pump 246, is connected to the exhaust pipe 231 through a pressure sensor 245, which is a pressure detector (pressure detecting part) for detecting an internal pressure of the process chamber 201, and an APC (Auto Pressure Controller) valve 244, which is a pressure adjuster (pressure adjusting part). The APC valve 244 is configured to perform/stop vacuum exhaust in the process chamber 201 by opening/closing the valve with the actuated vacuum pump 246, and further to adjust the internal pressure of the process chamber 201 by adjusting a degree of the valve opening with the actuated vacuum pump 246. An exhaust system is mainly configured with the exhaust pipe 231, the APC valve 244, and the pressure sensor 245. Also, the vacuum pump 246 may be included in the exhaust system. The exhaust system is configured to adjust the degree of the valve opening of the APC valve 244 based on pressure information detected by the pressure sensor 245 while operating the vacuum pump 246 such that the internal pressure of the process chamber 201 is vacuum exhausted to a predetermined pressure (a vacuum level). In addition, the exhaust pipe 231 is not limited to being installed at the reaction tube 203 and may be installed at the manifold 209 like the respective nozzles 249a to 249c.

A seal cap 219, which functions as a furnace port cover configured to hermetically seal a lower end opening of the manifold 209, is installed under the manifold 209. The seal cap 219 is configured to contact the lower end of the manifold 209 from the below in the vertical direction. The seal cap 219, for example, may be formed of metal such as stainless steel and have a disc shape. An O-ring 220b, which is a seal member in contact with the lower end portion of the manifold 209, is installed at an upper surface of the seal cap 219. A rotary mechanism 267 configured to rotate the boat 217, which is a substrate holder to be described later, is installed below the seal cap 219. A rotary shaft 255 of the rotary mechanism 267 passes through the seal cap 219 to be connected to the boat 217. The rotary mechanism 267 is configured to rotate the wafers 200 by rotating the boat 217. The seal cap 219 is configured to move vertically by a boat elevator 115, which is an elevation mechanism vertically disposed at the outside of the reaction tube 203. The boat elevator 115 is configured to enable the boat 217 to be loaded into or unloaded from the process chamber 201 by elevating or lowering the seal cap 219. That is, the boat elevator 115 is configured as a transfer device (transfer mechanism) that transfers the boat 217 and the wafers 200 supported by the boat 217 into and out of the process chamber 201.

The boat 217, which is used as a substrate support, is made of a heat resistant material such as quartz or silicon carbide and is configured to support a plurality of the wafers 200 horizontally stacked in multiple stages with the centers of the wafers 200 concentrically aligned. In addition, a heat insulating member 218 formed of a heat resistant material such as quartz or silicon carbide is installed at a lower portion of the boat 217 and configured such that the heat from the heater 207 cannot be transferred to the seal cap 219. In addition, the heat insulating member 218 may be configured with a plurality of heat insulating plates formed of a heat resistant material such as quartz or silicon carbide, and a heat insulating plate holder configured to support the heat insulating plates in a horizontal posture in a multi-stage manner.

A temperature sensor 263, which is a temperature detector, is installed in the reaction tube 203. Based on temperature information detected by the temperature sensor 263, an electrical conduction state to the heater 207 is adjusted such that the interior of the process chamber 201 has a desired temperature distribution. The temperature sensor 263 is configured in an L-shape similar to the nozzles 249a to 249c and installed along the inner wall of the reaction tube 203.

Figure 3:
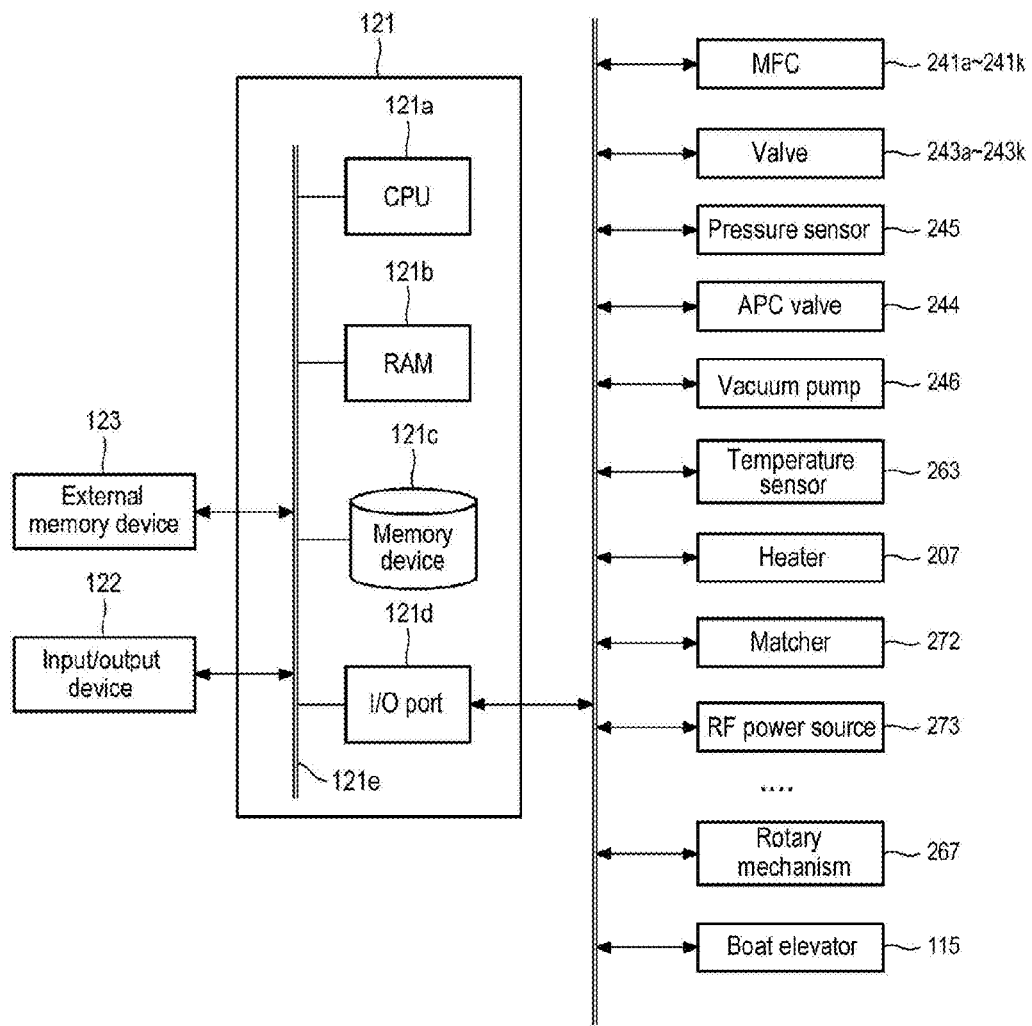
FIG. 3 is a schematic view illustrating a configuration of a controller of the substrate processing apparatus according to the first embodiment of the present disclosure.

As illustrated in FIG. 3, a controller 121, which is a control unit (control part), is configured as a computer including a CPU (Central Processing Unit) 121a, a RAM (Random Access Memory) 121b, a memory device 121c, and an I/O port 121d. The RAM 121b, the memory device 121c and the I/O port 121d are configured to exchange data with the CPU 121a via an internal bus 121e. An input/output device 122, for example, including a touch panel or the like, is connected to the controller 121.

The memory device 121c is configured with, for example, a flash memory, an HDD (Hard Disc Drive), or the like. A control program for controlling operations of the substrate processing apparatus or a process recipe, in which a sequence or condition for processing a substrate, such as for forming a thin film, which will be described later, is written, is readably stored in the memory device 121c. Also, the process recipe functions as a program for the controller 121 to execute each sequence in the substrate processing process, such as a thin film forming process of forming a thin film such as an oxide film, which will be described later, to obtain a predetermined result. Hereinafter, the process recipe or control program may be generally referred to as a program. Also, when the term "program" is used herein, it may include the case in which only the process recipe is included, the case in which only the control program is included, or the case in which both the process recipe and the control program are included. In addition, the RAM 121b is configured as a memory area (work area) in which a program or data read by the CPU 121a is temporarily stored.

The I/O port 121d is connected to the above-described MFCs 241a to 241k, the valves 243a to 243k, the pressure sensor 245, the APC valve 244, the vacuum pump 246, the temperature sensor 263, the heater 207, the matching unit 272, the high-frequency power source 273, the rotary mechanism 267, the boat elevator 115 and the like.

The CPU 121a is configured to read and execute the control program from the memory device 121c. According to an input of an operation command from the input/output device 122, the CPU 121a reads the process recipe from the memory device 121c. In addition, the CPU 121a is configured to control the flow rate controlling operation of various types of gases by the MFCs 241a to 241k, the opening/closing operation of the valves 243a to 243k, the opening/closing operation of the APC valve 244 and the pressure adjusting operation by the APC valve 244 based on the pressure sensor 245, the operation of starting and stopping the vacuum pump 246, the temperature adjusting operation of the heater 207 based on the temperature sensor 263, the rotation and rotation speed adjusting operation of the boat 217 by the rotary mechanism 267, the elevation operation of the boat 217 by the boat elevator 115, the impedance adjusting operation of the matching unit 272, the operation of supplying power by the high-frequency power source 273, and the like according to contents of the read process recipe.

Moreover, the controller 121 is not limited to being configured as a dedicated computer but may be configured as a general-purpose computer. For example, the controller 121 according to the embodiment may be configured with preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, a means for supplying a program to a computer is not limited to the case in which the program is supplied through the external memory device 123. For example, the program may be supplied using a communication means such as the Internet or a dedicated line, rather than through the external memory device 123. Also, the memory device 121c or the external memory device 123 is configured as a non-transitory computer-readable recording medium. Hereinafter, these means for supplying the program will be simply referred to as "a recording medium." In addition, when the term "recording medium" is used herein, it may include a case in which only the memory device 121c is included, a case in which only the external memory device 123 is included, or a case in which both the memory device 121c and the external memory device 123 are included.

(2) Process of Forming Oxide Film

Next, an example of a sequence of forming a thin film such as an oxide film on a substrate, which is one of the processes for manufacturing a semiconductor device by using the processing furnace 202 of the above-described substrate processing apparatus will be described. Also, in the following description, the operations of the respective parts constituting the substrate processing apparatus are controlled by the controller 121.

In this embodiment, a process of forming an oxide film containing silicon (Si) as a predetermined element on a wafer 200 as a substrate is performed by performing a cycle a predetermined number of times, the cycle including: a process of supplying a precursor gas containing silicon (Si) to the wafer 200; and a process of supplying an ozone gas to the wafer 200, wherein in the process of supplying the precursor gas, the precursor gas is supplied to the wafer 200 in a state where a catalytic gas is not supplied to the wafer 200, and wherein in the process of supplying the ozone gas, the ozone gas is supplied to the wafer 200 in a state where an amine-based catalytic gas is supplied to the wafer 200.

Also, in this embodiment, the respective processes are performed under a non-plasma atmosphere.

Moreover, in the embodiment, in order to form a composition ratio of an oxide film to be formed as a stoichiometric composition or another predetermined composition ratio different from the stoichiometric composition, supply conditions of a plurality of types of gases containing a plurality of elements constituting the oxide film to be formed are controlled. For example, the supply conditions are controlled such that at least one element of a plurality of elements constituting the oxide film to be formed stoichiometrically exceeds another element. Hereinafter, an example of a sequence of forming a film while adjusting a ratio of the plurality of elements constituting the oxide film to be formed, i.e., a composition ratio of the oxide film, will be described.

Figure 4:
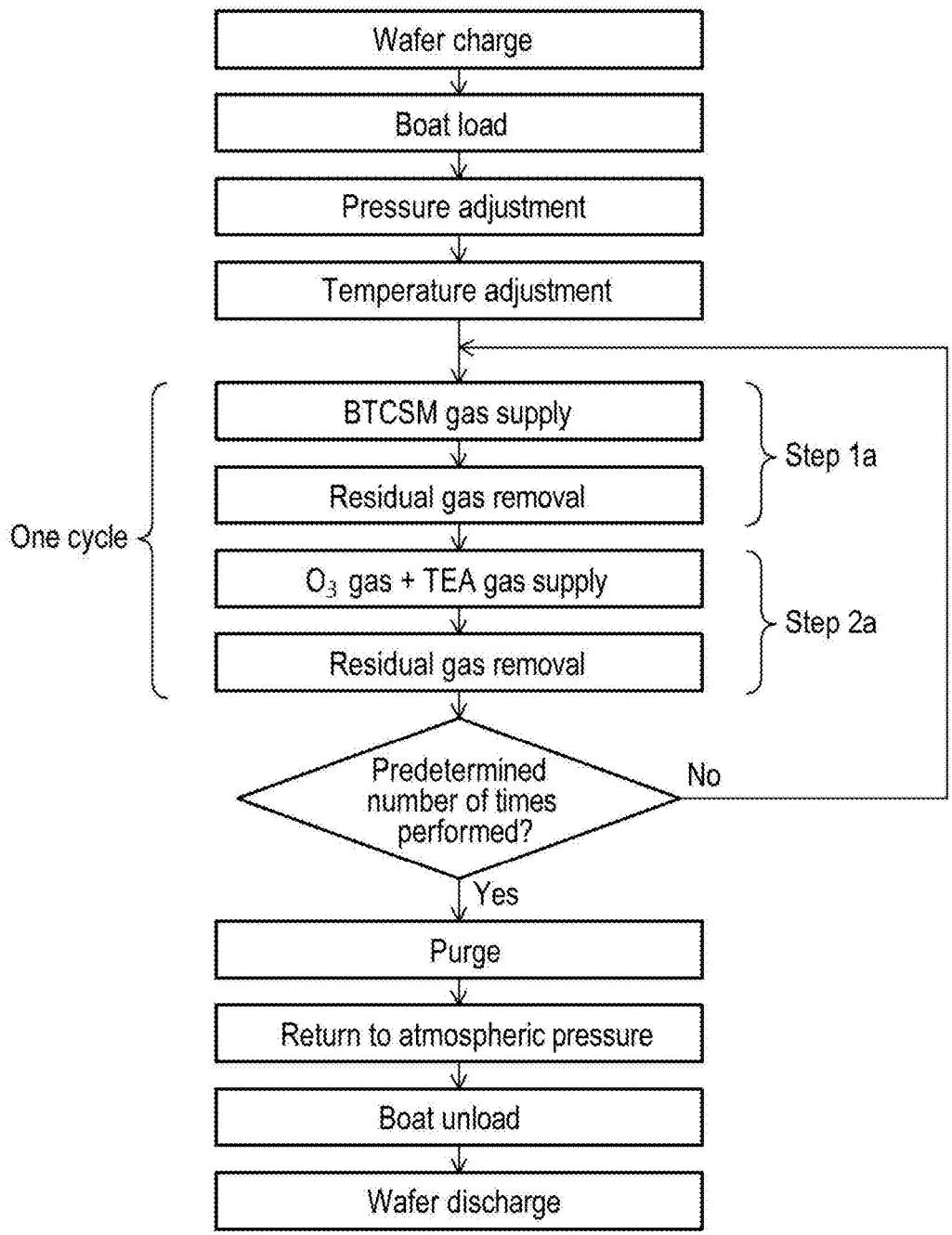
FIG. 4 is a view illustrating a flow of film formation in a film forming sequence according to a first embodiment of the present disclosure.
Figure 5:
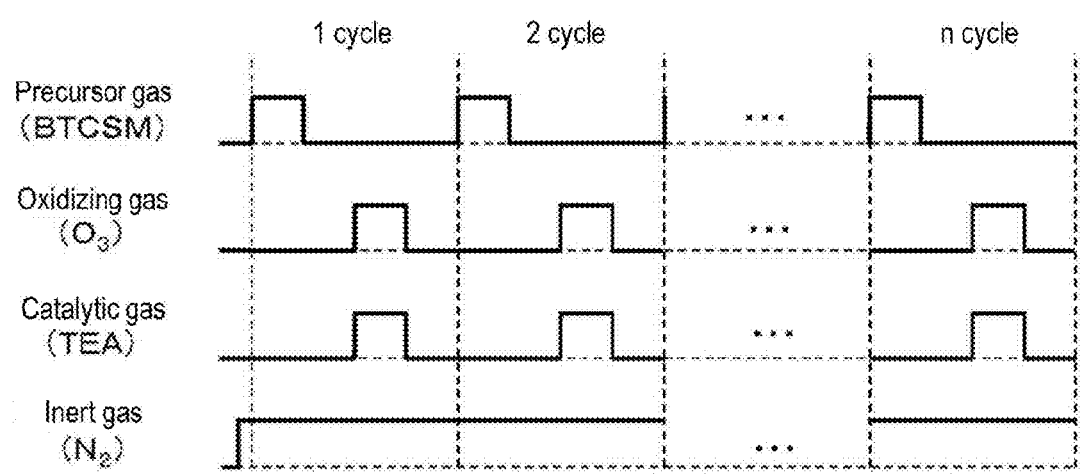
FIG. 5 is a view illustrating gas supply timings in the film forming sequence according to the first embodiment of the present disclosure.

Hereinafter, the film forming sequence of the embodiment will be described in detail with reference to FIGS. 4 and 5. FIG. 4 is a view illustrating a flow of film formation in the film forming sequence according to the embodiment. FIG. 5 is a view illustrating gas supply timings in the film forming sequence according to the embodiment.

Here, there will be described an example of forming a silicon oxycarbide film (hereinafter, referred to as an SiOC film), which is an oxide film containing Si and further C, on the wafer 200 by performing a cycle a predetermined number of times (n times; n being an integer), the cycle including: a process of supplying a BTCSM gas, as a precursor gas containing Si and C bonded to Si, to the wafer 200; and a process of supplying an $O_3$ gas to the wafer 200.

Here, in the process of supplying the BTCSM gas, the BTCSM gas is supplied to the wafer 200 in a state where a catalytic gas such as the amine-based catalytic gas is stopped from being supplied to the wafer 200, and in the process of supplying the $O_3$ gas, the $O_3$ gas is supplied to the wafer 200 in a state where TEA gas as the amine-based catalytic gas is supplied to the wafer 200.

As in the example of the sequence according to the embodiment, when an oxide film is formed, it is possible to improve the film quality, such as a resistance to wet etching, for example, by allowing the oxide film to further contain C. In the embodiment, as the precursor gas containing Si and C bonded to Si, such as the BTCSM gas, is used, it is possible to form the SiOC film by introducing C into the film. In addition, the SiOC film may be referred to as the SiO film containing C, or the SiO film doped with C (having C added).

Moreover, when the term "wafer" is used herein, it may refer to "the wafer itself" or "the wafer and a laminated body (a collected body) of predetermined layers or films formed on the surface of the wafer" (i.e., the wafer including the predetermined layers or films formed on the surface may be referred to as a wafer). In addition, the phrase "a surface of a wafer" as used herein may refer to "a surface (an exposed surface) of a wafer itself" or "a surface of a predetermined layer or film formed on the wafer, i.e., the uppermost surface of the wafer, which is a laminated body."

Accordingly, "a predetermined gas is supplied to a wafer" may mean that "a predetermined gas is directly supplied to a surface (an exposed surface) of a wafer itself" or that "a predetermined gas is supplied to a layer or a film formed on a wafer, i.e., on the uppermost surface of a wafer as a laminated body." Also, "a predetermined layer (or film) is formed on a wafer" may mean that "a predetermined layer (or film) is directly formed on a surface (an exposed surface) of a wafer itself" or that "a predetermined layer (or film) is formed on a layer or a film formed on a wafer, i.e., on the uppermost surface of a wafer as a laminated body."

Moreover, the term "substrate" as used herein may be synonymous with the term "wafer," and in this case, the terms "wafer" and "substrate" may be used interchangeably in the above description.

(Wafer Charging and Boat Loading)

When the plurality of wafers 200 are charged on the boat 217 (wafer charging), as illustrated in FIG. 1, the boat 217 supporting the plurality of wafers 200 is raised by the boat elevator 115 to be loaded into the process chamber 201 (boat loading). In this state, the seal cap 219 seals the lower end of the manifold 209 via the O-ring 220b.

(Pressure Adjustment and Temperature Adjustment)

The interior of the process chamber 201 is vacuum exhausted by the vacuum pump 246 to a desired pressure (vacuum level). Here, the internal pressure of the process chamber 201 is measured by the pressure sensor 245, and the APC valve 244 is feedback-controlled based on the measured pressure information (pressure adjustment). Also, the vacuum pump 246 maintains a regular operation state at least until processing of the wafers 200 is terminated. Further, the wafers 200 in the process chamber 201 are heated by the heater 207 to a desired temperature. Here, an electrical conduction state to the heater 207 is feedback-controlled based on the temperature information detected by the temperature sensor 263 until the interior of the process chamber 201 reaches a desired temperature distribution (temperature adjustment). In addition, the heating of the interior of the process chamber 201 by the heater 207 is continuously performed at least until processing of the wafers 200 is terminated. Here, as will be described later, when the wafers 200 are processed at room temperature, the inside of the process chamber 201 may not be heated by the heater 207. Next, the boat 217 and wafers 200 begin to be rotated by the rotary mechanism 267. Furthermore, the rotation of the boat 217 and wafers 200 by the rotary mechanism 267 is continuously performed at least until processing of the wafers 200 is terminated.

(Process of Forming SiOC Film)

Thereafter, the following two steps, i.e., Steps 1a and 2a, are sequentially performed.

[Step 1a]

(BTCSM Gas Supply)

The valve 243a of the first precursor gas supply pipe 232a is opened to flow the BTCSM gas into the first precursor gas supply pipe 232a. A flow rate of the BTCSM gas flowing into the first precursor gas supply pipe 232a is controlled by the MFC 241a. The flow-rate-controlled BTCSM gas is supplied into the process chamber 201 through the gas supply holes 250a of the first nozzle 249a, and exhausted through the exhaust pipe 231. In this way, the BTCSM gas is supplied to the wafer 200 (BTCSM gas supply). At the same time, the valve 243i is opened to flow an inert gas such as the $N_2$ gas into the first inert gas supply pipe 232i. A flow rate of the $N_2$ gas flowing in the first inert gas supply pipe 232i is controlled by the MFC 241i. The flow-rate-controlled $N_2$ gas is supplied into the process chamber 201 together with the BTCSM gas, and exhausted through the exhaust pipe 231.

At this time, for example, as the valve 243c of the first catalytic gas supply pipe 232c is closed, the BTCSM gas is supplied to the wafer 200 in a state where the TEA gas is stopped from being supplied. Further, while the valves 243c and 243h of the catalytic gas supply pipes 232c and 232h are closed, the BTCSM gas is supplied to the wafer 200 in a state where an amine-based catalytic gases including the TEA gas are stopped from being supplied, i.e., in a state where the amine-based catalytic gases are not supplied. That is, when the BTCSM gas is supplied to the wafer 200, the catalytic gases including the amine-based catalytic gas are not supplied.

Here, in order to prevent infiltration of the BTCSM gas into the buffer chamber 237, the second nozzle 249b and the third nozzle 249c, the valves 243j and 243k are opened to flow the $N_2$ gas into the second inert gas supply pipe 232j and the third inert gas supply pipe 232k. The $N_2$ gas is supplied into the process chamber 201 through the first oxidizing gas supply pipe 232b, the first catalytic gas supply pipe 232c, the second nozzle 249b, the third nozzle 249c and the buffer chamber 237, and exhausted through the exhaust pipe 231.

At this time, the APC valve 244 is appropriately controlled to set the internal pressure of the process chamber 201 to fall within a range of, for example, 1 to 13300 Pa, specifically, for example, in a range of 20 to 1330 Pa, or more specifically, for example, 1330 Pa. A supply flow rate of the BTCSM gas controlled by the MFC 241a is set to fall within a range of, for example, 1 to 2000 sccm. A supply flow rate of the $N_2$ gas controlled by each of the MFCs 241i to 241k is set to fall within a range of, for example, 100 to 10000 sccm. A time duration of supplying the BTCSM gas to the wafer 200, i.e., a gas supply time (irradiation time), is set to fall within a range of, for example, 1 to 100 seconds, or more specifically, for example, in a range of 5 to 30 seconds.

At this time, a temperature of the heater 207 is set such that a temperature of the wafer 200 falls within a range of, for example, room temperature or greater and 200 degrees C. or less, specifically, for example, in a range of room temperature or greater and 150 degrees C. or less, or more specifically, for example, in a range of room temperature or greater and 100 degrees C. or less. Also, in supplying the BTCSM gas, if a temperature of the wafer 200 is less than 250 degrees C. when a catalytic gas such as an amine-based catalytic gas is not supplied, it becomes difficult for the BTCSM to be chemisorbed onto the wafer 200, such that a practical film forming rate cannot be obtained. In the embodiment, this problem can be solved by using a combination of the $O_3$ gas and TEA gas in the following Step 2a, which is performed as will be described later, even when a temperature of the wafer 200 is less than 250 degrees C. On the premise that Step 2a is performed thereafter, as a temperature of the wafer 200 is set to fall within a range of 200 degrees C. or less, specifically, in a range of 150 degrees C. or less, or more specifically, in a range of 100 degrees C. or less, the amount of heat applied to the wafer 200 can be reduced, and thus, the thermal budget of the wafer 200 can be satisfactorily controlled. Here, a sufficient film forming rate can be obtained at a temperature equal to or greater than room temperature. Therefore, it is preferred that a temperature of the wafer 200 be set to fall within a range of room temperature or greater and 200 degrees C. or less, specifically, in a range of room temperature or greater and 150 degrees C. or less, or more specifically, in a range of room temperature or greater and 100 degrees C. or less.

As the BTCSM gas is supplied to the wafer 200 under the above-described conditions, for example, a silicon-containing layer (Si-containing layer) containing C and Cl having a thickness of less than one atomic layer to several atomic layers, as a first layer, is formed on the wafer 200 (the base film of the surface). The Si-containing layer containing C and Cl may be a silicon layer (Si layer) containing C and Cl, an adsorption layer of the BTCSM gas, or both of these.

Here, the Si layer containing C and Cl is a generic name including a discontinuous layer in addition to a continuous layer formed of Si and containing C and Cl, or a silicon thin film (Si thin film) containing C and Cl formed by laminating them. Also, a continuous layer formed of Si and containing C and Cl may be referred to as the Si thin film containing C and Cl. In addition, Si constituting the Si layer containing C and Cl includes Si, where its bonding to C or Cl is completely broken, in addition to Si, where its bonding to C or Cl is not completely broken.

Moreover, the adsorption layer of the BTCSM gas may include an adsorption layer in which gas molecules of the BTCSM gas are discontinuous, in addition to an adsorption layer in which the gas molecules of the BTCSM gas are continuous. That is, the adsorption layer of the BTCSM gas may include an adsorption layer that contains BTCSM molecules having a thickness of one molecular layer or less. Further, the BTCSM [$(SiCl_3)_2CH_2$] molecule constituting the adsorption layer of the BTCSM gas also includes a molecule in which bonding of Si and C is partially broken, or a molecule in which bonding of Si and Cl is partially broken, in addition to the molecule represented by the chemical structural formula of FIG. 14A. That is, the adsorption layer of the BTCSM gas includes a chemisorption layer of BTCSM molecules or a physisorption layer of BTCSM molecules.

Also, a layer having a thickness of less than one atomic layer refers to a discontinuously formed atomic layer, and a layer having a thickness of one atomic layer refers to a continuously formed atomic layer. In addition, a layer having a thickness of less than one molecular layer refers to a discontinuously formed molecular layer, and a layer having a thickness of one molecular layer refers to a continuously formed molecular layer. Also, the Si-containing layer containing C and Cl may include both the Si layer containing C and Cl and the adsorption layer of the BTCSM gas, but, as described above, the Si-containing layer containing C and Cl will be represented as "a one-atomic layer," "a several-atomic layer," or the like.

When the thickness of the Si-containing layer containing C and Cl formed on the wafer 200 exceeds several atomic layers, an effect of the modification reaction in Step 2a, which will be described late, is not applied to the entire Si-containing layer containing C and Cl. In addition, a minimum value of the thickness of the Si-containing layer containing C and Cl that can be formed on the wafer 200 is less than one atomic layer. Accordingly, the thickness of the Si-containing layer containing C and Cl may range from less than one atomic layer to several atomic layers. When the thickness of the Si-containing layer containing C and Cl is one atomic layer or less, i.e., one atomic layer or less than one atomic layer, an effect of the modification reaction in Step 2a described later can be relatively increased, and thus a time required for the modification reaction in Step 2a can be reduced. A time required for forming the Si-containing layer containing C and Cl in Step 1a can also be reduced. As a result, a processing time per one cycle can be reduced, and thus, a total processing time can also be reduced. That is, the film forming rate can be increased. In addition, as the thickness of the Si-containing layer containing C and Cl is one atomic layer or less, it may become easier to maintain and control the film thickness uniformity.

Under a condition in which the BTCSM gas is self-decomposed (pyrolyzed), i.e., under a condition in which a pyrolysis reaction of the BTCSM gas occurs, the Si layer containing C and Cl is formed by depositing Si on the wafer 200. Under a condition in which the BTCSM gas is not self-decomposed (pyrolyzed) (i.e., under a condition in which a pyrolysis reaction of the BTCSM gas does not occur), the adsorption layer of the BTCSM gas is formed by adsorbing the BTCSM gas onto the wafer 200. Also, in the embodiment, since the temperature of the wafer 200 is set to a low temperature, for example, of 200 degrees C. or less, the adsorption layer of the BTCSM gas is more likely to be formed on the wafer 200 rather than the Si layer containing C and Cl is formed on the wafer 200. Here, when no catalytic gas is supplied for the adsorption layer of the BTCSM gas, a weak physisorption state is more dominant than a chemisorption state in terms of bonding of BTCSM molecules to the base such as the surface of the wafer 200 or bonding of BTCSM molecules to one another. That is, the adsorption layer of the BTCSM gas includes largely a physisorption layer of the BTCSM gas.

As described above, if the Si-containing layer containing C and Cl includes largely the adsorption layer of BTCSM molecules insufficiently pyrolyzed, it is difficult to fix the Si-containing layer onto the wafer 200 or the like and additionally difficult to form a silicon oxycarbide layer (SiOC layer) with a strong bonding by a modification processing (oxidation processing) performed later. That is, in a case where no catalytic gas is supplied when the BTCSM gas is supplied, for example, even if a catalytic gas is supplied in the subsequent modification processing, it is difficult in some cases for the modification reaction of the Si-containing layer containing C and Cl to progress. Therefore, it is apprehended that a film forming rate is reduced or the film is not formed from the first.

Accordingly, under such low temperature conditions, for example, both in the process of supplying the precursor gas and the process of supplying the oxidizing gas, a catalytic gas containing N with lone pair electrons, such as the ammonia ($NH_3$) gas or TEA gas, may be supplied in some cases. Thus, when the precursor gas is supplied, a pyrolysis reaction of the precursor gas can be promoted. That is, such a catalytic gas weakens a bonding strength of an O—H bonding present on a surface of the wafer, thereby urging the precursor gas to be decomposed and promoting the formation of the Si-containing layer containing C and Cl by chemisorptions of precursor gas molecules.

However, the reaction system using such a catalytic gas has a complicated reaction mechanism. In some cases, a salt (ion compound) such as ammonium chloride ($NH_4Cl$), which is a byproduct produced by the catalysis, may become a particle source. Therefore, in order to build a film forming process using a catalytic gas, a larger number of processes may be necessary. In addition, for example, if catalytic gases are used all the processes in forming a film, a large amount of the catalytic gases are used, thereby increasing manufacturing cost.

Therefore, in this embodiment, a catalytic gas is used only in Step 2a subsequently preformed. Here, as a predetermined oxidizing gas, i.e., the $O_3$ gas, and a predetermined catalytic gas, i.e., an amine-based catalytic gas such as the TEA gas, are combined, the oxidizing power of an oxidizing gas can be remarkably increased. Accordingly, for example, when the catalytic gas such as the TEA gas is not used in Step 1a as described above, even if the pyrolysis of the BTCSM gas is insufficient, the SiOC layer with a strong bonding to the base or adjacent molecules, atoms or the like, can be formed by securely performing the modification reaction (oxidation reaction) on the Si-containing layer containing C and Cl.

Also, in the embodiment, for example, as the BTCSM gas is used as the precursor gas containing Si and C bonded to Si, more specifically, the precursor gas containing Si, C and a halogen element and having an Si—C bonding, C can be introduced into the first layer. The first layer containing C is modified in Step 2a subsequently performed, for example, thereby forming an SiOC layer containing C at a high concentration or an SiOC film including the SiOC layers laminated and containing C at a high concentration.

Here, the SiO film obtained using a catalytic gas under low temperature conditions has a wet etching rate (hereinafter, referred to as WER) for hydrogen fluoride having a concentration of 1% (1% HF aqueous solution) of, for example, about 600 Å/min. Even the SiO film obtained using plasma under low temperature conditions has a WER of, for example, about 200 Å/min. Considering that a thermal oxide film obtained by thermally oxidizing a silicon wafer in an oxidation furnace has WER of, for example, about 60 Å/min, the WER of the SiO film formed under low temperature conditions is three or more times higher. The WER of such a high value shows that an etching resistance of the SiO film is lower than, for example, that of the thermal oxide film. In order to improve the etching resistance, it is preferred to form an SiO film containing, for example, C or the like, i.e., an SiOC film.

In such a case, when a film is formed at a relatively high temperature, the SiOC film may be formed, for example, by the following method. That is, in addition to the process of forming an Si-containing layer using HCDS gas or BDEAS gas or the process of forming a silicon oxide layer (SiO layer) by modifying the Si-containing layer with an oxidizing gas, for example, a process of plasma-exciting a hydrocarbon-based gas such as propylene ($C_3H_6$) gas and supplying it to the wafer 200 is further provided. Accordingly, C is introduced into the Si-containing layer or SiO layer to form the SiOC layer and as a result to form the SiOC film.

However, as in the embodiment, when a film is formed at a relatively low temperature, for example, of 200 degrees C. or less, it is difficult to introduce C into a layer and difficult to form an SiOC film. That is, in the formed thin film, a sufficient carbon concentration (C concentration) cannot be obtained, and, for example, the SiO film may be formed containing few or no C in some cases. Accordingly, it may be difficult to sufficiently improve the etching resistance.

Therefore, for example, BTCSM gas, which is an alkylenehalosilane-based precursor gas, is used in this embodiment. Accordingly, in a step of forming a first layer as an initial layer on the wafer 200, C can be introduced into the first layer, and the SiOC layer or SiOC film can be formed to have a sufficient C concentration. In addition, the C concentration in the SiOC layer or SiOC film can be controlled with high precision. Also, in the embodiment, as described above, the SiOC film can be formed while maintaining a predetermined film forming rate without supplying a catalytic gas when a precursor gas is supplied and also without using plasma throughout the whole processes.

(Residual Gas Removal)

After the Si-containing layer containing C and Cl as the first layer is formed on the wafer 200, the valve 243a of the first precursor gas supply pipe 232a is closed to stop the supply of the BTCSM gas. At this time, while the APC valve 244 of the exhaust pipe 231 is in an open state, the interior of the process chamber 201 is vacuum exhausted by the vacuum pump 246 to remove the residual BTCSM gas remaining in the process chamber 201 which does not react or remains after the formation of the Si-containing layer containing C and Cl, from the process chamber 201 (residual gas removal). At this time, the valves 243i to 243k are in an open state, and the supply of the $N_2$ gas (inert gas) into the process chamber 201 is maintained. The $N_2$ gas acts as a purge gas. Thus, the residual BTCSM gas remaining in the process chamber 201 which does not react or remains after the formation of the Si-containing layer containing C and Cl can more effectively be removed from the process chamber 201.

Moreover, in this case, the gas remaining in the process chamber 201 may not completely be removed, and the interior of the process chamber 201 may not completely be purged. When the gas remaining in the process chamber 201 is very small in amount, there is no adverse effect generated in Step 2a performed thereafter. Here, an amount of the $N_2$ gas supplied into the process chamber 201 need not be a large amount, and for example, approximately the same amount of the $N_2$ gas as the volume of the reaction tube 203 (the process chamber 201) may be supplied to perform the purge such that there is no adverse effect generated in Step 2a. As described above, as the interior of the process chamber 201 is not completely purged, the purge time can be reduced, thereby improving the throughput. In addition, the consumption of the $N_2$ gas can also be suppressed to a minimal necessity.

The precursor gas containing Si, C and a halogen element and having an Si—C bonding may include 1,2-bis(trichlorosilyl)ethane [$(SiCl_3)_2C_2H_4$, abbreviation: BTCSE] gas, 1,1,2,2-tetrachloro-1,2-dimethyldisilane [$(CH_3)_2Si_2Cl_4$, abbreviation: TCDMDS] gas, 1,2-dichloro-1,1,2,2-tetramethyldisilane [$(CH_3)_4Si_2Cl_2$, abbreviation: DCTMDS] gas, and the like, in addition to the bis(trichlorosilyl)methane [$(SiCl_3)_2CH_2$, abbreviation: BTCSM] gas. In addition, the inert gas may include a rare gas such as Ar gas, He gas, Ne gas, Xe gas, and the like, in addition to the $N_2$ gas.

Here, the C concentration in the SiOC layer and, moreover, the SiOC film including the SiOC layers laminated can be controlled by selecting the type of precursor gas supplied in the process of supplying the precursor gas. That is, the C concentration in the SiOC layer or the SiOC film can be controlled by selecting and supplying a specific precursor gas as the precursor gas among a plurality of types of precursor gases having different molecular structures in the process of supplying the precursor gas. In order to select and supply the specific precursor gas among the plurality of types of precursor gases, a specific supply line is selected among a plurality of supply lines for respectively supplying the plurality of types of precursor gases having different molecular structures, and thus, the specific precursor gas may be supplied through the specific supply line. As described above, in the example of the film forming sequence according to the embodiment, the BTCSM gas is supplied as the specific precursor gas by selecting the BTCSM gas supply line among the BTCSM gas supply line, the TCDMDS gas supply line and the like.

A difference in arrangement of C between the molecular structures of the respective precursor gases may be a factor which enables the C concentration in the SiOC film to be controlled according to the type of the selected precursor gas.

That is, the BTCSM gas, the BTCSE gas or the like, which is an alkylenehalosilane-based precursor gas having an Si—C—Si bonding or an Si—C—C—Si bonding in one molecule, has a molecular structure in which carbon (C) atom(s) is inserted between silicon (Si) atoms. Accordingly, a state where a large number of Cl is bonded to remaining bonding electrons of Si is maintained. For example, Cl is bonded to three of the four bonding electrons of Si in either the BTCSM gas or the BTCSE gas. In this case, a large number of Cl contained in the molecule may improve reactivity of the BTCSM gas, the BTCSE gas or the like. Accordingly, the BTCSM gas, the BTCSE gas or the like is used, thereby improving a film forming rate of the SiOC film, for example. In addition, as the contained Cl improves the reactivity and the film forming rate of the BTCSM gas, the BTCSE gas or the like, a condition range (process window) usable in the film forming process using the BTCSM gas, the BTCSE gas or the like is also expanded. As above, since film forming conditions for obtaining a desired C concentration, for example, can be selected within the wide process window, as a result, it is easy to increase the C concentration in the SiOC film. Also, the C concentration in the SiOC film may be easily controlled. In addition, although the number of carbons contained in the BTCSM gas is smaller than, for example, that in the TCDMDS gas or the like, this may not work against the improvement in C concentration in the SiOC film. The present inventors have confirmed that the use of the BTCSM gas makes it relatively easy to promote the improvement in C concentration, as compared with the TCDMDS gas.

In addition, TCDMDS gas, DCTMDS gas or the like, which is an alkylhalosilane-based precursor gas having an alkyl group such as a methyl group bonded to Si, has a molecular structure, in which some of chloro groups of a chlorosilane-based precursor gas are substituted by methyl groups. As the number of Cl in the gas molecule is reduced like this, the reaction progresses relatively slowly in the TCDMDS gas, the DCTMDS gas or the like, thereby making it easy to obtain a denser SiOC film. Accordingly, for example, even when the C concentration is appropriately controlled in the SiOC film, it is easy to maintain a high etching resistance. In addition, when the TCDMDS gas is compared with the DCTMDS gas, it has been confirmed that the DCTMDS gas containing a large number of methyl groups, i.e., a large number of C, in the molecule works advantage in the amount of C introduced into the film.

From the foregoing, when the above process is performed, as the BTCSM gas, the BTCSE gas or the like is selected and supplied, for example, it is possible to form an SiOC layer having a higher C concentration. On the other hand, as the TCDMDS gas, the DCTMDS gas or the like is selected and supplied, it is possible to form an SiOC layer having a C concentration appropriately controlled while maintaining an etching resistance. That is, as a specific precursor gas is selected and supplied among a plurality of types of precursor gases, it is possible to control the C concentration in the SiOC layer, i.e., the SiOC film, with high precision.

In addition, a silicon concentration (Si concentration) and an oxygen concentration (0 concentration) may be relatively changed by controlling a C concentration in the SiOC film in the above. That is, the composition of the SiOC film may be changed on the whole, and also, a type of a precursor gas may be selected for the purpose of changing the composition of the SiOC film on the whole.

Also, as a plurality of process recipes (programs with processing procedures or processing conditions written) used in forming a variety of the above-described thin films are prepared in advance for respective types of precursor gases, i.e., for respective different gas systems, it is easy to select a type of precursor gas. An operator only has to appropriately select a suitable process recipe and perform the film forming process according to a desired gas system or film composition.

[Step 2a]
($O_3$ Gas+TEA Gas Supply)

After Step 1a is terminated and the residual gas in the process chamber 201 is removed, the valve 243b of the first oxidizing gas supply pipe 232b is opened to flow the $O_3$ gas into the first oxidizing gas supply pipe 232b. The $O_3$ gas flows in the first oxidizing gas supply pipe 232b, and a flow rate of the $O_3$ gas is controlled by the MFC 241b. The flow-rate-controlled $O_3$ gas is supplied into the buffer chamber 237 through the gas supply holes 250b of the second nozzle 249b. The $O_3$ gas supplied into the buffer chamber 237 is supplied into the process chamber 201 through the gas supply holes 250d, and exhausted through the exhaust pipe 231. In this way, the $O_3$ gas is supplied to the wafer 200 under the non-plasma atmosphere ($O_3$ gas supply). At the same time, the valve 243j is opened to flow the $N_2$ gas as the inert gas into the second inert gas supply pipe 232j. A flow rate of the $N_2$ gas flowing in the second inert gas supply pipe 232j is controlled by the MFC 241j. The flow-rate-controlled $N_2$ gas is supplied into the process chamber 201 together with the $O_3$ gas, and exhausted through the exhaust pipe 231.

Here, the valve 243c of the first catalytic gas supply pipe 232c is opened to flow the TEA gas into the first catalytic gas supply pipe 232c. A flow rate of the TEA gas flowing in the first catalytic gas supply pipe 232c is controlled by the MFC 241c. The flow-rate-controlled TEA gas is supplied into the process chamber 201 through the gas supply holes 250c of the third nozzle 249c, and exhausted through the exhaust pipe 231. In this way, the TEA gas is supplied to the wafer 200 (TEA gas supply). At the same time, the valve 243k is opened to flow the inert gas such as the $N_2$ gas into the third inert gas supply pipe 232k. A flow rate of the $N_2$ gas flowing in the third inert gas supply pipe 232k is controlled by the MFC 241k. The flow-rate-controlled $N_2$ gas is supplied into the process chamber 201 together with the TEA gas, and exhausted through the exhaust pipe 231.

Here, in order to prevent infiltration of the $O_3$ gas and the TEA gas into the first nozzle 249a, the valve 243i is opened to flow the $N_2$ gas into the first inert gas supply pipe 232i. The $N_2$ gas is supplied into the process chamber 201 through the first precursor gas supply pipe 232a, and the first nozzle 249a, and exhausted through the exhaust pipe 231.

In this case, the APC valve 244 is appropriately controlled to set the internal pressure of the process chamber 201 to fall within a range of, for example, 1 to 13300 Pa, specifically, for example, in a range of 20 to 1330 Pa, or more specifically, for example, 1330 Pa. A supply flow rate of the $O_3$ gas controlled by the MFC 241b is set to fall within a range of, for example, 1000 to 10000 sccm. In addition, a supply flow rate of the TEA gas controlled by the MFC 241c is set so that, for example, a ratio of a supply flow rate (sccm) of the $O_3$ gas to a supply flow rate (sccm) of the TEA gas is in a range of 0.01 to 100, more specifically, 0.05 to 10. A supply flow rate of the $N_2$ gas controlled by each of the MFCs 241i to 241k is set to fall within a range of, for example, 100 to 10000 sccm. A time duration of supplying the $O_3$ gas and the TEA gas to the wafer 200, i.e., a gas supply time (irradiation time), is set to fall within a range of, for example, 1 to 100 seconds, or more specifically, for example, in a range of 5 to 30 seconds. A temperature of the heater 207 is set such that a temperature of the wafer 200 falls within the same temperature range as when the BTCSM gas is supplied in Step 1a, i.e., a range of, for example, room temperature or greater and 200 degrees C. or less, specifically, for example, in a range of room temperature or greater and 150 degrees C. or less, or more specifically, for example, in a range of room temperature or greater and 100 degrees C. or less.

The $O_3$ gas supplied in the process chamber 201 is thermally activated, and exhausted through the exhaust pipe 231. At this time, the thermally activated $O_3$ gas is supplied to the wafer 200. That is, the gas flowing in the process chamber 201 is the thermally activated $O_3$ gas, and the BTCSM gas does not flow in the process chamber 201. Therefore, the $O_3$ gas is supplied to the wafer 200 in the activated state without a gas phase reaction and reacts with at least a portion of the first layer (Si-containing layer containing C and Cl) formed on the wafer 200 in Step 1a. Accordingly, the first layer is thermally oxidized under the non-plasma atmosphere to be changed (modified) into the second layer containing Si, O and C, i.e., the SiOC layer.

Here, the TEA gas as the amine-based catalytic gas urges the $O_3$ gas to be decomposed, and improves oxidizing power of the $O_3$ gas to urge the $O_3$ gas to react with the Si-containing layer containing C and Cl. The present inventors found out that the oxidizing power of the $O_3$ gas is improved in excess of a range expected by the general catalysis by combining the $O_3$ gas and the TEA gas. As described above, if the BTCSM gas is insufficiently pyrolyzed because a catalytic gas is not supplied when the BTCSM gas is supplied, even though a catalytic gas is supplied in the subsequent process of supplying the oxidizing gas, it is difficult to obtain sufficient reactivity. However, as a result of the present inventor's assiduous studies, it was found that for example, even though an adsorption layer of the BTCSM gas formed by physisorption due to insufficient pyrolysis, i.e., a physisorption layer of the BTCSM gas, is mainly formed as the Si-containing layer containing C and Cl in Step 1a, the oxidation reaction of the $O_3$ gas with the Si-containing layer containing C and Cl can be allowed to appropriately progress, particularly, by supplying the $O_3$ gas and the TEA gas together. As above, it has been found out that the oxidizing power of the $O_3$ gas can be remarkably increased by action of the TEA gas and the SiOC layer with a strong bonding to the base or adjacent molecules, atoms or the like can be formed by securely performing the modification processing (oxidation processing) even on a physisorption layer of the BTCSM gas.

Here, the C concentration in the SiOC layer and, moreover, the SiOC film can be controlled by adjusting the supply amount of the TEA gas supplied in the process of supplying the $O_3$ gas. That is, if the supply amount of the TEA gas is increased, the action of the TEA gas is increased to urge the $O_3$ gas to be decomposed, and thus, the reaction of the $O_3$ gas with the Si-containing layer containing C and Cl can be promoted. That is, the oxidizing power of the $O_3$ gas is increased, so that the reaction of the $O_3$ gas with the Si-containing layer containing C and Cl progresses. Here, it is likely that not only Si—Cl bonding but also an Si—C bonding contained in the Si-containing layer containing C and Cl may be separated, and C in the SiOC layer is easily desorbed. Therefore, the C concentration in the SiOC layer or the SiOC film can be appropriately reduced. On the contrary, if the supply amount of the TEA gas is decreased, the action of the TEA gas is weakened, and thus, the decomposition of the $O_3$ gas or the promotion of the reaction of the $O_3$ gas with the Si-containing layer containing C and Cl is suppressed. That is, when the oxidizing power of the $O_3$ gas becomes weak, the reaction of the $O_3$ gas with the Si-containing layer containing C and Cl is appropriately suppressed. Accordingly, Si—Cl bonding may be separated and Cl contained in the Si-containing layer containing C and Cl dominantly may be desorbed.

However, it is difficult for an Si—C bonding to be separated and C contained in the Si-containing layer containing C and Cl to be desorbed. Therefore, since C easily remains in the SiOC layer, it is possible to increase the C concentration in the SiOC layer or the SiOC film.

As above, as the supply amount of the TEA gas is controlled, the oxidizing power of the $O_3$ gas can be controlled, and the C concentration in the SiOC layer and, moreover, the SiOC film can also be controlled with high precision. Also, in some cases, the supply amount of the TEA gas may be controlled by adjusting a ratio of a flow rate of the TEA gas to a total flow rate of the $O_3$ gas and the TEA gas. Accordingly, a partial pressure of the TEA gas in the process chamber 201 is also controlled.

That is, the C concentration in the SiOC layer or the SiOC film can be controlled with high precision by adjusting a ratio of a flow rate of the TEA gas to a total flow rate of the $O_3$ gas and the TEA gas supplied in the process of supplying the $O_3$ gas. In other words, using a flow rate $F_O$ of the $O_3$ gas supplied into the process chamber 201 and a flow rate $F_T$ of the TEA gas supplied into the process chamber 201, a flow rate ratio, $T_{RATIO}$, obtained from an equation $F_T/(F_O+F_T)$ is controlled. Accordingly, the oxidizing power of the $O_3$ gas is controlled, and the C concentration in the SiOC layer and, moreover, the SiOC film can be controlled with high precision. The oxidizing power of the $O_3$ gas is increased by increasing the flow rate ratio $T_{RATIO}$, so that the C concentration in the SiOC film can be appropriately reduced. In addition, the oxidizing power of the $O_3$ gas is weakened by reducing the flow rate ratio $T_{RATIO}$, so that the C concentration in the SiOC film can be increased.

Further, as a partial pressure of the TEA gas in the process chamber 201, which is supplied in the process of supplying the $O_3$ gas, is controlled, the oxidizing power of the $O_3$ gas can be controlled, and the C concentration in the SiOC layer and, moreover, the SiOC film can be controlled with high precision. Here, using a flow rate $F_O$ of the $O_3$ gas supplied into the process chamber 201, a flow rate $F_T$ of the TEA gas supplied into the process chamber 201, a flow rate $F_N$ of the rest $N_2$ gas supplied into the process chamber 201, and a total pressure $V_T$ in the process chamber 201, a partial pressure $V_P$ of the TEA gas in the process chamber 201 is obtained from an equation $V_P=[F_T/(F_O+F_T+F_N)] \times V_T$. As described above, here, the rest gas such as the $N_2$ gas needs to be considered. However, a relative change of a partial pressure ratio of the $O_3$ gas and the TEA gas is firm, and it may be that the control of the partial pressure $V_P$ of the TEA gas is the same as the control of the supply amount of the TEA gas or the control of the flow rate ratio $T_{RATIO}$. That is, the oxidizing power of the $O_3$ gas is increased by increasing the partial pressure $V_P$ of the TEA gas, so that the C concentration in the SiOC film can be appropriately reduced. In addition, the oxidizing power of the $O_3$ gas is weakened by reducing the partial pressure $V_P$ of the TEA gas, so that the C concentration in the SiOC film can be increased.

Here, the Si concentration and the O concentration may be relatively changed by controlling the C concentration in the SiOC film. That is, the composition of the SiOC film may be changed on the whole, and also, the supply amount or the partial pressure of the TEA gas or the flow rate ratio $T_{RATIO}$ may be adjusted for the purpose of controlling the composition of the SiOC film on the whole.

At this time, as a plurality of process recipes (programs with processing procedures or processing conditions written), in which the supply amount, a flow rate and the like of the amine-based catalytic gas such as the TEA gas are set as different numerical values, are prepared in advance, it is easy to control the supply amount or the partial pressure of the amine-based catalytic gas or the flow rate ratio with respect to the amine-based catalytic gas. An operator only has to appropriately select a suitable process recipe and perform the film forming process according to a desired film composition or the like.

(Residual Gas Removal)

Thereafter, the valve 243b of the first oxidizing gas supply pipe 232b is closed to stop the supply of the $O_3$. In addition, the valve 243c of the first catalytic gas supply pipe 232c is closed to stop the supply of the TEA gas. At this time, while the APC valve 244 of the exhaust pipe 231 is in an open state, the interior of the process chamber 201 is vacuum exhausted by the vacuum pump 246, and the residual $O_3$ gas or TEA gas remaining in the process chamber 201 which does not react or remains after the reaction or reaction byproducts are removed from the process chamber 201 (residual gas removal). At this time, the valves 243i to 243k are in an open state, and the supply of the $N_2$ gas (inert gas) into the process chamber 201 is maintained. The $N_2$ gas acts as a purge gas, and thus, the residual $O_3$ gas or TEA gas remaining in the process chamber 201 which does not react or remains after the formation of the second layer or reaction byproducts can be more effectively removed from the process chamber 201.

Moreover, in this case, the gas remaining in the process chamber 201 may not completely be removed, and the interior of the process chamber 201 may not completely be purged. When the gas remaining in the process chamber 201 is very small in amount, there is no adverse effect generated in Step 1a performed thereafter. Here, an amount of the $N_2$ gas supplied into the process chamber 201 need not be a large amount, and for example, approximately the same amount of the $N_2$ gas as the volume of the reaction tube 203 (the process chamber 201) may be supplied to perform the purge such that there is no adverse effect generated in Step 1a. As described above, as the interior of the process chamber 201 is not completely purged, the purge time can be reduced, thereby improving the throughput. In addition, the consumption of the $N_2$ gas can also be suppressed to a minimal necessity.

The amine-based catalytic gas may include a variety of the amine-based gases described above as examples, in addition to the TEA gas. The inert gas may include a rare gas such as Ar gas, He gas, Ne gas, Xe gas, and the like, in addition to the $N_2$ gas.

Here, the C concentration in the SiOC layer or the SiOC film can be controlled by selecting the type of the amine-based catalytic gas supplied in the process of supplying the $O_3$ gas. That is, the C concentration in the SiOC layer or the SiOC film can be controlled by selecting and supplying a specific amine-based catalytic gas as the amine-based catalytic gas among a plurality of types of amine-based catalytic gases having different molecular structures in the process of supplying the $O_3$ gas. In order to select and supply the specific amine-based catalytic gas among the plurality of types of amine-based catalytic gases, a specific supply line is selected among a plurality of supply lines for respectively supplying the plurality of types of amine-based catalytic gases having different molecular structures, and thus, the specific amine-based catalytic gas may be supplied through the specific supply line. As described above, in the example of the film forming sequence according to the embodiment, the TEA gas is supplied as the specific amine-based catalytic gas by selecting the TEA gas supply line among the TEA gas supply line, the pyridine gas supply line and the like.

A difference in acid dissociation constant (pKa) between the respective amine-based catalytic gases, for example, may be a factor which enables the C concentration in the SiOC film to be controlled according to the type of the selected precursor gas. The pKa is one of indices of the catalytic strength in each amine-based catalytic gas. Since the respective amine-based catalytic gases have different pKa's, the catalytic strengths of the respective amine-based catalytic gases with respect to the $O_3$ gas may be different from one another. That is, as pKa of each amine-based catalytic gas is high or low, the action of the amine-based catalytic gas becomes strong or weak, so that the action of promoting the decomposition of the $O_3$ gas or the reaction of the $O_3$ gas with the Si-containing layer containing C and Cl becomes strong or weak. Therefore, the C concentration in the SiOC layer or the SiOC film is changed.

In addition, for example, a difference in vapor pressure between the respective amine-based catalytic gases, a difference in vapor pressure between salts produced by the respective amine-based catalytic gases, or the like may be considered as another factor which enables the C concentration in the SiOC film to be controlled by the type of the selected amine-based catalytic gas. If vapor pressures of components related to these catalysis are different, a content ratio of respective components in the gas phase in the reaction system, i.e., for example, easiness of desorption of C from a film, is also changed. As a result, the C concentration in the SiOC layer or the SiOC film is changed.

In addition, an overall balance, i.e., a difference in magnitude relationship or the like, of the factors described above as an example, i.e., pKa of an amine-based catalytic gas, a vapor pressure of an amine-based catalytic gas and a vapor pressure of a produced salt, and the like, may help control the C concentration in the SiOC layer or the SiOC film.

In addition, the Si concentration and the O concentration may be relatively changed by controlling a C concentration in the SiOC film in the above. That is, the composition of the SiOC film may be changed on the whole, and also, a type of an amine-based catalytic gas may be selected for the purpose of changing the composition of the SiOC film on the whole.

Also, as a plurality of process recipes (programs with processing procedures or processing conditions written) used in forming a variety of the above-described thin films are prepared in advance for respective types of amine-based catalytic gases, i.e., for respective different gas systems, it is easy to select a type of amine-based catalytic gas. An operator has only to appropriately select a suitable process recipe and perform the film forming process according to a desired gas system or film composition.

(Performing Predetermined Number of Times)

The above-described Steps 1a and 2a may be set as one cycle and the cycle may be performed one or more times, i.e., a predetermined number of times (n times), thereby forming the SiOC film having a predetermined composition and a predetermined film thickness on the wafer 200. Also, the above-described cycle is preferably performed a plurality number of times. That is, it is possible that a thickness of the SiOC layer formed per cycle is set to be smaller than a desired film thickness, and the above-described cycle is preferably repeated a plurality number of times until the desired film thickness is obtained.

In this case, a ratio of respective element components of the SiOC layer, i.e., a ratio of a Si component, an O component, and a C component, i.e., a Si concentration, an O concentration, and a C concentration, may be finely controlled by controlling the processing conditions such as the internal pressure of the process chamber 201 or the gas supply time in each step, thereby minutely controlling a composition ratio of the SiOC film.

Also, when the cycle is performed a plurality number of times, the phrase "a predetermined gas is supplied to the wafer 200" in each step after at least two cycles means that a predetermined gas is supplied to a layer formed on the wafer 200, i.e., the uppermost surface of the wafer 200, which is a laminated body. The phrase "a predetermined layer is formed on the wafer 200" means that a predetermined layer is formed on a layer formed on the wafer 200, i.e., the uppermost surface of the wafer 200, which is a laminated body. Also, above-described matters are similar in other embodiments described later.

(Purge and Return to Atmospheric Pressure)

When the SiOC film having the predetermined composition and the predetermined film thickness has been formed, the valves 243i to 243k are opened to supply the $N_2$ gas as the inert gas from the inert gas supply pipes 232i to 232k into the process chamber 201, respectively, and exhausted through the exhaust pipe 231. The $N_2$ gas acts as a purge gas and the interior of the process chamber 201 is purged with the inert gas, so that the gas remaining in the process chamber 201 or reaction byproducts are removed from the process chamber 201 (purge). Thereafter, an atmosphere in the process chamber 201 is substituted with the inert gas (inert gas substitution), and the internal pressure of the process chamber 201 returns to normal pressure (return to atmospheric pressure).

(Boat Unload and Wafer Discharge)

Thereafter, the seal cap 219 is lowered by the boat elevator 115 to open the lower end of the manifold 209, and the processed wafer 200 supported by the boat 217 is unloaded to the outside of the reaction tube 203 through the lower end of the manifold 209 (boat unload). Then, the processed wafer 200 is discharged from the boat 217 (wafer discharge).

(3) Effects According to the Embodiment

According to the embodiment, one or more effects are shown as described below.

(a) According to the film forming sequence of the embodiment, in Step 1a, BTCSM gas is supplied to the wafer 200 in a state where a catalytic gas such as the amine-based catalytic gas is stopped from being supplied to the wafer 200. With this configuration, the film forming process can be simplified. In addition, since a salt, which may be produced when the catalytic gas is supplied, is not produced when the BTCSM gas is supplied, it is possible to prevent particles from being generated. Also, the use amount of the catalytic gas can be suppressed, thereby reducing the manufacturing cost.

(b) In addition, according to the film forming sequence of the embodiment, in Step 2a, the $O_3$ gas is supplied to the wafer 200 in a state where the TEA gas is supplied to the wafer 200. With this configuration, the oxidizing power of the $O_3$ gas can be remarkably increased.

The present inventors acquired the knowledge that when a Si-containing layer or the like is modified using an oxidizing gas and a catalytic gas, the oxidizing power of the $O_3$ gas is remarkably increased by combining the $O_3$ gas and the amine-based catalytic gas such as the TEA gas.

Figure 6A:
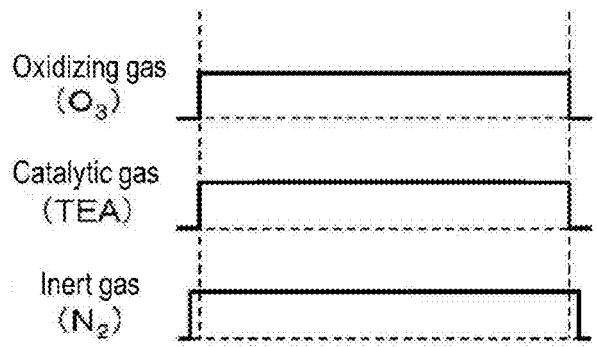
FIG. 6A is a view illustrating gas supply timings in an example of supplying an $O_3$ gas along with a TEA gas.
Figure 6B:
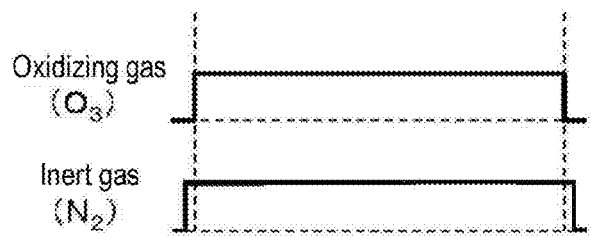
FIG. 6B is a view illustrating gas supply timings in an example of supplying the $O_3$ gas without supplying the TEA gas.
Figure 6C:
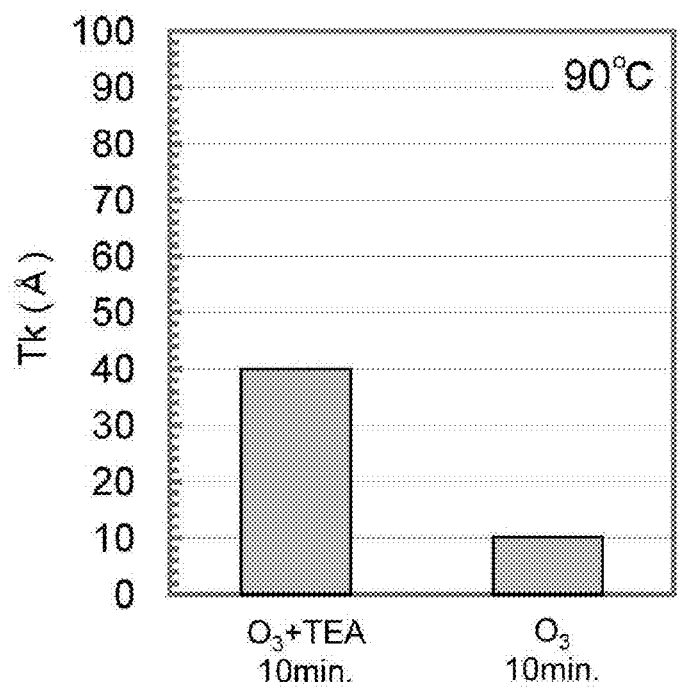
FIG. 6C is a graph illustrating oxidizing power of the $O_3$ gas.

FIG. 6A is a view illustrating gas supply timings in an example of supplying the $O_3$ gas along with the TEA gas, FIG. 6B is a view illustrating gas supply timings in an example of supplying the $O_3$ gas without the TEA gas, and FIG. 6C is a graph illustrating oxidizing power of the $O_3$ gas. The horizontal axis of the graph shown in FIG. 6C represents supply conditions of the respective gases. An example where the $O_3$ gas is supplied while the TEA gas is supplied as shown in FIG. 6A and an example where the $O_3$ gas is supplied while no TEA gas is supplied as shown in FIG. 6B (non-supply of TEA gas) are shown in order from the left side. In addition, the vertical axis of the graph represents a film thickness (Tk) [Å] of an SiO film obtained by supplying the respective gases to an Si film for 10 minutes to modify (oxidize) the Si film. It can be seen from FIG. 6C that when the Si film is modified with the $O_3$ gas, if the Si film is modified while supplying the TEA gas, the SiO film is formed to have a film thickness four times larger as compared with a case where no TEA gas is supplied. That is, as the $O_3$ gas and the TEA gas are together supplied, a film forming rate of the SiO film is increased four times or so. The present inventors have thought that as an amine-based catalytic gas combined with the $O_3$ gas, the TEA gas is most superior, the pyridine gas is next superior, and subsequently, the piperidine gas is also suitable. This is the comparison of the respective gases under predetermined conditions, and is based on the fact that an oxide film such as the SiO film can be formed within an expanded temperature range in the example of using the TEA gas, and the like.

As described above, according to the film forming sequence of the embodiment, the oxidizing power of the $O_3$ gas can be improved in excess of a range expected by the general catalysis by combining the $O_3$ gas and the TEA gas. Thus, even though the catalytic gas is not supplied when the BTCSM gas is supplied in Step 1a, the sufficient reactivity to the Si-containing layer containing C and Cl is obtained. Therefore, while maintaining a sufficient film forming rate, the SiOC layer can be formed by modifying the Si-containing layer containing C and Cl.

(c) Further, according to the film forming sequence of the embodiment, the BTCSM gas is used in Step 1a. As above, the precursor gas containing Si and C bonded to Si can be used, for example, to introduce C into the SiOC layer at a high concentration, and as a result, the SiOC film having a high C concentration can be formed. In addition, the C concentration in the SiOC film can be controlled with high precision. Therefore, the SiOC film having a high etching resistance, for example, can be obtained.

(d) Furthermore, according to the film forming sequence of the embodiment, in the process of supplying the precursor gas of Step 1a, a specific precursor gas is selected and supplied as the precursor gas among a plurality of types of precursor gases having different molecular structures. That is, an alkylenehalosilane-based precursor gas having an Si—C—Si bonding or an Si—C—C—Si bonding (BTCSM gas, BTCSE gas, or the like) in its chemical structural formula (in one molecule) is selected and supplied, or an alkylhalosilane-based precursor gas having an alkyl group bonded to Si (TCDMDS gas, DCTMDS gas, or the like) is selected and supplied. Accordingly, the C concentration in the SiOC layer can be changed according to the selected precursor gas, so that as a result, the C concentration in the SiOC film can be controlled with high precision.

(e) Also, according to the film forming sequence of the embodiment, the supply amount, the partial pressure, or the above-described flow rate ratio $T_{RATIO}$ of the TEA gas supplied in the process of supplying the $O_3$ gas of Step 2a are controlled. With this configuration, the catalytic strength of the TEA gas can be controlled to make the oxidizing power of the $O_3$ gas weak or strong, and as a result, the C concentration in the SiOC layer and, moreover, the SiOC film can be increased or decreased. Therefore, the SiOC film having a high etching resistance, for example, can be obtained.

(f) In addition, according to the film forming sequence of the embodiment, in the process of supplying the $O_3$ gas of Step 2a, a specific amine-based catalytic gas is selected and supplied as the amine-based catalytic gas among a plurality of types of amine-based catalytic gases having different molecular structures. With this configuration, the oxidizing power of the $O_3$ gas can be made weak or strong, and as a result, the C concentration in the SiOC layer and, moreover, the SiOC film can be increased or decreased according to the selected amine-based catalytic gas. Therefore, the SiOC film having a high etching resistance, for example, can be obtained.

(g) The substrate processing apparatus according to the embodiment is configured to include a plurality of precursor gas supply lines and to select and supply a specific precursor gas among a plurality of types of precursor gases having different molecular structures. Also, the substrate processing apparatus according to the embodiment is configured to include a plurality of amine-based catalytic gas supply lines and to select and supply a specific amine-based catalytic gas among a plurality of types of amine-based catalytic gases having different molecular structures. With this configuration, it is easy to select and supply a specific precursor gas or amine-based catalytic gas among a plurality of types of gases according to a desired film composition or the like. Therefore, the SiOC film having a variety of composition ratios and film qualities can be formed with high versatility and high reproducibility in one substrate processing apparatus. In addition, it is possible to secure a degree of freedom of apparatus management when a gas species is added, replaced, or the like.

(h) In addition, the substrate processing apparatus according to the embodiment is provided with a plurality of process recipes for respective types of precursor gases or amine-based catalytic gases, i.e., for respective different gas system. The substrate processing apparatus according to the embodiment is also provided with a plurality of process recipes in which the supply amount, a flow rate and the like of the amine-based catalytic gas are set as different numerical values. That is, a plurality of process recipes is respectively provided for different processing conditions. With this configuration, it is easy to select and supply a specific precursor gas or amine-based catalytic gas among a plurality of types of gases and to control the supply amount or the partial pressure of the amine-based catalytic gas, the flow rate ratio with respect to the amine-based catalytic gas and the like according to a desired film composition or the like. An operator has only to appropriately select a suitable process recipe according to a desired film composition among the plurality of process recipes and perform the film forming process. Therefore, the SiOC film having a variety of composition ratios and film qualities can be formed with high versatility and high reproducibility in one substrate processing apparatus. In addition, since an operator's work load (a load of inputting processing procedures or processing conditions, or the like) can be reduced, it is possible to rapidly initiate the substrate processing while avoiding an operational error.

In the embodiment, when the SiOC film is formed, the processing is performed at a low temperature of 200 degrees C. or less. Even under such low temperature conditions, the use of the amine-based catalytic gas can be suppressed while maintaining a film forming rate. In addition, even under such low temperature conditions, as the precursor gas containing Si and C bonded to Si is used, the C concentration in the SiOC film can be increased or controlled with high precision.

(4) Modifications of Embodiment

Figure 7A:
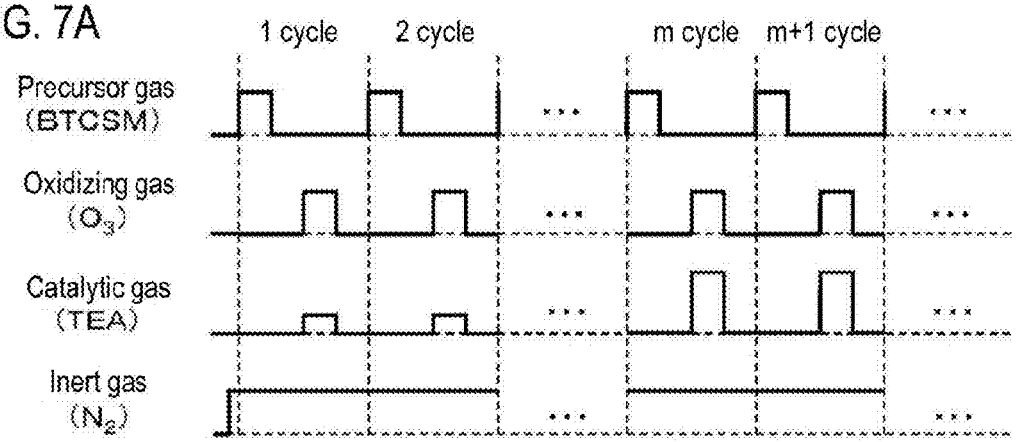
Figure 7B:
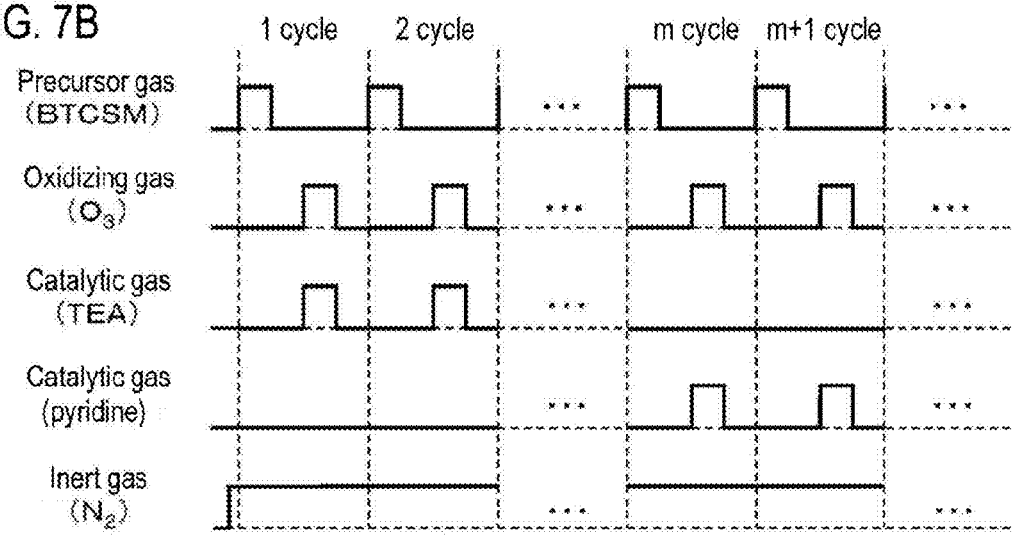
Figure 7C:
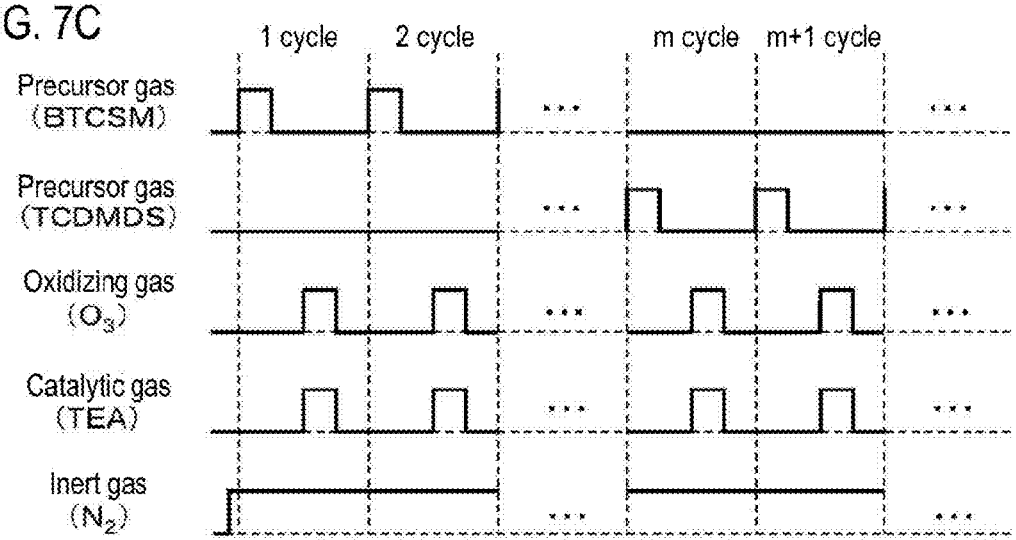
Figure 8A:
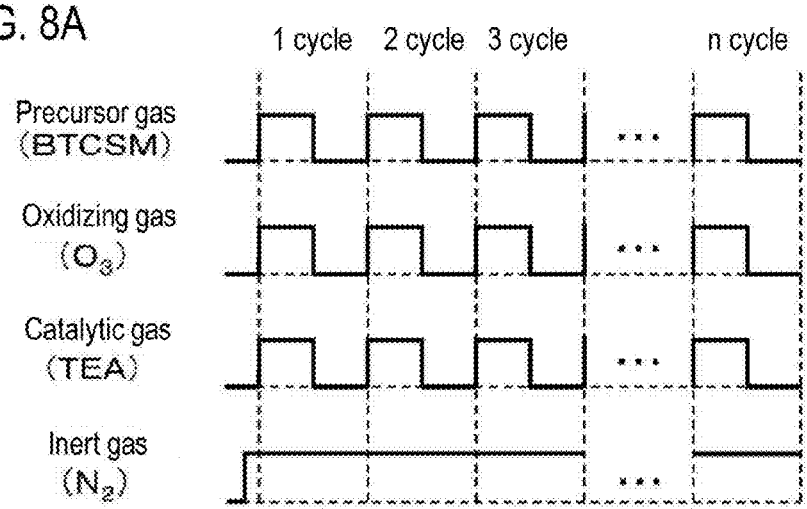
Figure 8B:
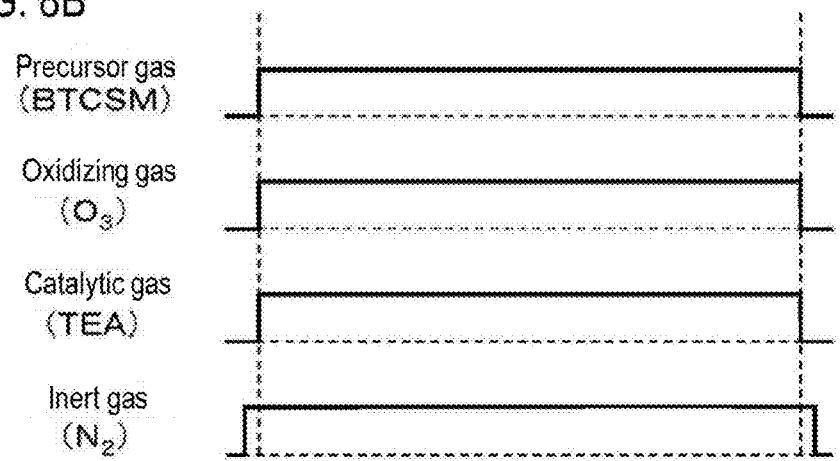

Next, the modifications of the embodiment will be described with reference to FIGS. 7A to 9B. FIGS. 7A to 7C are views illustrating gas supply timings in a film forming sequence according to a modification of the embodiment of the present disclosure. Specifically, FIG. 7A is a view illustrating a first modification, FIG. 7B is a view illustrating a second modification, and FIG. 7C is a view illustrating a third modification. FIGS. 8A and 8B are views illustrating gas supply timings in a film forming sequence according to another modification of the embodiment. Specifically, FIG. 8A is a view illustrating another first modification, and FIG.

Figure 9A:
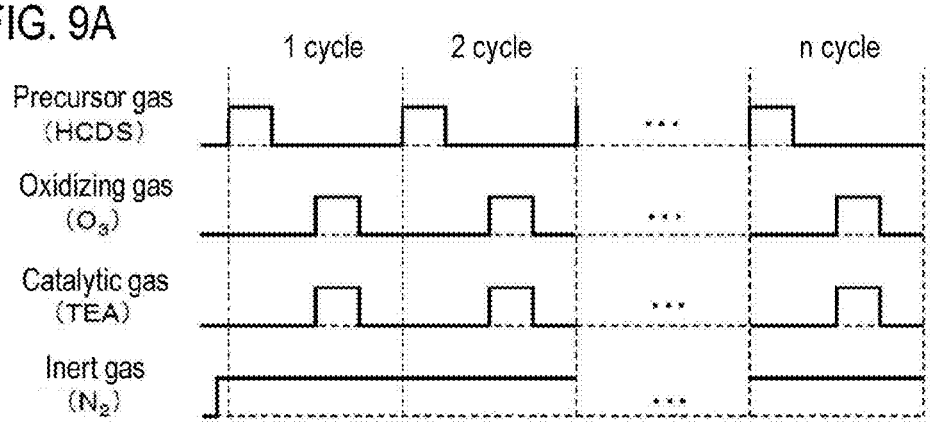
Figure 9B:
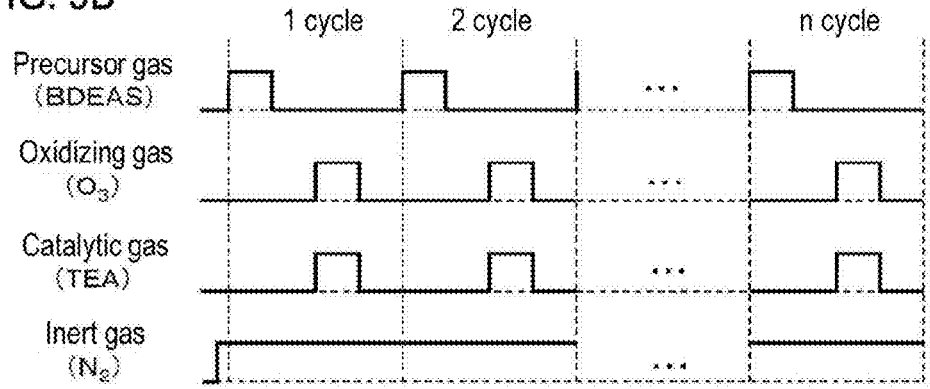

8B is a view illustrating another second modification. FIGS. 9A and 9B are views illustrating gas supply timings in a film forming sequence according to still another modification of the embodiment. Specifically, FIG. 9A is a view illustrating still another first modification, and FIG. 9B is a view illustrating still another second modification.

(Modifications)

In the modifications, examples, in which the supply amount of the gas or gas species is changed while a cycle of Steps 1a and 2a is performed a plurality number of times, will be described.

As shown in FIG. 7A, in a film forming sequence according to the first modification, in the process of forming an SiOC film, the cycle of Steps 1a and 2a is performed a plurality number of times, while the cycle is performed the plurality number of times, the supply amount of the TEA gas supplied in the process of supplying the $O_3$ gas is changed in the m-th cycle, for example.

Accordingly, the C concentration in the SiOC film can be changed in the film thickness direction. In the example of FIG. 7A, the supply amount of the TEA gas is changed from a small flow rate to a large flow rate, and the C concentration at an upper layer (a side away from the wafer 200) of the SiOC film can be reduced further than the C concentration at a lower layer (a side close to the wafer 200). However, on the contrary, the supply amount of the TEA gas may be changed from a large flow rate to a small flow rate. In addition, according to a desired film composition or the like, the change of the supply amount of the TEA gas may be performed only once or may be performed a plurality number of times. Here, the supply amount of the TEA gas may be increased or decreased stepwise from a small flow rate to a large flow rate or from a large flow rate to a small flow rate, or may be changed to fluctuate by any appropriate combination.

In addition, as shown in FIG. 7B, in a film forming sequence according to the second modification, in the process of forming an SiOC film, the cycle of Steps 1a and 2a is performed a plurality number of times, while the cycle is performed the plurality number of times, the type of catalytic gas supplied in the process of supplying the $O_3$ gas is changed, for example, from the TEA gas to the pyridine gas or the like, in the m-th cycle, for example.

Accordingly, the C concentration in the SiOC film can be changed in the film thickness direction. Here, in addition to the example of FIG. 7B, according to a desired film composition or the like, the change of the type of catalytic gas may be performed only once, or may be performed a plurality number of times. In addition, two types or three or more types of catalytic gases may be used. A combination or order of the used catalytic gases is arbitrary.

Further, as shown in FIG. 7C, in a film forming sequence according to the third modification, in the process of forming an SiOC film, the cycle of Steps 1a and 2a is performed a plurality number of times, while the cycle is performed the plurality number of times, the type of precursor gas supplied in the process of supplying the precursor gas is changed, for example, from the BTCSM gas to the TCDMDS gas or the like, in the m-th cycle, for example.

Here, a supply sequence of the TCDMDS gas to the wafer 200 will be described below. Besides, a supply sequence and processing conditions of the BTCSM gas, the O3 gas, the TEA gas or the like are the same as those of the above-described embodiment, and thus, a description thereof will be omitted.

The valve 243e of the second precursor gas supply pipe 232e is opened to flow the TCDMDS gas into the second precursor gas supply pipe 232e. A flow rate of the TCDMDS gas flowing into the second precursor gas supply pipe 232e is controlled by the MFC 241e. The flow-rate-controlled TCDMDS gas is supplied into the process chamber 201 through the gas supply holes 250a of the first nozzle 249a, and exhausted through the exhaust pipe 231. In this way, the TCDMDS gas is supplied to the wafer 200 (TCDMDS gas supply). At the same time, the valve 243i is opened to flow an inert gas such as $N_2$ gas into the first inert gas supply pipe 232i. A flow rate of the $N_2$ gas flowing in the first inert gas supply pipe 232i is controlled by the MFC 241i. The flow-rate-controlled $N_2$ gas is supplied into the process chamber 201 together with the TCDMDS gas, and exhausted through the exhaust pipe 231.

As the TCDMDS gas is supplied as above, for example, an Si-containing layer containing C and Cl having a thickness of less than one atomic layer to several atomic layers, as a first layer, is formed on the wafer 200 (the base film of the surface). The Si-containing layer containing C and Cl may be a Si layer containing C and Cl, an adsorption layer of the TCDMDS gas, or both of these.

Here, the Si layer containing C and Cl is a generic name including a discontinuous layer in addition to a continuous layer formed of Si and containing C and Cl, or a Si thin film containing C and Cl formed by laminating them. Also, a continuous layer formed of Si and containing C and Cl may be referred to as the Si thin film containing C and Cl. In addition, Si constituting the Si layer containing C and Cl includes Si, where its bonding to C or Cl is completely broken, in addition to Si, where its bonding to C or Cl is not completely broken.

Here, the TCDMDS gas adsorption layer of the TCDMDS gas may include an adsorption layer in which gas molecules of the TCDMDS gas are discontinuous, in addition to an adsorption layer in which the gas molecules of the TCDMDS gas are continuous. That is, the adsorption layer of the TCDMDS gas may include an adsorption layer that contains TCDMDS molecules having a thickness of one molecular layer or less. Further, the TCDMDS $[(CH_3)_2Si_2Cl_4]$ molecule constituting the adsorption layer of the TCDMDS gas also includes a molecule in which bonding of Si and C is partially broken, or a molecule in which bonding of Si and Cl is partially broken, in addition to the molecule represented by the chemical structural formula of FIG. 14C.

Here, an adsorption layer of the TCDMDS gas formed by physisorption due to insufficient pyrolysis, i.e., a physisorption layer of the TCDMDS gas, may be mainly formed as the Si-containing layer containing C and Cl.

In addition, processing conditions such as an internal pressure of the process chamber 201, a supply flow rate or supply time of the respective gases such as the precursor gases and the $N_2$ gas, a temperature of the wafer 200 may be set to have the same range as the processing conditions of the above-described embodiment, for example. In addition, when the TCDMDS gas is supplied, the $N_2$ gas is supplied to prevent infiltration of the gas into the nozzles 249b and 249c and the like, which are not used, in the same way as the above-described embodiment.

As in the example of the above-described sequence, the C concentration in the SiOC film is changed in the film thickness direction by changing the type of precursor gas while the cycle of Steps 1a and 2a is performed a plurality number of times. In the example of FIG. 7C, the originally used BTCSM gas is changed to the TCDMDS gas, for example, so that the C concentration at an upper layer (a side away from the wafer 200) of the SiOC film can be reduced further than the C concentration at a lower layer (a side close to the wafer 200). In addition to the example of FIG. 7C, according to a desired film composition or the like, the change of the type of precursor gas may be performed only once, or may be performed a plurality number of times. In addition, two types or three or more types of precursor gases may be used. A combination of the used precursor gases may be arbitrarily selected among precursor gases containing Si and C bonded to Si. The use order of the precursor gases is arbitrary.

Hereinabove, as in the first to third modifications shown in FIG. 7A to 7C, the C concentration or another Si or O concentration in the SiOC film is appropriately controlled in the film thickness direction by changing the C concentration in the SiOC film in the film thickness direction, so that it is easier to obtain the SiOC film having a desired composition. Therefore, it is possible to obtain the SiOC film having an etching resistance, which for example, varies in the film thickness direction.

(Other Modifications)

In the modifications, examples, in which supply timings of the respective gases are different from those of the above-described embodiment, will be described.

As shown in FIG. 8A, in a film forming sequence of the other first modification, in the process of forming an SiOC film, a cycle, in which Steps 1a and 2a are simultaneously performed, i.e., the process of supplying the BTCSM gas and the process of supplying the $O_3$ gas are simultaneously performed, is performed a predetermined number of times (n times), and in these processes, the SiOC film is formed on the wafer 200 by supplying the respective gases in a state where the TEA gas is supplied.

Also, as shown in FIG. 8B, in a film forming sequence of the other second modification, in the process of forming an SiOC film, a cycle, in which Steps 1a and 2a are simultaneously performed, i.e., the process of supplying the BTCSM gas and the process of supplying the $O_3$ gas are simultaneously performed, is performed once, and in these processes, the SiOC film is formed on the wafer 200 by supplying the respective gases while the TEA gas is supplied.

In the film forming sequence shown in FIG. 8A, the film thickness of the SiOC film formed on the wafer 200 can be controlled mainly by controlling the number of cycles performed. Also, in the film forming sequence shown in FIG. 8B, the film thickness of the SiOC film formed on the wafer 200 can be controlled mainly by controlling a time duration of performing the cycle (gas supply time).

Even though the respective gases are simultaneously supplied as in the other first and second modifications, functional effects similar to the above-described embodiment are obtained. In addition, a film forming rate of the SiOC film can be more improved by simultaneously supplying the respective gases. However, the alternate supply of the precursor gas and the $O_3$ gas with the purge of the process chamber 201 interposed therebetween as in the above-described embodiment can appropriately cause reaction of the precursor gas with the $O_3$ gas under a condition in which a surface reaction is dominant, and thus, the film thickness can be easily controlled.

(Still Other Modifications)

In the modifications, examples, in which a silicon oxide film ($SiO_2$ film) (hereinafter, also referred to as SiO film), which is an oxide film of a different type from the SiOC film, is formed using a chlorosilane-based precursor, which is different from the above-described gases, as the precursor gas, will be described.

As shown in FIG. 9A, in a film forming sequence according to the still other first modification, an SiO film as an oxide film is formed on the wafer 200 by performing a cycle a predetermined number of times, the cycle including: a process of supplying HCDS gas as a precursor gas containing silicon (Si) and a halogen element to the wafer 200; and a process of supplying the $O_3$ gas to the wafer 200.

Here, in the process of supplying the HCDS gas, the HCDS gas is supplied to the wafer 200 in a state where a catalytic gas such as the TEA gas is stopped from being supplied to the wafer 200, and in the process of supplying the $O_3$ gas, the $O_3$ gas is supplied to the wafer 200 in a state where the TEA gas is supplied to the wafer 200.

Here, a supply sequence of the HCDS gas to the wafer 200 will be described below. Besides, a supply sequence and processing conditions of the $O_3$ gas, the TEA gas or the like are the same as those of the above-described embodiment, and thus, a description thereof will be omitted.

The valve 243f of the third precursor gas supply pipe 232f is opened to flow the HCDS gas into the third precursor gas supply pipe 232f. A flow rate of the HCDS gas flowing into the third precursor gas supply pipe 232f is controlled by the MFC 241f. The flow-rate-controlled HCDS gas is supplied into the process chamber 201 through the gas supply holes 250a of the first nozzle 249a, and exhausted through the exhaust pipe 231. In this way, the HCDS gas is supplied to the wafer 200 (HCDS gas supply). At the same time, the valve 243i is opened to flow an inert gas such as the $N_2$ gas into the first inert gas supply pipe 232i. A flow rate of the $N_2$ gas flowing in the first inert gas supply pipe 232i is controlled by the MFC 241i. The flow-rate-controlled $N_2$ gas is supplied into the process chamber 201 together with the HCDS gas, and exhausted through the exhaust pipe 231.

As the HCDS gas is supplied as above, for example, an Si-containing layer containing Cl having a thickness of less than one atomic layer to several atomic layers, as a first layer, is formed on the wafer 200 (the base film of the surface). The Si-containing layer containing Cl may be a Si layer containing Cl, an adsorption layer of the HCDS gas, or both of these.

Here, the Si layer containing Cl is a generic name including a discontinuous layer in addition to a continuous layer formed of Si and containing Cl, or a Si thin film containing Cl formed by laminating them. Also, a continuous layer formed of Si and containing Cl may be referred to as the Si thin film containing Cl. In addition, Si constituting the Si layer containing Cl includes Si, where its bonding to Cl is completely broken, in addition to Si, where its bonding to Cl is not completely broken.

Here, the adsorption layer of the HCDS gas may include an adsorption layer in which gas molecules of the HCDS gas are discontinuous, in addition to an adsorption layer in which the gas molecules of the HCDS gas are continuous. That is, the adsorption layer of the HCDS gas may include an adsorption layer that contains HCDS molecules having a thickness of one molecular layer or less. Further, the HCDS ($Si_2Cl_6$) molecule constituting the adsorption layer of the HCDS gas also includes a molecule in which a bonding between Si and Cl is partially broken, in addition to the molecule represented by the chemical structural formula of FIG. 14E.

Here, an adsorption layer of the HCDS gas formed by physisorption due to insufficient pyrolysis, i.e., a physisorption layer of the HCDS gas may be mainly formed as the Si-containing layer containing Cl. Even in such a case, as the $O_3$ gas and the TEA gas are supplied to the wafer 200 in the process of supplying the $O_3$ gas thereafter, the $O_3$ gas thermally activated and having an oxidizing power increased by the TEA gas reacts with at least a portion of the first layer (Si-containing layer containing Cl). Accordingly, the first layer is thermally oxidized under the non-plasma atmosphere and is changed (modified) into the second layer containing Si and O, i.e., the silicon oxide layer (SiO layer).

In addition, processing conditions such as an internal pressure of the process chamber 201, a supply flow rate or supply time of the respective gases such as the precursor gases, the $O_3$ gas, the TEA gas and the $N_2$ gas, a temperature of the wafer 200 may be set to have the same range as the processing conditions of the above-described embodiment, for example. In addition, when the respective gases are supplied, the $N_2$ gas is appropriately supplied to prevent infiltration of the gas into the nozzles 249a, 249b and 249c and the like, which are not used, in the same way as the above-described embodiment.

In addition, as shown in FIG. 9B, in a film forming sequence according to the still other second modification, the SiO film as the oxide film is formed on the wafer 200 by using the BDEAS gas as the precursor gas containing Si, C and N and having an Si—N bonding. A supply sequence of the BDEAS gas to the wafer 200 will be described later.

As described above, on the premise that the oxidation processing in which the $O_3$ gas and the amine-based catalytic gas such as the TEA gas are combined is performed, using the other chlorosilane-based precursor gas such as the HCDS gas or the aminosilane-based precursor gas such as the BDEAS gas, the SiO film or the like, which is an oxide film different from the SiOC film, may be formed.

In addition, the BDEAS gas is a gas, which tends to be originally adsorbed onto the wafer 200 and has a high decomposability or reactivity. Accordingly, the BDEAS gas is used solely without using a catalytic gas even under low temperature conditions, and in the subsequent oxidation processing, an oxidizing gas such as plasma-excited $O_2$ gas may be used in some cases. In the film forming sequence of FIG. 9B, effects similar to a case where the oxidation processing is performed using such plasma are obtained. Hence, as a combination of the $O_3$ gas and the amine-based catalytic gas is used, it is presumed that there is a possibility to increase the oxidizing power of the $O_3$ gas to the extent of a case where plasma is used.

<Second Embodiment>

Next, a second embodiment of the present disclosure will be described.

(1) Process of Forming Multi-Layered Film

Although it has been described as an example in the above-described first embodiment that the cycle including Steps 1a and 2a is performed a predetermined number of times to form any one type of the SiOC film and the SiO film, in this embodiment, a multi-layered film of two or more types of oxide films, such as oxide films having different compositions, or oxide films containing different elements, is formed.

Figure 10:
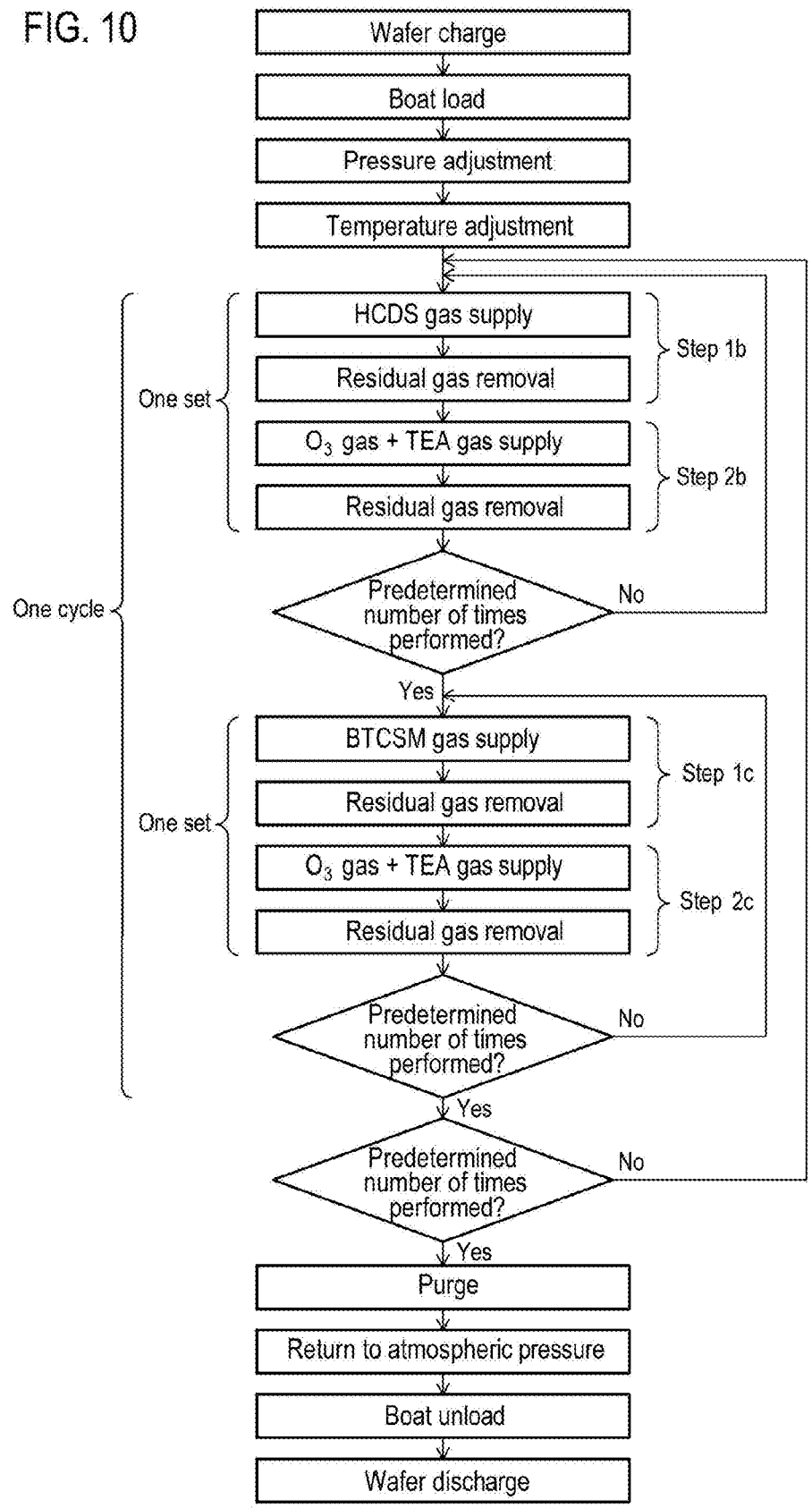
FIG. 10 is a view illustrating a flow of film formation in a film forming sequence according to a second embodiment of the present disclosure.
Figure 11A:
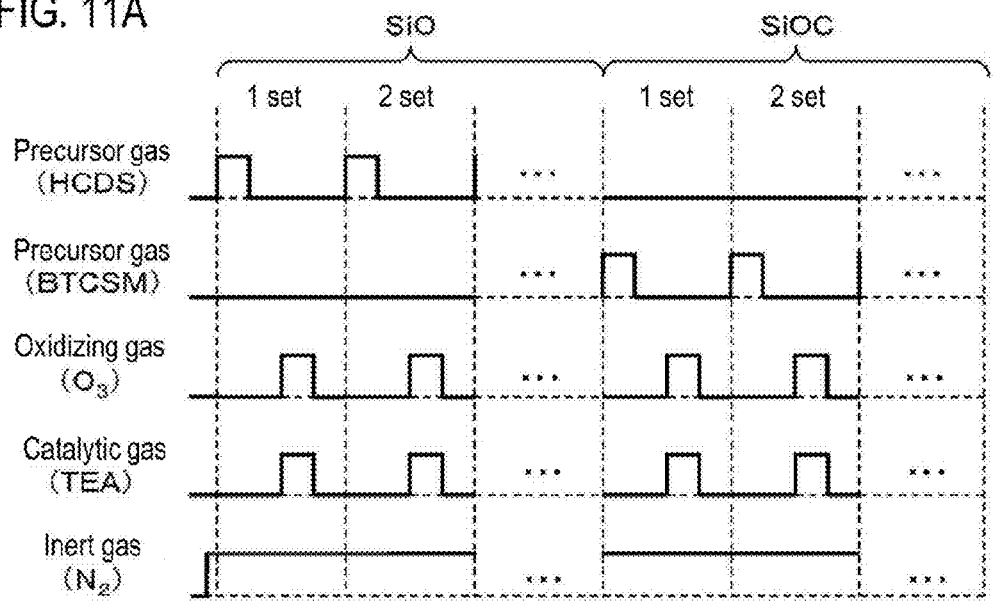
Figure 11B:
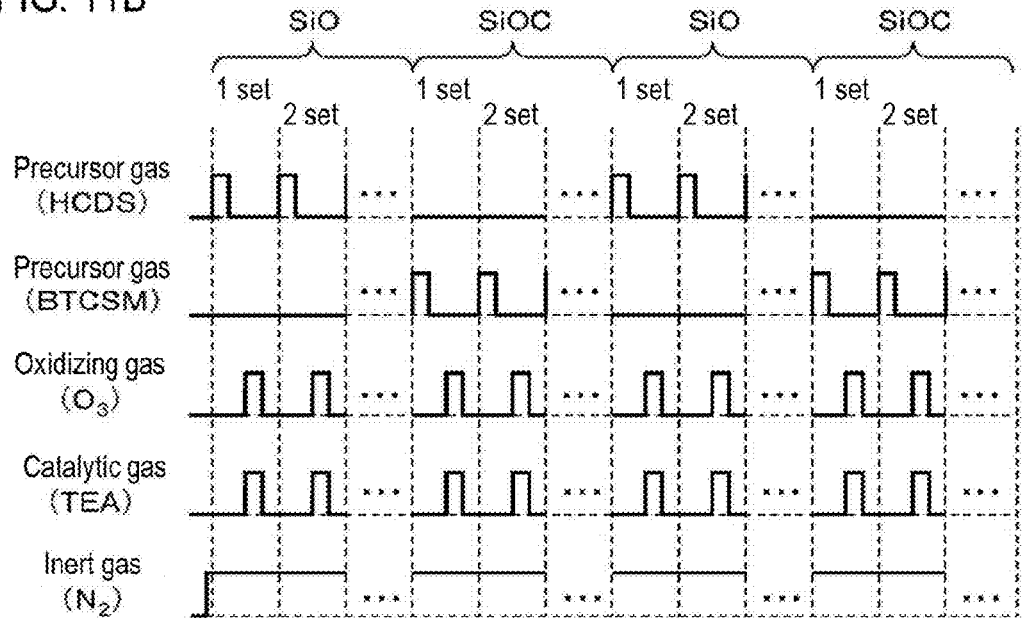

Hereinafter, a film forming sequence of the embodiment will be described with reference to FIGS. 10, 11A and 11B. FIG. 10 is a view illustrating a flow of film formation in a film forming sequence according to the embodiment. FIGS. 11A and 11B are views illustrating gas supply timings in the film forming sequence according to the embodiment. Specifically, FIG. 11A is a view illustrating an example of a sequence of forming a stacked film, and FIG. 11B is a view illustrating an example of a sequence of forming a laminated film. The substrate processing apparatus shown in FIGS. 1 and 2 is also used in the embodiment in the same way as the above-described embodiment. Also, in the following description, the operations of the respective parts constituting the substrate processing apparatus are controlled by the controller 121.

In the film forming sequence of the embodiment, an example will be described in which performed is a process of forming a multi-layered film of an SiO film, which is an oxide film containing Si as a first oxide film, and a SiOC film, which is an oxide film containing Si and C as a second oxide film, on a wafer 200 by performing a cycle a predetermined number of times, the cycle including: a process of forming the SiO film by performing a set a predetermined number of times, the set including a process of supplying HCDS gas, which is a precursor gas containing Si as a predetermined element as a first precursor gas, to the wafer 200 (Step 1b) and a process of supplying $O_3$ gas to the wafer 200 (Step 2b), and a process of forming the SiOC film by performing a set a predetermined number of times, the set including a process of supplying BTCSM gas, which is a precursor gas containing Si as a predetermined element and C bonded to Si as a second precursor gas, to the wafer 200 (Step 1c) and a process of supplying $O_3$ gas to the wafer 200 (Step 2c). In the process of supplying the HCDS gas, the HCDS gas is supplied to the wafer 200 while a catalytic gas such as the TEA gas not supplied to the wafer 200. In the process of supplying the BTCSM gas, the BTCSM gas is supplied to the wafer 200 while a catalytic gas such as the TEA gas is not supplied to the wafer 200. In the process of supplying the $O_3$ gas, the $O_3$ gas is supplied to the wafer 200 while the TEA gas is supplied to the wafer 200.

(Process of Forming SiO Film)

Steps 1b and 2b are successively performed in the same sequence and processing conditions as the above-described modification of FIG. 9A. Such Steps 1b and 2b are set as one set and the set is performed one or more times (a predetermined number of times), whereby the SiO film having a predetermined composition and a predetermined film thickness can be formed on the wafer 200.

(Process of Forming SiOC Film)

Steps 1c and 2c are successively performed in the same sequence and processing conditions as Steps 1a and 2a of the above-described embodiment. Such Steps 1c and 2c are set as one set and the set is performed one or more times (a predetermined number of times), whereby the SiOC film having a predetermined composition and a predetermined film thickness can be formed on the wafer 200.

(Performing Predetermined Number of Times)

The process of forming the SiO film, in which the above-described Steps 1b and 2b are set as one set and the set is performed a predetermined number of times, and the process of forming the SiOC film, in which Steps 1c and 2c are set as one set and the set is performed a predetermined number of times, are set as one cycle, and the cycle is performed one or more times (a predetermined number of times), whereby the multi-layered film of the SiO film and the SiOC film is formed on the wafer 200. Here, any one of the process of forming the SiO film and the process of forming the SiOC film may be first initiated.

As shown in FIG. 11A, the cycle including the process of forming the SiO film and the process of forming the SiOC film is performed once, so that a multi-layered film having the single-layered SiO film and the single-layered SiOC film stacked (a stacked film) may be formed.

Alternatively, as shown in FIG. 11B, the cycle including the process of forming the SiO film and the process of forming the SiOC film is performed a plurality number of times, so that a multi-layered film having a plurality of the SiO films and a plurality of the SiOC films laminated (a laminated film) may be formed.

In any case, according to a desired film thickness ratio of the SiO film and the SiOC film and the like, the set including Steps 1b and 2b and the set including Steps 1c and 2c may be performed the same number of times in one cycle, or a different number of times for each. The respective sets are alternately performed the same number of times, so that the multi-layered film including the SiO film and the SiOC film, each of which has substantially the same film thickness ratio, may be formed. In addition, each set is performed a different number of times for each, so that the multi-layered film including the SiO film and the SiOC film, each of which has a different film thickness ratio, may be formed.

In addition, it has been described as an example that the HCDS gas and the BTCSM gas, which are two types of precursor gases respectively having different components, are used, and the SiO film and the SiOC film, which are two types of oxide films respectively having different components, i.e., two types of oxide films respectively containing different elements from each other, are laminated. However, the first precursor gas and the second precursor gas may be the same gas, and the first oxide film and the second oxide film may be two types of oxide films containing the same element and having different compositions. That is, two types of oxide films having different composition ratios from each other may be formed although the same precursor gas is used in Steps 1b and 1c and the same element is contained. That is, when the SiO film is formed as an example, an oxide film of Si:O=1:1 and an oxide film of Si:O=1:2, for example, may be formed using the HCDS gas in either of Steps 1b and 1c.

Also, it has been described that two types of precursor gases commonly containing Si as a predetermined element are used. However, a predetermined element contained in the first precursor gas may be different from a predetermined element contained in the second precursor gas, and, as a result, the first oxide film and the second oxide film may be two types of oxide films respectively containing different elements. The predetermined element may be a metal element such as titanium (Ti), zirconium (Zr), hafnium (Hf), tantalum (Ta), aluminum (Al), or molybdenum (Mo), in addition to silicon (Si). Here, the precursor gas may include a precursor gas containing a metal element and a halogen element, in addition to the chlorosilane-based precursor gas.

Also, although it has been described as an example that two types of oxide films, i.e., the first oxide film and the second oxide film, are formed, three or more types of oxide films may be formed.

(2) Modifications of the Embodiment

Figure 12:
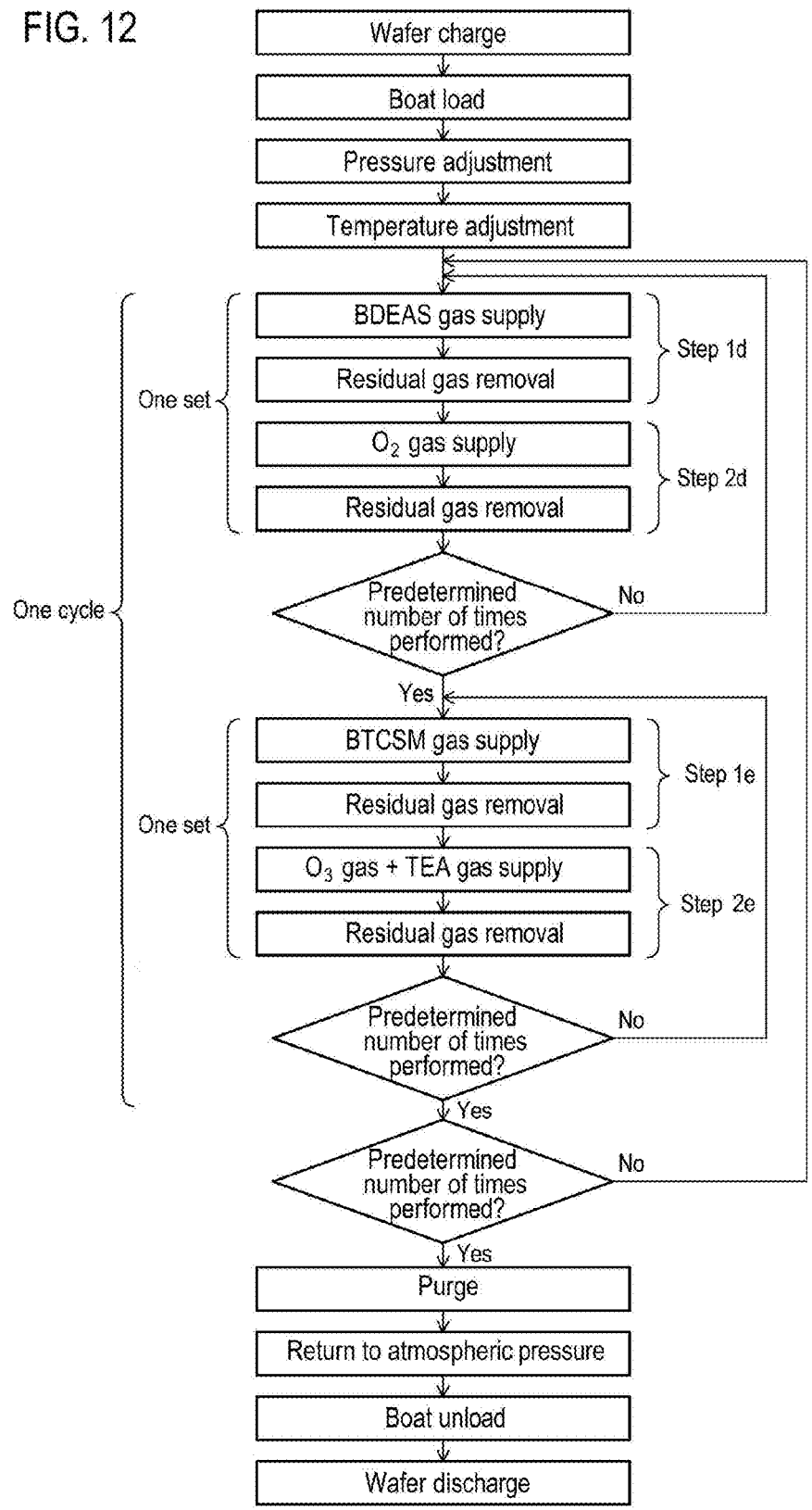
FIG. 12 is a view illustrating a flow of film formation in a film forming sequence according to a modification of the second embodiment of the present disclosure.
Figure 13A:
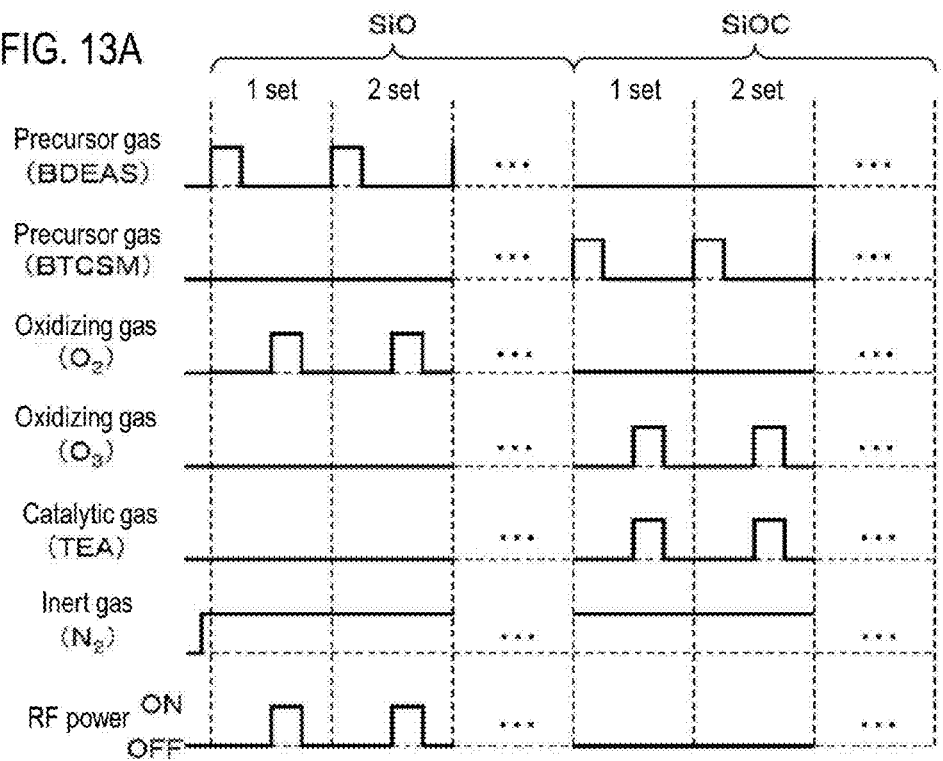
Figure 13B:
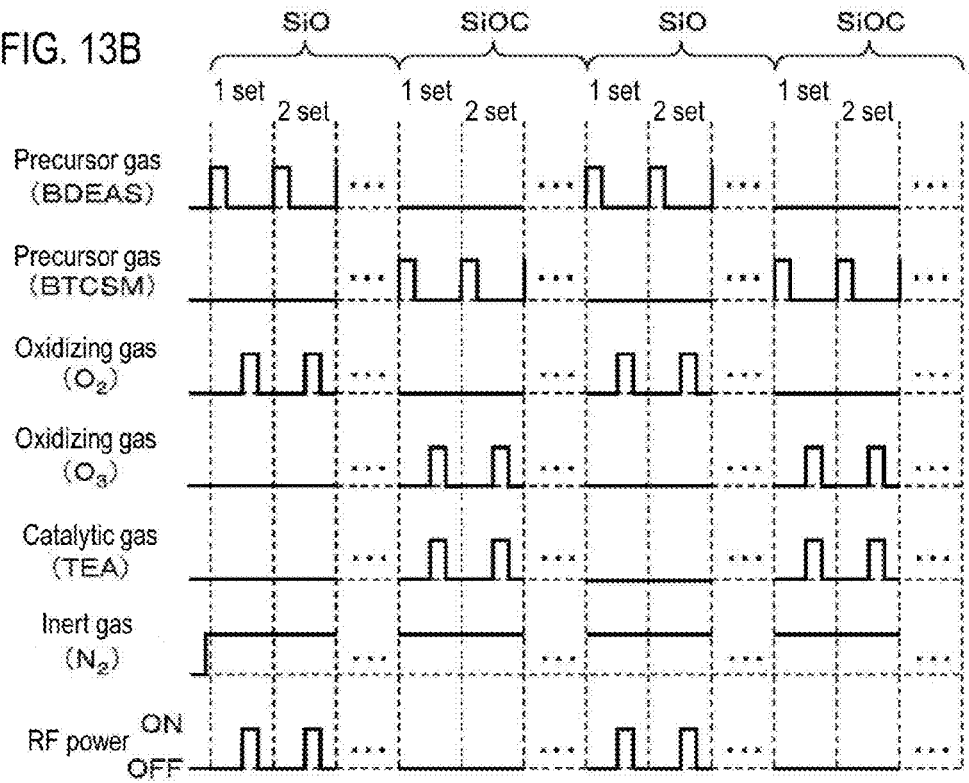

In the embodiment, it has been described as an example that the SiO film is formed using the HCDS gas, the $O_3$ gas and the TEA gas and the multi-layered film of the SiO film and an SiOC film is formed. In a modification of the embodiment, examples, in which an SiO film is formed without using a catalytic gas by using a precursor gas other than the foregoing and plasma-excited oxidizing gas, and a multi-layered film of the SiO film and an SiOC film is formed, will be described with reference to FIGS. 12, 13A and 13B. FIG. 12 is a view illustrating a flow of film formation in a film forming sequence according to the modification of the embodiment. FIGS. 13A and 13B are views illustrating gas supply timings and a RF power supply in a film forming sequence according to the modification of the embodiment. Specifically, FIG. 13A is a view illustrating an example of a sequence of forming a stacked film, and FIG. 13B is a view illustrating an example of a sequence of forming a laminated film.

In the film forming sequence of the modification, an example will be described in which performed is a process of forming a multi-layered film of an SiO film as a first oxide film and an SiOC film as a second oxide film on the wafer 200 by performing a cycle a predetermined number of times, the cycle including: a process of forming the SiO film by performing a set a predetermined number of times, the set including a process of supplying BDEAS gas, which is a precursor gas containing Si, C and N and having an Si—N bonding as a first precursor gas, to the wafer 200 (Step 1 d) and a process of supplying plasma-excited $O_2$ gas as a plasma-excited oxidizing gas to the wafer 200 (Step 2d), and a process of forming the SiOC film by performing a set a predetermined number of times, the set including a process of supplying BTCSM gas, which is a precursor gas containing Si and C bonded to Si as a second precursor gas, to the wafer 200 (Step 1e) and a process of supplying $O_3$ gas to the wafer 200 (Step 2e). In the process of supplying the BDEAS gas, the BDEAS gas is supplied to the wafer 200 while a catalytic gas such as the TEA gas is not supplied to the wafer 200. In the process of supplying the BTCSM gas, the BTCSM gas is supplied to the wafer 200 while a catalytic gas such as the TEA gas is not supplied to the wafer 200. In the process of supplying the $O_3$ gas, the $O_3$ gas is supplied to the wafer 200 while the TEA gas is supplied to the wafer 200.

(Process of Forming SiO Film)

After the wafer charging, the boat loading, the pressure control and the temperature control are performed, the following two steps, i.e., Steps 1d and 2d, are sequentially performed.

[Step 1d]

(BDEAS Gas Supply)

The valve 243g of the fourth precursor gas supply pipe 232g is opened to flow the BDEAS gas into the fourth precursor gas supply pipe 232g. A flow rate of the BDEAS gas flowing into the fourth precursor gas supply pipe 232g is controlled by the MFC 241g. The flow-rate-controlled BDEAS gas is supplied into the process chamber 201 through the gas supply holes 250a of the first nozzle 249a, and exhausted through the exhaust pipe 231. In this way, the BDEAS gas is supplied to the wafer 200 (BDEAS gas supply). At the same time, the valve 243i is opened to flow an inert gas such as $N_2$ gas into the first inert gas supply pipe 232i. A flow rate of the $N_2$ gas flowing in the first inert gas supply pipe 232i is controlled by the MFC 241i. The flow-rate-controlled $N_2$ gas is supplied into the process chamber 201 together with the BDEAS gas, and exhausted through the exhaust pipe 231.

As described above, as the BDEAS gas is supplied to the wafer 200, for example, an Si-containing layer containing N and C having a thickness of less than one atomic layer to several atomic layers, as a first layer, is formed on the wafer 200 (the base film of the surface). The Si-containing layer containing N and C may be a Si layer containing N and C, an adsorption layer of the BDEAS gas, or both of these.

Here, the Si layer containing N and C is a generic name including a discontinuous layer in addition to a continuous layer formed of Si and containing N and C, or a Si thin film containing N and C formed by laminating them. Also, a continuous layer formed of Si and containing N and C may be referred to as the Si thin film containing N and C. In addition, Si constituting the Si layer containing N and C includes Si, where its bonding to N is completely broken, in addition to Si, where its bonding to N is not completely broken.

Here, the adsorption layer of the BDEAS gas may include an adsorption layer in which gas molecules of the BDEAS gas are discontinuous, in addition to an adsorption layer in which the gas molecules of the BDEAS gas are continuous. That is, the adsorption layer of the BDEAS gas may include an adsorption layer that contains BDEAS molecules having a thickness of one molecular layer or less. Further, the BDEAS ($Si[N(C_2H_5)_2]_2H_2$) molecule constituting the adsorption layer of the BDEAS gas also includes a molecule in which s bonding between Si and N, a bonding between Si and H, or a bonding between N and C is partially broken, in addition to the molecule represented by the chemical structural formula of FIG. 14F. That is, the adsorption layer of the BDEAS gas includes a chemisorption layer of BDEAS molecules or a physisorption layer of BDEAS molecules.

The BDEAS gas is a gas, which tends to be adsorbed onto the wafer 200 or the like and has a high decomposability or reactivity. Therefore, even under conditions of a relatively low temperature, for example, of 200 degrees C. or less, the reaction is performed without using a catalytic gas such as the TEA gas, so that the Si-containing layer containing N and C may be formed on the wafer 200.

In addition, processing conditions such as an internal pressure of the process chamber 201, a supply flow rate or supply time of the respective gases such as the precursor gases and the $N_2$ gas, a temperature of the wafer 200 may be set to have the same range as the processing conditions of the above-described embodiment, for example. In addition, when the BDEAS gas is supplied, the $N_2$ gas is supplied to prevent infiltration of the gas into the nozzles 249b and 249c and the like, which are not used, in the same way as the above-described embodiment.

(Residual Gas Removal)

After the Si-containing layer containing N and C as the first layer is formed on the wafer 200, the valve 243g of the fourth precursor gas supply pipe 232g is closed to stop the supply of the BDEAS gas. Here, in the same sequence as the above-described embodiment, residual gas is removed from the inside of the process chamber 201.

[Step 2d]

($O_2$ Gas Supply)

After Step 1d is terminated and the residual gas in the process chamber 201 is removed, the valve 243d of the second oxidizing gas supply pipe 232d is opened to flow the $O_2$ gas into the second oxidizing gas supply pipe 232d. The $O_2$ gas flows in the second oxidizing gas supply pipe 232d and a flow rate of the $O_2$ gas is controlled by the MFC 241d. The flow-rate-controlled $O_2$ gas is supplied into the buffer chamber 237 through the gas supply holes 250b of the second nozzle 249b. At this time, if high-frequency (RF) power is applied between the first rod-shaped electrode 269 and the second rod-shaped electrode 270 from the high-frequency power source 273 through the matching unit 272, the $O_2$ gas supplied into the buffer chamber 237 is plasma-excited, supplied as an active species into the process chamber 201 through the gas supply holes 250d, and exhausted through the exhaust pipe 231. In this way, the plasma-activated (excited) $O_2$ gas is supplied to the wafer 200 ($O_2$ gas supply). At the same time, the valve 243j is opened to flow the $N_2$ gas as the inert gas into the second inert gas supply pipe 232j. A flow rate of the $N_2$ gas flowing in the second inert gas supply pipe 232j is controlled by the MFC 241j. The flow-rate-controlled $N_2$ gas is supplied into the process chamber 201 together with the $O_2$ gas, and exhausted through the exhaust pipe 231.

Also, in order to prevent infiltration of the $O_2$ gas into the first nozzle 249a and the third nozzle 249c, the valves 243i and 243k are opened to flow the $N_2$ gas into the first inert gas supply pipe 232i and the third inert gas supply pipe 232k. The $N_2$ gas is supplied into the process chamber 201 through the first precursor gas supply pipe 232a, the first catalytic gas supply pipe 232c, the first nozzle 249a and the third nozzle 249c, and exhausted through the exhaust pipe 231.

As above, if the plasma is used, even when a temperature in the process chamber 201 is in a relatively low temperature range, for example, of 200 degrees C. or less, it is possible to activate the $O_2$ gas without using a catalytic gas such as the TEA gas.

Here, the gas flowing in the process chamber 201 is the plasma-excited $O_2$ gas and, for example, contains an active species such as an oxygen radical ($O_2^*$). In addition, no BDEAS gas is allowed to flow in the process chamber 201. Therefore, the $O_2$ gas is supplied to the wafer 200 in an activated state without causing a gas phase reaction, and the oxidation processing is performed mainly by this active species on the Si-containing layer containing N and C, which is formed on the wafer 200 in Step 1d. Since this active species has energy higher than the bonding energy of the Si—N bonding and the Si—H bonding contained in the Si-containing layer containing N and C, the Si—N bonding and the Si—H bonding contained in this Si-containing layer is separated by providing the energy of this active species to the Si-containing layer containing N and C. N and H separated from the bonding to Si and C bonded to N are removed from the Si-containing layer containing N and C, and are discharged as $N_2$, $H_2$, $CO_2$ and the like. In addition, bonding electrons of the remaining Si due to the break of the Si—N bonding and the Si—H bonding are connected to O contained in the active species to form Si—O bonding. Therefore, the Si-containing layer containing N and C as the first layer is changed (modified) into a second layer containing Si and O, i.e., an SiO layer.

In addition, processing conditions such as an internal pressure of the process chamber 201, a supply flow rate or supply time of the respective gases such as the oxidizing gas and the $N_2$ gas, a temperature of the wafer 200 may be set to have the same range as the processing conditions of the above-described embodiment, for example. The high-frequency power applied between the first rod-shaped electrode 269 and the second rod-shaped electrode 270 from the high-frequency power source 273 is set to fall within a range of, for example, 50 to 1000 W.

(Residual Gas Removal)

After the SiO layer as the second layer is formed on the wafer 200, the valve 243d of the second oxidizing gas supply pipe 232d is closed to stop the supply of the $O_2$ gas. Here, in the same sequence as the above-described embodiment, residual gas is removed from the inside of the process chamber 201.

(Performing Predetermined Number of Times)

The above-described Steps 1d and 2d may be set as one set and the set may be performed one or more times (a predetermined number of times), thereby forming the SiO film having a predetermined composition and a predetermined film thickness on the wafer 200. Also, the above-described set is preferably performed a plurality number of times. That is, it is possible that a thickness of the SiO layer formed per set is set to be smaller than a desired film thickness, and the above-described set is preferably repeated a plurality number of times until the desired film thickness is obtained.

(Process of Forming SiOC Film and Performing Predetermined Number of Times)

The process of forming the SiOC film and the process performed a predetermined number of times may be performed in the same sequence and processing conditions as the above-described embodiment. That is, the process of forming the SiO film, in which Steps 1d and 2d are set as one set and the set is performed a predetermined number of times, and the process of forming the SiOC film, in which Steps 1e and 2e, which are the same as Steps 1a and 2a of the above-described embodiment, are set as one set and the set is performed a predetermined number of times, are set as one cycle and the cycle is performed one or more times (a predetermined number of times), whereby the multi-layered film of the SiO film and the SiOC film is formed on the wafer 200.

Here, as shown in FIG. 13A, the cycle including the process of forming the SiO film and the process of forming the SiOC film is performed once, so that a multi-layered film having the single-layered SiO film and the single-layered SiOC film stacked (a stacked film) may be formed.

Alternatively, as shown in FIG. 13B, the cycle including the process of forming the SiO film and the process of forming the SiOC film is performed a plurality number of times, so that a multi-layered film having a plurality of the SiO films and a plurality of the SiOC films laminated (a laminated film) may be formed.

Even in the modifications, according to a desired film thickness ratio of the SiO film and the SiOC film or the like, an initiation order of the respective sets including the corresponding Steps 1d, 2d, 1e and 2e, the number of repetition of each set, and the like may be arbitrarily determined.

<Other Embodiments>

Hereinabove, various embodiments of the present disclosure have been specifically described, but the present disclosure is not limited to the above-described embodiments and modifications and may be variously modified without departing from the spirit of the present disclosure.

For example, while it has been described as an example in the above-described embodiments and the like that an SiOC film or an SiO film is formed using $O_3$ gas, the present disclosure is not limited thereto. For example, a silicon-based insulating film such as an SiOCN film or an SiON film may also be formed using a nitriding gas containing nitrogen (N) or the like. The nitriding gas may include, for example, ammonia ($NH_3$) gas, diazen ($N_2H_2$) gas, hydrazine ($N_2H_4$) gas, $N_3H_8$ gas, gases containing these compounds, and the like.

In addition, while it has been described as an example in the above-described embodiments and the like that a chlorosilane-based precursor gas is used as the precursor gas used in forming the SiOC film or the SiO film, a halosilane-based precursor gas, e.g., a fluorosilane-based precursor gas or the like, may also be used in addition to the chlorosilane-based precursor gas. Here, the fluorosilane-based precursor gas is a silane-based precursor gas containing a fluoro group as a halogen group, or a precursor gas at least containing silicon (Si) and fluorine (F). That is, the fluorosilane-based precursor may refer to a type of a halide. The fluorosilane-based precursor gas may include, for example, silicon fluoride gas such as tetrafluorosilane, i.e., silicon tetrafluoride ($SiF_4$) gas, or hexafluoro disilane ($Si_2F_6$) gas. In this case, when an initial layer containing a predetermined element and a halogen element is formed, a fluorosilane-based precursor gas is supplied to the wafer 200. Here, the initial layer becomes a layer containing Si and F, i.e., an Si-containing layer containing F.

As above, the present disclosure can be appropriately applied to a case in which a thin film such as a silicon-based insulating film (SiO film, SiOC film, SiON film, or SiOCN film), is formed, for example, using a precursor gas containing Si as a predetermined element, $O_3$ gas and an amine-based catalytic gas.

As the silicon-based insulating film formed according to the method of the above-described embodiments or modifications may be used as a sidewall spacer, a device forming technique having a small leak current and good machinability can be provided.

In addition, as the silicon-based insulating film formed according to the method of the above-described embodiments or modifications may be used as an etching stopper, a device forming technique having good machinability can be provided.

According to the above-described embodiments and modifications, when a catalytic gas is used, a silicon-based insulating film having an ideal stoichiometric ratio can be formed without using plasma even in a low temperature region. In addition, since the silicon-based insulating film can be formed without using plasma, for example, application to a process having probability of plasma damage, for example, an SADP film of DPT, is also possible.

In addition, in the above-described embodiments and the like, while it has been described as an example that the silicon-based insulating film (SiO film, SiOC film, SiON film, or SiOCN film) containing Si as a predetermined element is ed, the present disclosure may be applied to a case in which a metal-based oxide film containing a metal element such as titanium (Ti), zirconium (Zr) hafnium (Hf), tantalum (Ta), aluminum (Al), molybdenum (Mo), or the like is formed.

That is, the present disclosure may be appropriately applied to a case bar which a metal oxide film, which is an oxide film containing metal, such as a titanium oxide film (TiO film), a zirconium oxide film (ZrO film), a hafnium oxide film (HfO film), a tantalum oxide film (TaO film), an aluminum oxide film (AlO film), or a molybdenum oxide film (MoO film) is formed.

In addition, for example, the present disclosure may be appropriately applied to a case in which a metal oxycarbide film, which is an oxide film containing metal and C, such as a titanium oxycarbide film (TiOC film), a zirconium oxycarbide film (ZrOC film), a hafnium oxycarbide film (HfOC film), a tantalum oxycarbide film (TaOC film), an aluminum oxycarbide film (AlOC film), or a molybdenum oxycarbide film (MoOC film), is formed.

Also, for example, the present disclosure may be appropriately applied to a case in which a metal oxynitride film, which is an oxide film containing metal and N, such as a titanium oxynitride film (TiON film), a zirconium oxynitride film (ZrON film), a hafnium oxynitride film (HfON film), a tantalum oxynitride film (TaON film), an aluminum oxynitride film (AlON film), or a molybdenum oxynitride film (MoON film), is formed.

Further, for example, the present disclosure may be appropriately applied to a case in which a metal oxycarbonitride film, which is an oxide film containing metal, C and N, such as a titanium oxycarbonitride film (TiOCN film), a zirconium oxycarbonitride film (ZrOCN film), a hafnium oxycarbonitride film (HfOCN film), a tantalum oxycarbonitride film (TaOCN film), an aluminum oxycarbonitride film (AlOCN film), or a molybdenum oxycarbonitride film (MoOCN film), is formed.

In such a case, a precursor gas containing a metal element may be used as a precursor gas instead of the precursor gas containing Si of the above-described embodiments, and a film may be formed in the same sequence as the above-described embodiments. That is, an oxide film containing metal may be formed on the wafer 200 by performing a cycle a predetermined number of times (one or more times), the cycle including: a process of supplying a precursor gas containing a metal element to the wafer 200; and a process of supplying $O_3$ gas to the wafer 200.

Here, in the process of supplying the precursor gas, the precursor gas is supplied to the wafer 200 in a state where a catalytic gas is stopped from being supplied to the wafer 200. In the process of supplying the $O_3$ gas, the $O_3$ gas is supplied to the wafer 200 in a state where the amine-based catalytic gas is supplied to the wafer 200.

For example, when a metal-based oxide film containing Ti (TiO film, TiOC film, TiON film, or TiOCN film) is formed, a precursor gas containing Ti and a chloro group such as titanium tetrachloride ($TiCl_4$) or a precursor gas containing Ti and a fluoro group such as titanium tetrafluoride ($TiF_4$) may be used as a precursor gas containing Ti. The same gas as that of the above-described embodiment may be used as an amine-based catalytic gas. In addition, the processing conditions in this case may also be the same, for example, as the processing conditions of the above-described embodiments.

Also, for example, when a metal-based oxide film containing Zr (ZrO film, ZrOC film, ZrON film, or ZrOCN film) is formed, a precursor gas containing Zr and a chloro group such as zirconium tetrachloride ($ZrCl_4$) or a precursor gas containing Zr and a fluoro group such as zirconium tetrafluoride ($ZrF_4$) may be used as a precursor gas containing Zr. The same gas as that of the above-described embodiment may be used as an amine-based catalytic gas. In addition, the processing conditions in this case may also be the same, for example, as the processing conditions of the above-described embodiments.

In addition, for example, when a metal-based oxide film containing Hf (HfO film, HfOC film, HfON film, or HfOCN film) is formed, a precursor gas containing Hf and a chloro group such as hafnium tetrachloride ($HfCl_4$) or a precursor gas containing Hf and a fluoro group such as hafnium tetrafluoride ($HfF_4$) may be used as a precursor gas containing Hf. The same gas as that of the above-described embodiment may be used as an amine-based catalytic gas. In addition, the processing conditions in this case may also be the same, for example, as the processing conditions of the above-described embodiments.

Further, for example, when a metal-based oxide film containing Ta (TaO film, TaOC film, TaON film, or TaOCN film) is formed, a precursor gas containing Ta and a chloro group such as tantalum pentachloride ($TaCl_5$) or a precursor gas containing Ta and a fluoro group such as tantalum pentafluoride ($TaF_5$) may be used as a precursor gas containing Ta. The same gas as that of the above-described embodiment may be used as an amine-based catalytic gas. In addition, the processing conditions in this case may also be the same, for example, as the processing conditions of the above-described embodiments.

Furthermore, for example, when a metal-based oxide film containing Al (AlO film, AlOC film, AlON film, or AlOCN film) is formed, a precursor gas containing Al and a chloro group such as aluminum trichloride ($AlCl_3$) or a precursor gas containing Al and a fluoro group such as aluminum trifluoride ($AlF_3$) may be used as a precursor gas containing Al. The same gas as that of the above-described embodiment may be used as an amine-based catalytic gas. In addition, the processing conditions in this case may also be the same, for example, as the processing conditions of the above-described embodiments.

Moreover, for example, when a metal-based oxide film containing Mo (MoO film, MoOC film, MoON film, or MoOCN film) is formed, a precursor gas containing Mo and a chloro group such as molybdenum pentachloride ($MoCl_5$) or a precursor gas containing Mo and a fluoro group such as molybdenum pentafluoride ($MoF_5$) may be used as a precursor gas containing Mo. The same gas as that of the above-described embodiment may be used as an amine-based catalytic gas. In addition, the processing conditions in this case may also be the same, for example, as the processing conditions of the above-described embodiments.

That is, the present disclosure may be appropriately applied to a case in which an oxide film containing a predetermined element such as a semiconductor element or a metal element is formed.

In addition, it is preferred that a plurality of process recipes (programs with processing procedures or processing conditions written) used in forming a variety of the thin films be individually prepared according to substrate processing types (the type of film to be formed, a composition ratio, a film quality, a film thickness and the like). In addition, when the substrate processing is initiated, it is preferred to appropriately select a suitable process recipe among the plurality of process recipes according to a substrate processing type. Specifically, it is preferred that the plurality of process recipes individually prepared according to substrate processing types be previously stored (installed) in the memory device 121c provided in the substrate processing apparatus through an electrical communication line or a recording medium (e.g., the external memory device 123) in which the process recipes are recorded. In addition, when the substrate processing is initiated, it is preferred that the CPU 121a provided in the substrate processing apparatus appropriately select a suitable process recipe among the plurality of process recipes stored in the memory device 121c according to a substrate processing type. With this configuration, thin films having a variety of film types, composition ratios, film qualities and film thicknesses can be formed with high versatility and high reproducibility in one substrate processing apparatus. In addition, since an operator's work load (a load of inputting processing procedures or processing conditions, or the like) can be reduced, it is possible to rapidly initiate the substrate processing while avoiding an operational error.

Here, the above-described process recipe is not limited to a newly prepared recipe and may be prepared, for example, by modifying an existing process recipe that is already installed in the substrate processing apparatus. When the process recipe is modified, the modified process recipe may be installed to the substrate processing apparatus through an electrical communication line or a recording medium in which the process recipe is recorded. In addition, the process recipe previously installed in the existing substrate processing apparatus may be directly changed by manipulating the input/output device 122 of the substrate processing apparatus.

Also, in the film forming sequence according to the above-described embodiments and the like, an example in which the SiOC film or the like is formed at room temperature has also been described. In this case, the inside of the process chamber 201 need not be heated by the heater 207, so that the substrate processing apparatus may not be provided with the heater. Accordingly, the configuration of the heating system of the substrate processing apparatus can be simplified, so that the substrate processing apparatus may have a more inexpensive and simple configuration.

Moreover, while it has been described as an example in the above-described embodiments and the like that a thin film is formed using a batch type substrate processing apparatus in which a plurality of substrates are processed at a time, the present disclosure is not limited thereto but may be applied to a case in which a thin film is formed using a single-wafer type substrate processing apparatus in which one or several substrates are processed at a time. Although it has been described as an example in the above-described embodiments that the substrate processing apparatus having the hot wall type processing furnace is used to form a thin film, the present disclosure is not limited thereto but may be appropriately applied to a case in which a substrate processing apparatus having a cold wall type processing furnace is used to form a thin film.

Moreover, the above-described embodiments and modifications may be appropriately combined and used.

EXAMPLE

Figure 16A:
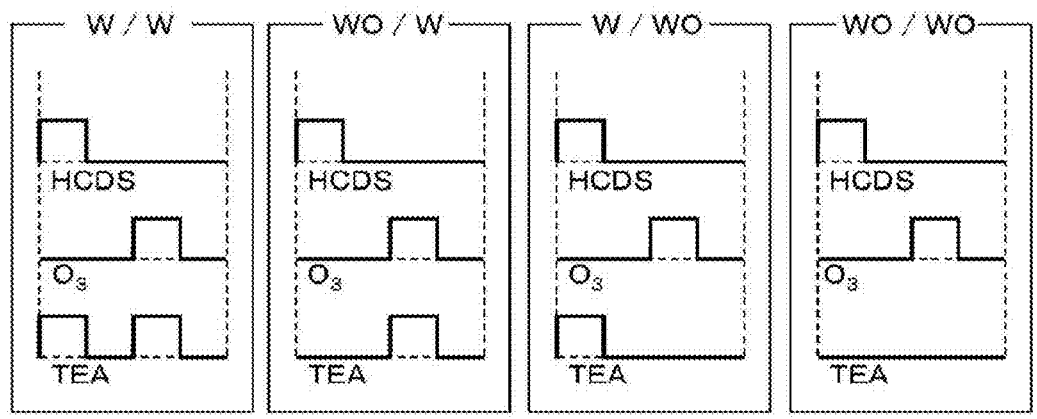
Figure 16B:
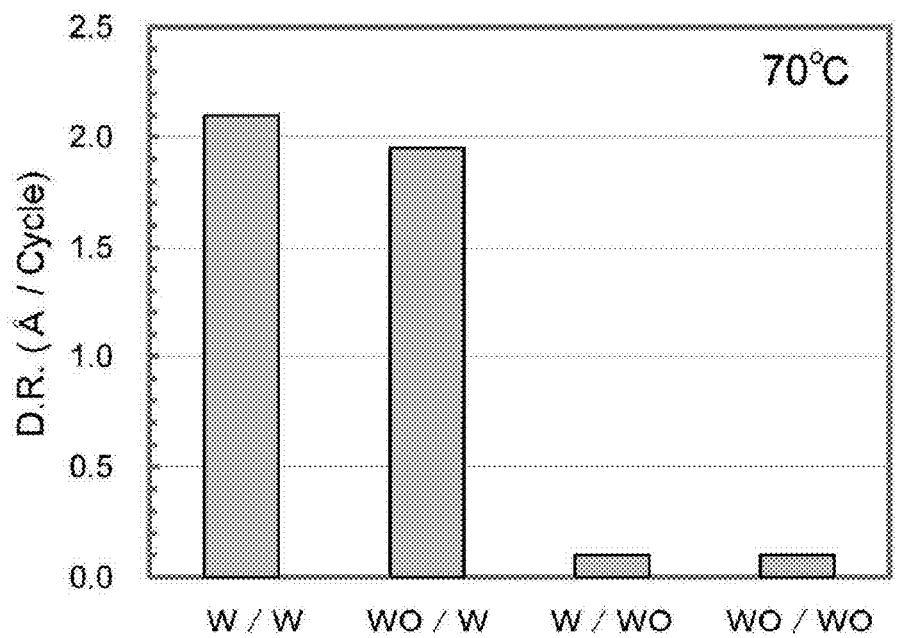

Examples of the present disclosure and comparative examples were evaluated for effects of an amine-based catalytic gas on a precursor gas and $O_3$ gas with different timings for supplying the amine-based catalytic gas. Here, in the same way as the film forming sequence according to the above-described embodiments, the film forming sequence where the precursor gas was supplied in a state where a catalytic gas such as the amine-based catalytic gas was stopped from being supplied, and the $O_3$ gas was supplied in a state where the amine-based catalytic gas was supplied was performed as a reference. In such an evaluation, the substrate processing apparatus according to the above-described embodiment was used. FIGS. 16A and 16B shows graphs illustrating effects of the amine-based catalytic gas in the film forming processes according to the examples of the present disclosure and the comparative examples.

Specifically, FIGS. 16A and 16B are views showing an effect of TEA gas in film forming processes of examples of the present disclosure and comparative examples. Specifically, FIG. 16A is a view showing supply/non-supply of TEA gas when supplying HCDS gas and ozone gas, and FIG. 16B is a graph illustrating an effect of the supply/non-supply of TEA gas when supplying HCDS gas and ozone gas.

The horizontal axis of the graph shown in FIG. 16B represents supply conditions of the respective gases, wherein an example W/W in which the TEA gas is supplied both when the HCDS gas is supplied and when the $O_3$ gas is supplied, an example WO/W in which no TEA gas is supplied when the HCDS gas is supplied and the TEA gas is supplied only when the $O_3$ gas is supplied, an example W/WO in which the TEA gas is supplied only when the HCDS gas is supplied and no TEA gas is supplied when the $O_3$ gas is supplied, and an example WO/WO in which no TEA gas is supplied both when the HCDS gas is supplied and when the $O_3$ gas is supplied, are shown in order from the left side. In addition, the vertical axis of the graph represents a film forming rate (D.R.) (cycle rate) [Å/Cycle] of an SiO film.

It can be seen from FIGS. 16A and 16B that "WO/WO" has the lowest film forming rate and "W/WO" has the next low film forming rate. In the meantime, it can be seen that "WO/W" has a remarkably increased film forming rate, and "W/W" has the highest film forming rate. That is, it can be seen that in the examples W/WO and WO/WO in which no TEA gas is supplied when the $O_3$ gas is supplied, the film forming rate of the SiO film is extremely reduced. On the other hand, it can be seen that in the examples W/W and WO/W in which the TEA gas is supplied when the $O_3$ gas is supplied, the film forming rate of the SiO film is noticeably improved. Even from the points, it can be seen that as the TEA gas is supplied when the $O_3$ gas is supplied, the oxidizing power of the $O_3$ gas is remarkably improved.

Here, there was a slight difference in a film forming rate of the SiO film depending on whether or not the TEA gas is supplied when the HCDS gas is supplied (a difference between W/W and WO/W, a difference between W/WO and WO/WO). In this regard, it can be seen that the film forming rate of the SiO film is largely influenced by whether or not the TEA gas is supplied when the $O_3$ gas is supplied. Also, in a case where the TEA gas is supplied when the $O_3$ gas is supplied, even if no TEA gas is supplied when the HCDS gas is supplied (WO/W), a film forming rate similar to when the TEA gas is supplied in supplying the HCDS gas (W/W) is obtained. In this regard, it can be seen that, if the TEA gas is supplied even when the $O_3$ gas is supplied, the TEA gas need not be supplied when the HCDS gas is supplied and the amount of the TEA gas used can be drastically reduced.

<Aspects of the Present Disclosure>

Hereinafter, the preferred aspects of the present disclosure will be additionally stated.

(Supplementary Note 1)

According to an aspect of the present disclosure, there is provided a method of manufacturing a semiconductor device, including: forming an oxide film on a substrate by performing a cycle a predetermined number of times, the cycle including: supplying a precursor gas to the substrate; and supplying an ozone gas to the substrate, wherein in the act of supplying the precursor gas, the precursor gas is supplied to the substrate in a state where a catalytic gas is not supplied to the substrate, and in the act of supplying the ozone gas, the ozone gas is supplied to the substrate in a state where an amine-based catalytic gas is supplied to the substrate.

(Supplementary Note 2)

In the method of manufacturing a semiconductor device according to Supplementary Note 1, each of the act of supplying the precursor gas and the act of supplying the ozone gas is performed under a non-plasma atmosphere.

(Supplementary Note 3)

In the method of manufacturing a semiconductor device according to Supplementary Note 1 or 2, the precursor gas contains a predetermined element and carbon bonded to the predetermined element, and in the act of forming the oxide film, an oxide film containing the predetermined element and carbon is formed.

(Supplementary Note 4)

In the method of manufacturing a semiconductor device according to Supplementary Note 1 or 2, the precursor gas includes at least one selected from the group consisting of a gas containing silicon and a halogen element, a gas containing silicon, carbon and nitrogen and having an Si—N bonding, and a gas containing silicon, carbon and a halogen element and having an Si—C bonding.

(Supplementary Note 5)

In the method of manufacturing a semiconductor device according to Supplementary Note 4, the gas containing silicon, carbon and the halogen element and having the Si—C bonding includes at least one selected from the group consisting of an alkyl group and an alkylene group.

(Supplementary Note 6)

In the method of manufacturing a semiconductor device according to Supplementary Note 5, the gas containing the alkylene group has at least one selected from the group consisting of an Si—C—Si bonding and an Si—C—C—Si bonding.

(Supplementary Note 7)

In the method of manufacturing a semiconductor device according to Supplementary Note 4, the gas containing silicon, carbon and the halogen element and having the Si—C bonding includes at least one selected from the group consisting of an alkyl group containing carbon constituting the Si—C bonding and an alkylene group containing carbon constituting the Si—C bonding.

(Supplementary Note 8)

In the method of manufacturing a semiconductor device according to Supplementary Note 7, the gas containing the alkylene group includes at least one selected from the group consisting of an Si—C—Si bonding partially including the Si—C bonding and an Si—C—C—Si bonding partially including the Si—C bonding.

(Supplementary Note 9)

In the method of manufacturing a semiconductor device according to any one of Supplementary Notes 4 to 8, the precursor gas includes at least one selected from the group consisting of bis(trichlorosilyl)methane [$(SiCl_3)_2CH_2$] gas, 1,2-bis(trichlorosilyl)ethane [$(SiCl_3)_2C_2H_4$] gas, 1,1,2,2-tetrachloro-1,2-dimethyldisilane [$(CH_3)_2Si_2Cl_4$] gas, 1,2- dichloro-1,1,2,2-tetramethyldisilane [(CH$_3$)$_4$Si$_2$Cl$_2$] gas, hexachlorodisilane (Si$_2$Cl$_6$) gas and bis(diethylamino)silane (Si[N(C$_2$H$_5$)$_2$]$_2$H$_2$) gas.

(Supplementary Note 10)

In the method of manufacturing a semiconductor device according to any one of Supplementary Notes 4 to 9, the precursor gas includes at least one selected from the group consisting of bis(trichlorosilyl)methane [(SiCl$_3$)$_2$CH$_2$], hexachlorodisilane (Si$_2$Cl$_6$) gas and bis(diethylamino)silane (Si[N(C$_2$H$_5$)$_2$]$_2$H$_2$) gas.

(Supplementary Note 11)

In the method of manufacturing a semiconductor device according to any one of Supplementary Notes 1 to 3, the precursor gas includes a gas containing silicon, carbon and a halogen element and having an Si—C bonding.

(Supplementary Note 12)

In the method of manufacturing a semiconductor device according to any one of Supplementary Notes 1 to 11, the amine-based catalytic gas includes at least one selected from the group consisting of triethylamine [(C$_2$H$_5$)$_3$N] gas, diethylamine [(C$_2$H$_5$)$_2$NH] gas, monoethylamine (C$_2$H$_5$NH$_2$) gas, trimethylamine [(CH$_3$)$_3$N] gas, monomethylamine [(CH$_3$)NH$_2$] gas, pyridine (C$_5$H$_5$N) gas and piperidine (C$_5$H$_{11}$N) gas.

(Supplementary Note 13)

In the method of manufacturing a semiconductor device according to any one of Supplementary Notes 1 to 12, the amine-based catalytic gas includes at least one selected from the group consisting of triethylamine [(C$_2$H$_5$)$_3$N] gas, pyridine (C$_5$H$_5$N) gas and piperidine (C$_5$H$_{11}$N) gas.

(Supplementary Note 14)

In the method of manufacturing a semiconductor device according to any one of Supplementary Notes 1 to 13, the amine-based catalytic gas includes triethylamine [(C$_2$H$_5$)$_3$N] gas.

(Supplementary Note 15)

In the method of manufacturing a semiconductor device according to any one of Supplementary Notes 1 to 14, a composition of the oxide film is controlled by adjusting a supply amount of the amine-based catalytic gas supplied in the act of supplying the ozone gas.

(Supplementary Note 16)

In the method of manufacturing a semiconductor device according to any one of Supplementary Notes 1 to 15, a composition of the oxide film is controlled by adjusting a ratio of a flow rate of the amine-based catalytic gas to a total flow rate of the ozone gas and the amine-based catalytic gas supplied in the act of supplying the ozone gas.

(Supplementary Note 17)

In the method of manufacturing a semiconductor device according to any one of Supplementary Notes 1 to 16, the act of forming the oxide film is performed in a state where the substrate is accommodated in a process chamber, and a composition of the oxide film is controlled by adjusting a partial pressure of the amine-based catalytic gas, in the process chamber, supplied in the act of supplying the ozone gas.

(Supplementary Note 18)

In the method of manufacturing a semiconductor device according to any one of Supplementary Notes 1 to 17, in the act of supplying the ozone gas, a composition of the oxide film is controlled by selecting and supplying a specific amine-based catalytic gas as the amine-based catalytic gas among a plurality of types of amine-based catalytic gases having different molecular structures.

(Supplementary Note 19)

In the method of manufacturing a semiconductor device according to any one of Supplementary Notes 1 to 18, in the act of supplying the ozone gas, a composition of the oxide film is controlled by selecting a specific supply line among a plurality of supply lines configured to respectively supply a plurality of types of amine-based catalytic gases having different molecular structures and supplying a specific amine-based catalytic gas through the specific supply line.

(Supplementary Note 20)

In the method of manufacturing a semiconductor device according to any one of Supplementary Notes 1 to 19, in the act of supplying the precursor gas, a composition of the oxide film is controlled by selecting and supplying a specific precursor gas as the precursor gas among a plurality of types of precursor gases having different molecular structures.

(Supplementary Note 21)

In the method of manufacturing a semiconductor device according to any one of Supplementary Notes 1 to 20, in the act of supplying the precursor gas, a composition of the oxide film is controlled by selecting a specific supply line among a plurality of supply lines configured to respectively supply a plurality of types of precursor gases having different molecular structures and supplying a specific precursor gas through the specific supply line.

(Supplementary Note 22)

In the method of manufacturing a semiconductor device according to any one of Supplementary Notes 1 to 21, in the act of forming the oxide film, the cycle is performed a plurality number of times, and a composition in the oxide film is changed in a film thickness direction by changing the supply amount of the amine-based catalytic gas supplied in the act of supplying the ozone gas while the cycle is performed the plurality number of times.

(Supplementary Note 23)

In the method of manufacturing a semiconductor device according to any one of Supplementary Notes 1 to 22, in the act of forming the oxide film, the cycle is performed a plurality number of times, and a composition in the oxide film is changed in a film thickness direction by changing the type of amine-based catalytic gas supplied in the act of supplying the ozone gas while the cycle is performed the plurality number of times.

(Supplementary Note 24)

In the method of manufacturing a semiconductor device according to any one of Supplementary Notes 1 to 23, in the act of forming the oxide film, the cycle is performed a plurality number of times, and a composition in the oxide film is changed in a film thickness direction by changing the type of precursor gas supplied in the act of supplying the precursor gas while the cycle is performed the plurality number of times.

(Supplementary Note 25)

In the method of manufacturing a semiconductor device according to any one of Supplementary Notes 1 to 24, in each of the act of supplying the precursor gas and the act of supplying the ozone gas, a temperature of the substrate is set to fall within a range of room temperature or greater and 200 degrees C. or less.

(Supplementary Note 26)

In the method of manufacturing a semiconductor device according to any one of Supplementary Notes 1 to 25, in each of the act of supplying the precursor gas and the act of supplying the ozone gas, a temperature of the substrate is set to fall within a range of room temperature or greater and 150 degrees C. or less.

(Supplementary Note 27)

In the method of manufacturing a semiconductor device according to any one of Supplementary Notes 1 to 26, in each of the act of supplying the precursor gas and the act of supplying the ozone gas, a temperature of the substrate is set to fall within a range of room temperature or greater and 100 degrees C. or less.

(Supplementary Note 28)

According to another aspect of the present disclosure, there is provided a method of manufacturing a semiconductor device, including: forming a multi-layered film of a first oxide film and a second oxide film on a substrate by performing a cycle a predetermined number of times, the cycle including: forming the first oxide film by performing a set a predetermined number of times, the set including supplying a first precursor gas to the substrate and supplying an ozone gas to the substrate, and forming the second oxide film by performing a set a predetermined number of times, the set including supplying a second precursor gas to the substrate and supplying an ozone gas to the substrate, wherein in the act of supplying the first precursor gas, the first precursor gas is supplied to the substrate in a state where a catalytic gas is not supplied to the substrate, in the act of supplying the second precursor gas, the second precursor gas is supplied to the substrate in a state where a catalytic gas is stopped from being supplied to the substrate, and in the act of supplying the ozone gas, the ozone gas is supplied to the substrate in a state where an amine-based catalytic gas is supplied to the substrate.

(Supplementary Note 29)

In the method of manufacturing a semiconductor device according to Supplementary Note 28, the first precursor gas includes a first predetermined element, the second precursor gas includes a second predetermined element and carbon bonded to the second predetermined element, in the act of forming the first oxide film, an oxide film containing the first predetermined element included in the first precursor gas is formed, and in the act of forming the second oxide film, an oxide film containing the second predetermined element and carbon included in the second precursor gas is formed.

(Supplementary Note 30)

In the method of manufacturing a semiconductor device according to Supplementary Note 28 or 29, in the act of forming the multi-layered film, a multi-layered film having a plurality of the first oxide films and a plurality of the second oxide films laminated is formed by performing the cycle a plurality number of times.

(Supplementary Note 31)

According to still another aspect of the present disclosure, there is provided a method of manufacturing a semiconductor device, including forming an oxide film on a substrate by performing supplying an ozone gas to a substrate a predetermined number of times, wherein in the act of supplying the ozone gas, the ozone gas is supplied to the substrate in a state where an amine-based catalytic gas is supplied to the substrate.

(Supplementary Note 32)

According to still another aspect of the present disclosure, there is provided a method of processing a substrate, including: forming an oxide film on the substrate by performing a cycle a predetermined number of times, the cycle including: supplying a precursor gas to the substrate; and supplying an ozone gas to the substrate, wherein in the act of supplying the precursor gas, the precursor gas is supplied to the substrate in a state where a catalytic gas is not supplied to the substrate, and in the act of supplying the ozone gas, the ozone gas is supplied to the substrate in a state where an amine-based catalytic gas is supplied to the substrate.

(Supplementary Note 33)

According to still another aspect of the present disclosure, there is provided a substrate processing apparatus, including: a process chamber configured to accommodate a substrate therein; a precursor gas supply system configured to supply a precursor gas into the process chamber; an ozone gas supply system configured to supply an ozone gas into the process chamber; a catalytic gas supply system configured to supply a catalytic gas into the process chamber; and a control unit configured to control the precursor gas supply system, the ozone gas supply system and the catalytic gas supply system such that an oxide film is formed on the substrate in the process chamber by performing a cycle a predetermined number of times, the cycle including: supplying the precursor gas to the substrate in the process chamber; and supplying the ozone gas to the substrate in the process chamber, wherein in the act of supplying the precursor gas, the precursor gas is supplied to the substrate in a state where a catalytic gas is not supplied to the substrate, and in the act of supplying the ozone gas, the ozone gas is supplied to the substrate in a state where an amine-based catalytic gas is supplied to the substrate.

(Supplementary Note 34)

According to still another aspect of the present disclosure, there is provided a program that causes a computer to perform a process of forming an oxide film on a substrate in a process chamber of a substrate processing apparatus by performing a cycle a predetermined number of times, the cycle including: supplying a precursor gas to the substrate in the process chamber; and supplying an ozone gas to the substrate in the process chamber, wherein in the act of supplying the precursor gas, the precursor gas is supplied to the substrate in a state where a catalytic gas is not supplied to the substrate, and in the act of supplying the ozone gas, the ozone gas is supplied to the substrate in a state where an amine-based catalytic gas is supplied to the substrate.

(Supplementary Note 35)

According to still another aspect of the present disclosure, there is provided a non-transitory computer-readable recording medium storing a program that causes a computer to perform a process of forming an oxide film on a substrate in a process chamber of a substrate processing apparatus by performing a cycle a predetermined number of times, the cycle including: supplying a precursor gas to the substrate in the process chamber; and supplying an ozone gas to the substrate in the process chamber, wherein in the act of supplying the precursor gas, the precursor gas is supplied to the substrate in a state where a catalytic gas is not supplied to the substrate, and in the act of supplying the ozone gas, the ozone gas is supplied to the substrate in a state where an amine-based catalytic gas is supplied to the substrate.

According to the present disclosure in some embodiments, the use of a catalytic gas can be suppressed while maintaining a film forming rate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:

forming an oxide film on a substrate by performing a cycle a predetermined number of times, the cycle comprising:

supplying a precursor gas to the substrate; and
supplying an ozone gas to the substrate,
wherein in the act of supplying the precursor gas, the precursor gas is supplied to the substrate in a state where a catalytic gas is not supplied to the substrate, and
in the act of supplying the ozone gas, the ozone gas is supplied to the substrate in a state where an amine-based catalytic gas is supplied to the substrate.

2. The method of claim 1, wherein each of the act of supplying the precursor gas and the act of supplying the ozone gas is performed under a non-plasma atmosphere.

3. The method of claim 1, wherein the precursor gas contains a predetermined element and carbon bonded to the predetermined element, and
in the act of forming the oxide film, an oxide film containing the predetermined element and carbon is formed.

4. The method of claim 1, wherein the precursor gas comprises at least one selected from the group consisting of a gas containing silicon and a halogen element, a gas containing silicon, carbon and nitrogen and having an Si—N bonding, and a gas containing silicon, carbon and a halogen element and having an Si—C bonding.

5. The method of claim 4, wherein the gas containing silicon, carbon and the halogen element and having the Si—C bonding comprises at least one selected from the group consisting of an alkyl group and an alkylene group.

6. The method of claim 5, wherein the gas containing the alkylene group has at least one selected from the group consisting of an Si—C—Si bonding and an Si—C—C—Si bonding.

7. The method of claim 1, wherein the precursor gas has at least one selected from the group consisting of an Si—C—Si bonding and an Si—C—C—Si bonding.

8. The method of claim 1, wherein the precursor gas comprises a gas containing silicon, carbon and a halogen element and having an Si—C bonding.

9. The method of claim 1, wherein the amine-based catalytic gas comprises at least one selected from the group consisting of triethylamine gas, diethylamine gas, monoethylamine gas, trimethylamine gas, monomethylamine gas, pyridine gas and piperidine gas.

10. The method of claim 1, wherein the amine-based catalytic gas comprises at least one selected from the group consisting of triethylamine gas, pyridine gas and piperidine gas.

11. The method of claim 1, wherein the amine-based catalytic gas comprises triethylamine gas.

12. The method of claim 1, wherein a composition of the oxide film is controlled by adjusting a supply amount of the amine-based catalytic gas supplied in the act of supplying the ozone gas.

13. The method of claim 1, wherein a composition of the oxide film is controlled by adjusting a ratio of a flow rate of the amine-based catalytic gas to a total flow rate of the ozone gas and the amine-based catalytic gas supplied in the act of supplying the ozone gas.

14. The method of claim 1, wherein the act of forming the oxide film is performed in a state where the substrate is accommodated in a process chamber, and
a composition of the oxide film is controlled by adjusting a partial pressure of the amine-based catalytic gas, in the process chamber, supplied in the act of supplying the ozone gas.

15. The method of claim 1, wherein in the act of supplying the ozone gas, a composition of the oxide film is controlled by selecting and supplying a specific amine-based catalytic gas as the amine-based catalytic gas among a plurality of types of amine-based catalytic gases having different molecular structures.

16. The method of claim 1, wherein in the act of supplying the ozone gas, a composition of the oxide film is controlled by selecting a specific supply line among a plurality of supply lines configured to respectively supply a plurality of types of amine-based catalytic gases having different molecular structures and supplying a specific amine-based catalytic gas through the specific supply line.

17. The method of claim 1, wherein in the act of forming the oxide film, the cycle is performed a plurality number of times, and
a composition in the oxide film is changed in a film thickness direction by changing a supply amount of the amine-based catalytic gas supplied in the act of supplying the ozone gas while the cycle is performed the plurality number of times.

18. The method of claim 1, wherein in each of the act of supplying the precursor gas and the act of supplying the ozone gas, a temperature of the substrate is set to fall within a range of room temperature or greater and 200 degrees C. or less.

19. A non-transitory computer-readable recording medium storing a program that causes a computer to perform a process of forming an oxide film on a substrate in a process chamber by performing a cycle a predetermined number of times, the cycle comprising:
supplying a precursor gas to the substrate in the process chamber; and
supplying an ozone gas to the substrate in the process chamber,
wherein in the act of supplying the precursor gas, the precursor gas is supplied to the substrate in a state where a catalytic gas is not supplied to the substrate, and
in the act of supplying the ozone gas, the ozone gas is supplied to the substrate in a state where an amine-based catalytic gas is supplied to the substrate.

* * * * *